(12) United States Patent
Enda et al.

(10) Patent No.: US 7,956,408 B2
(45) Date of Patent: Jun. 7, 2011

(54) NONVOLATILE SEMICONDUCTOR MEMORY DEVICE

(75) Inventors: Toshiyuki Enda, Zushi (JP); Hirosyoshi Tanimoto, Yokohama (JP); Takashi Izumida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 581 days.

(21) Appl. No.: 12/021,003

(22) Filed: Jan. 28, 2008

(65) Prior Publication Data

US 2008/0179659 A1 Jul. 31, 2008

(30) Foreign Application Priority Data

Jan. 26, 2007 (JP) ................................. 2007-017115

(51) Int. Cl.
*H01L 27/115* (2006.01)
(52) U.S. Cl. .............. 257/326; 257/E29.3; 257/E27.103
(58) Field of Classification Search .................. 257/326, 257/E27.103, 315, 314, 316, 324, E29.3
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 6,727,544 B2 | 4/2004 | Endoh et al. | |
| 6,870,215 B2 | 3/2005 | Endoh et al. | |
| 6,933,556 B2 | 8/2005 | Endoh et al. | |
| 7,061,038 B2 | 6/2006 | Endoh et al. | |
| 7,135,726 B2 | 11/2006 | Endoh et al. | |
| 2002/0154556 A1 | 10/2002 | Endoh et al. | |
| 2007/0034922 A1 | 2/2007 | Bhattacharyya | |
| 2007/0158736 A1* | 7/2007 | Arai et al. ..................... | 257/315 |

(Continued)

FOREIGN PATENT DOCUMENTS

JP 10-32269 2/1998

(Continued)

OTHER PUBLICATIONS

U.S. Appl. No. 11/874,004, filed Oct. 17, 2007, Masaru Kito, et al.

(Continued)

*Primary Examiner* — Thomas L Dickey
*Assistant Examiner* — Fazli Erdem
(74) *Attorney, Agent, or Firm* — Oblon, Spivak, McClelland, Maier & Neustadt, L.L.P.

(57) ABSTRACT

A nonvolatile semiconductor memory device relating to one embodiment of this invention includes a substrate, a plurality of memory strings formed on said substrate, said memory string having a first select gate transistor, a plurality of memory cells and a second select gate transistor, said first select gate transistor having a first pillar semiconductor, a first gate insulation layer formed around said first pillar semiconductor and a first gate electrode being formed around said first gate insulation layer; said memory cell having a second pillar semiconductor, a first insulation layer formed around said second pillar semiconductor, a storage layer formed around said first insulation layer, a second insulation layer formed around said storage layer and first to nth electrodes (n is a natural number 2 or more) being formed around said second insulation layer, said first to nth electrodes being spread in two dimensions respectively, said second select gate transistor having a third pillar semiconductor, a second gate insulation layer formed around said third pillar semiconductor and a second gate electrode being formed around said second gate insulation layer, and a channel region of at least either said first select gate transistor or said second select gate transistor formed by an opposite conductive type semiconductor to a source region and a drain region.

20 Claims, 49 Drawing Sheets

U.S. PATENT DOCUMENTS

| | | |
|---|---|---|
| 2007/0252201 A1 | 11/2007 | Kito et al. |
| 2008/0031043 A1 | 2/2008 | Aochi et al. |
| 2008/0048245 A1 | 2/2008 | Kito et al. |

FOREIGN PATENT DOCUMENTS

| | | |
|---|---|---|
| JP | 2003-007868 | 1/2003 |
| JP | 2003-78044 | 3/2003 |
| JP | 2005-032962 | 2/2005 |

OTHER PUBLICATIONS

U.S. Appl. No. 11/955,900, filed Dec. 13, 2007, Ryota Katsumata, et al.

U.S. Appl. No. 11/896,261, filed Aug. 30, 2007, Katsumata.

U.S. Appl. No. 11/905,050, filed Sep. 27, 2007, Aochi.

U.S. Appl. No. 11/898,746, filed Sep. 14, 2007, Kidoh.

U.S. Appl. No. 11/688,499, filed Mar. 20, 2007, Kito.

H. Tanaka, et al., "Bit Cost Scalable Technology With Punch and Plug Process for Ultra High Density Flash Memory", 2007 Symposium on VLSI Technology Digest of Technical Papers, 2007, pp. 14-15.

Tetsuo Endoh, et al., "Novel Ultrahigh-Density Flash Memory With a Stacked-Surrounding Gate Transistor (S-SGT) Structured Cell", IEEE Transactions on Electron Devices, vol. 50, No. 4, Apr. 2003, pp. 945-951.

* cited by examiner

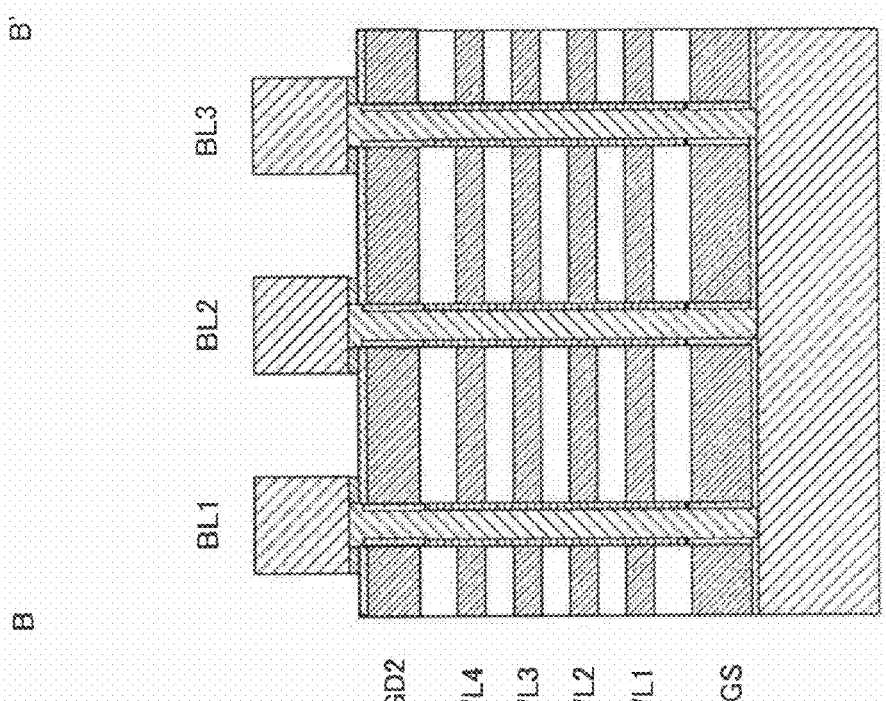
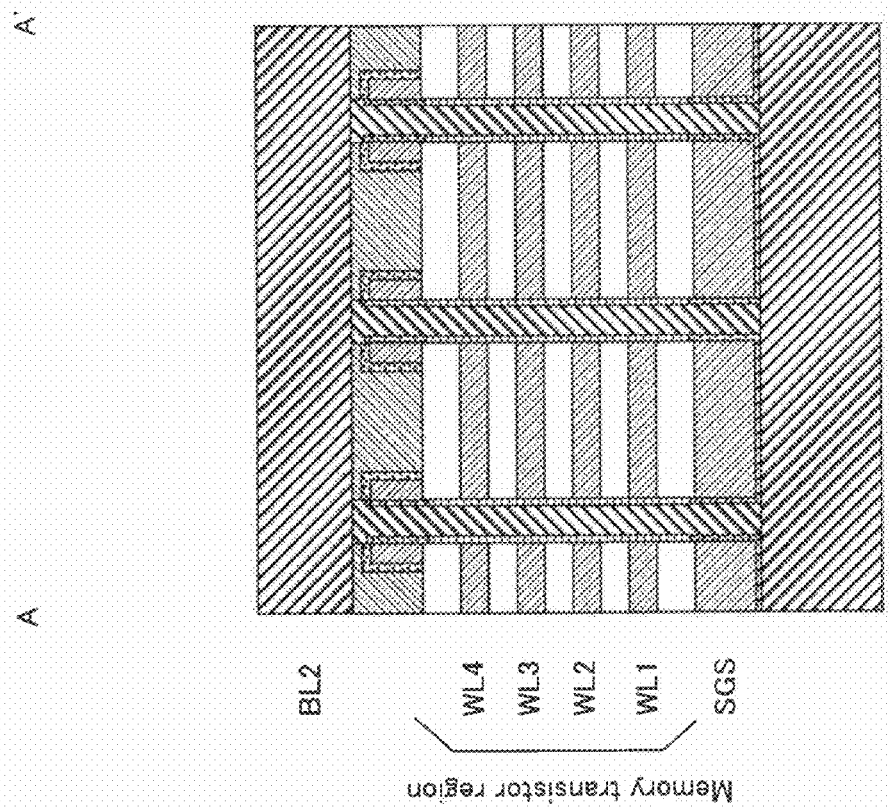

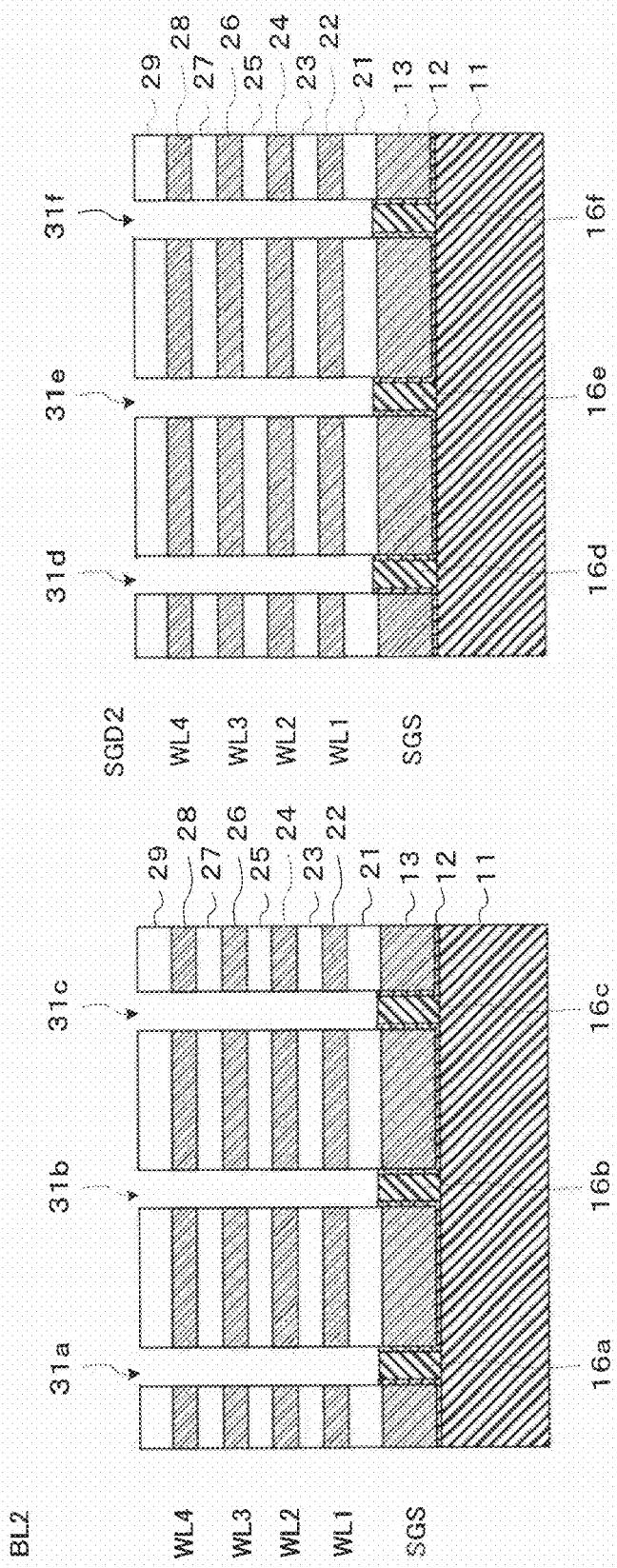

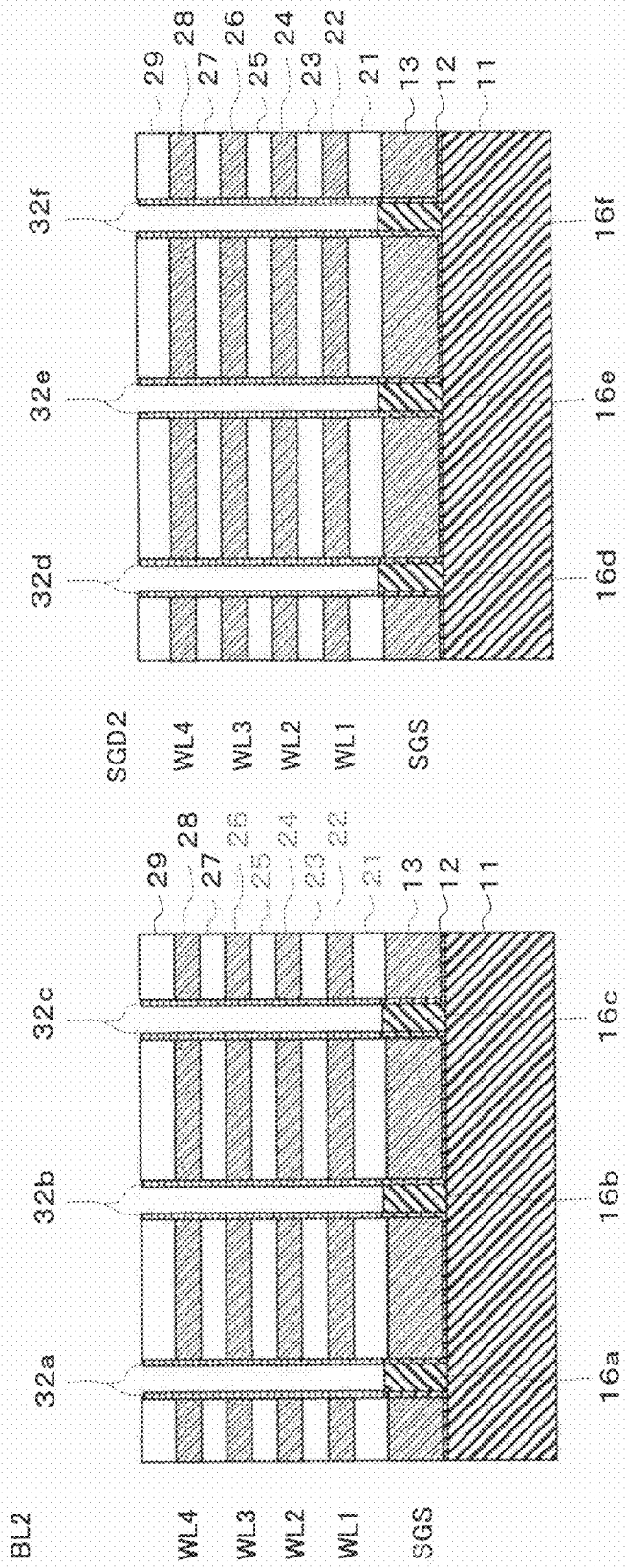

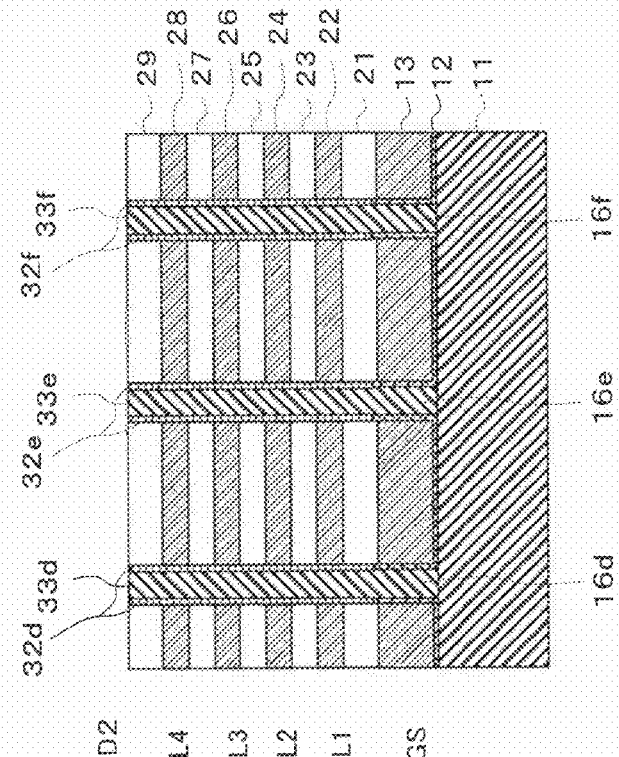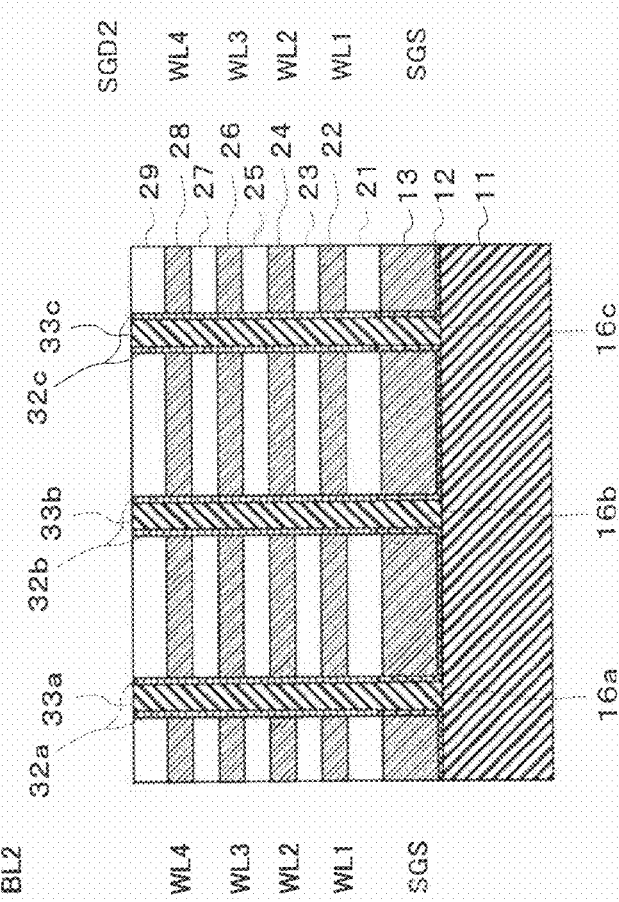

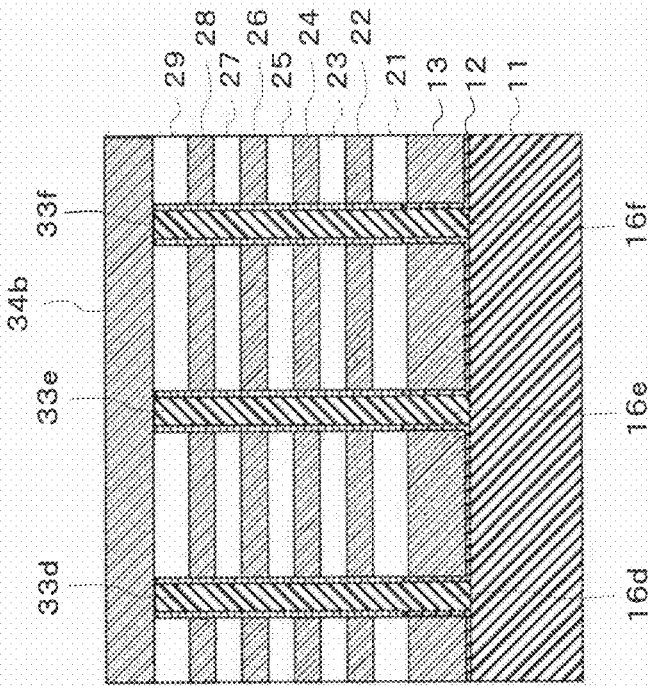
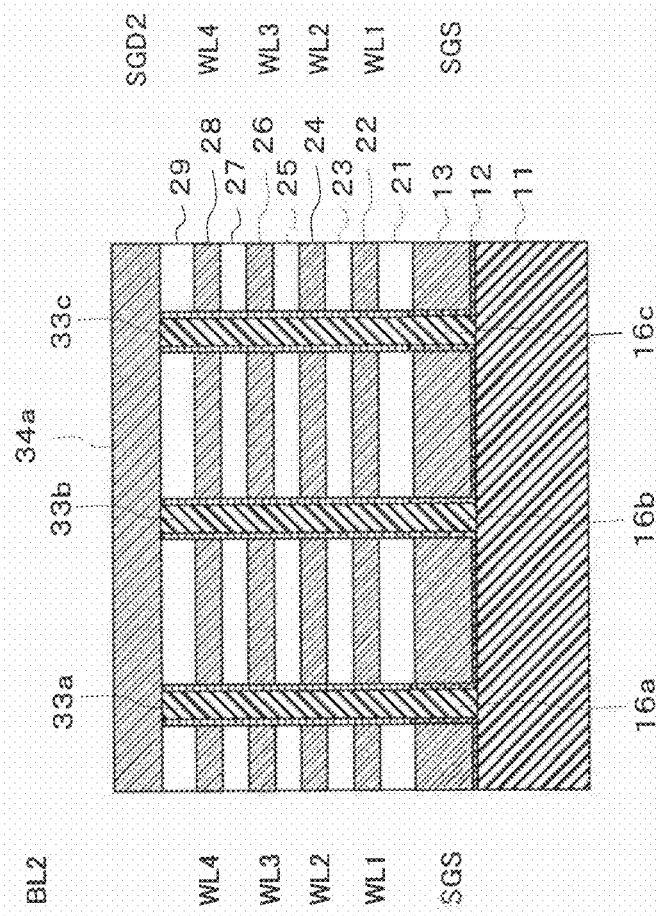

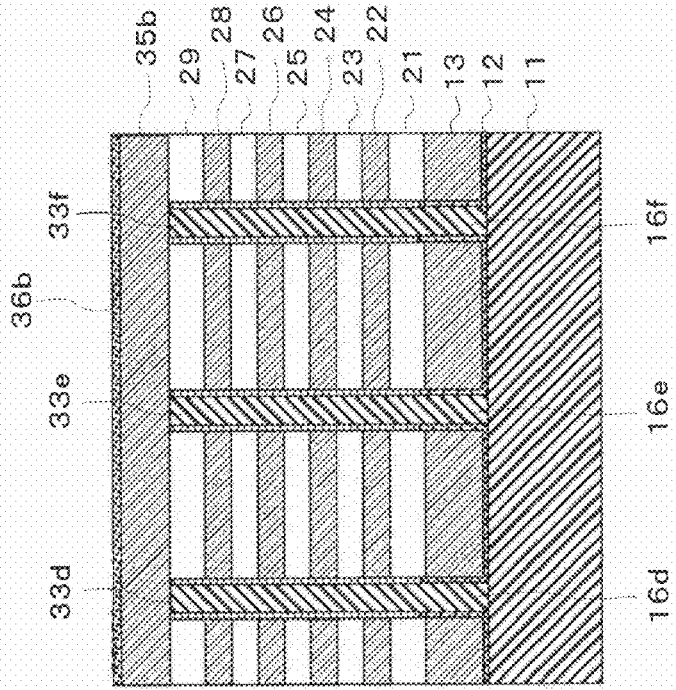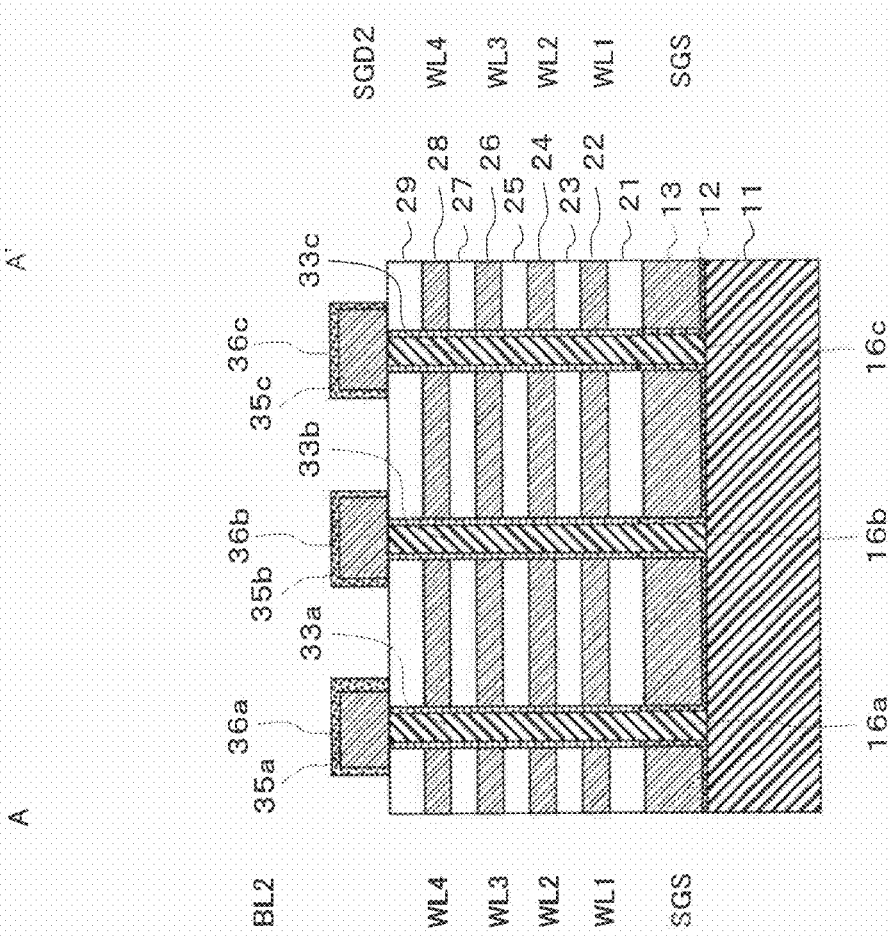

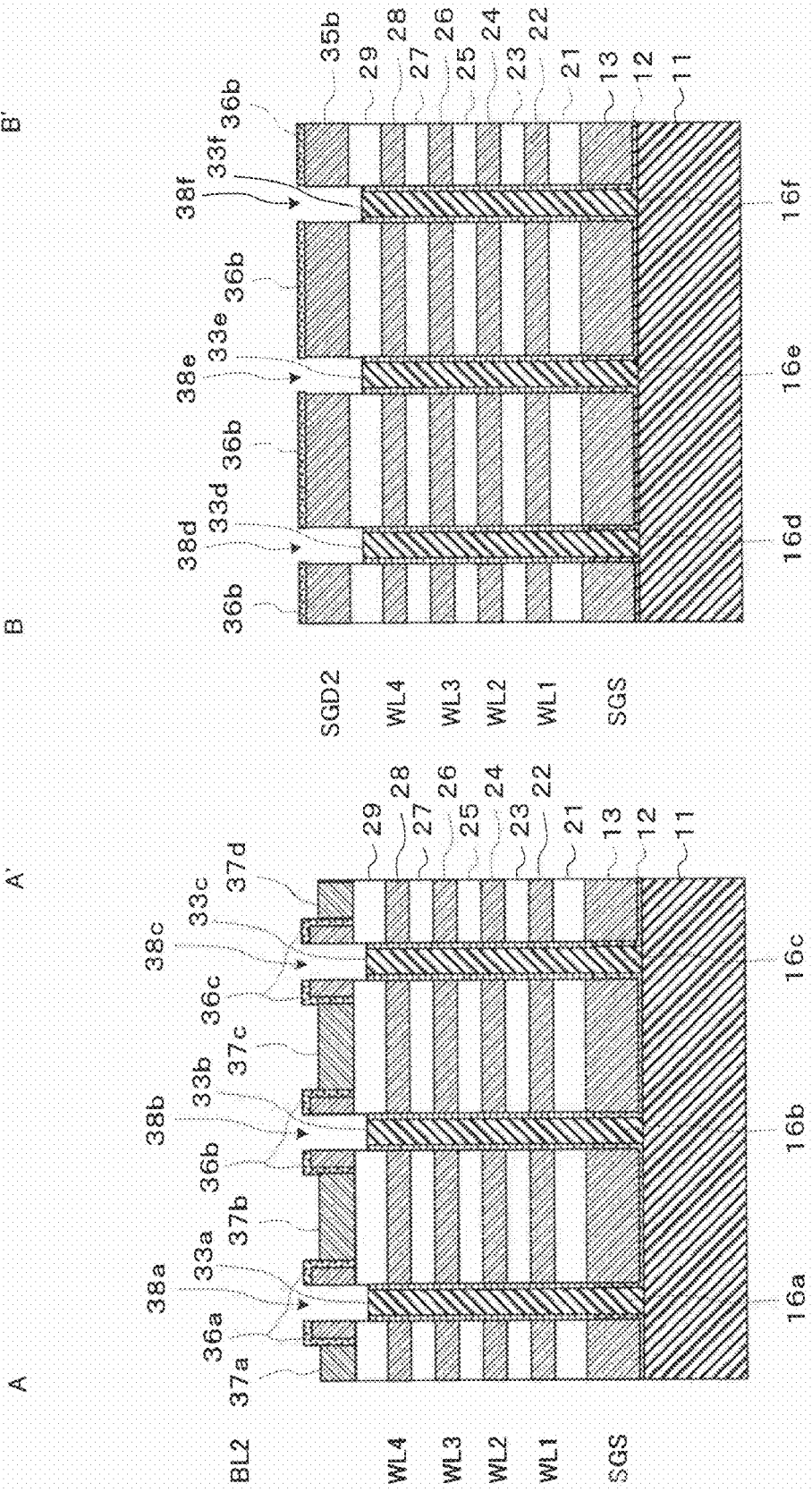

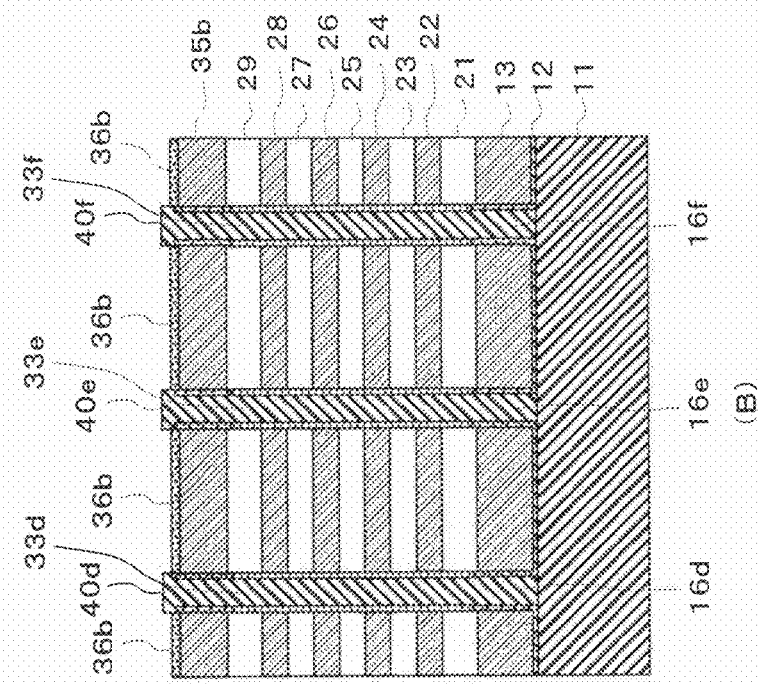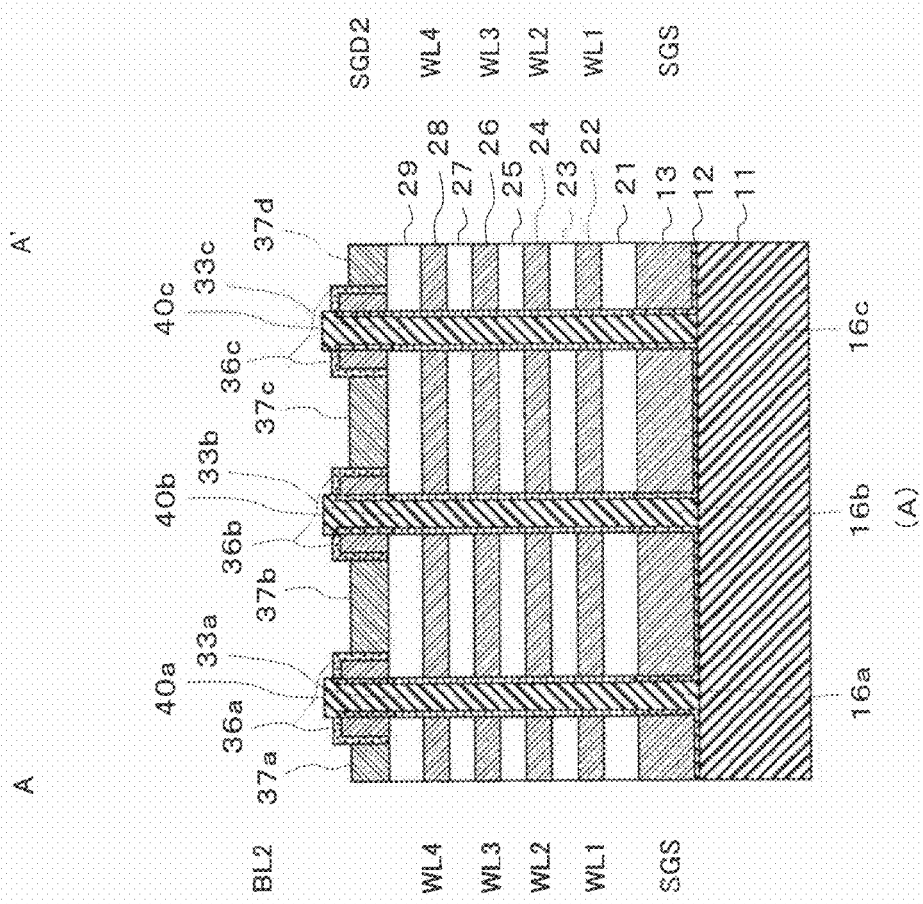

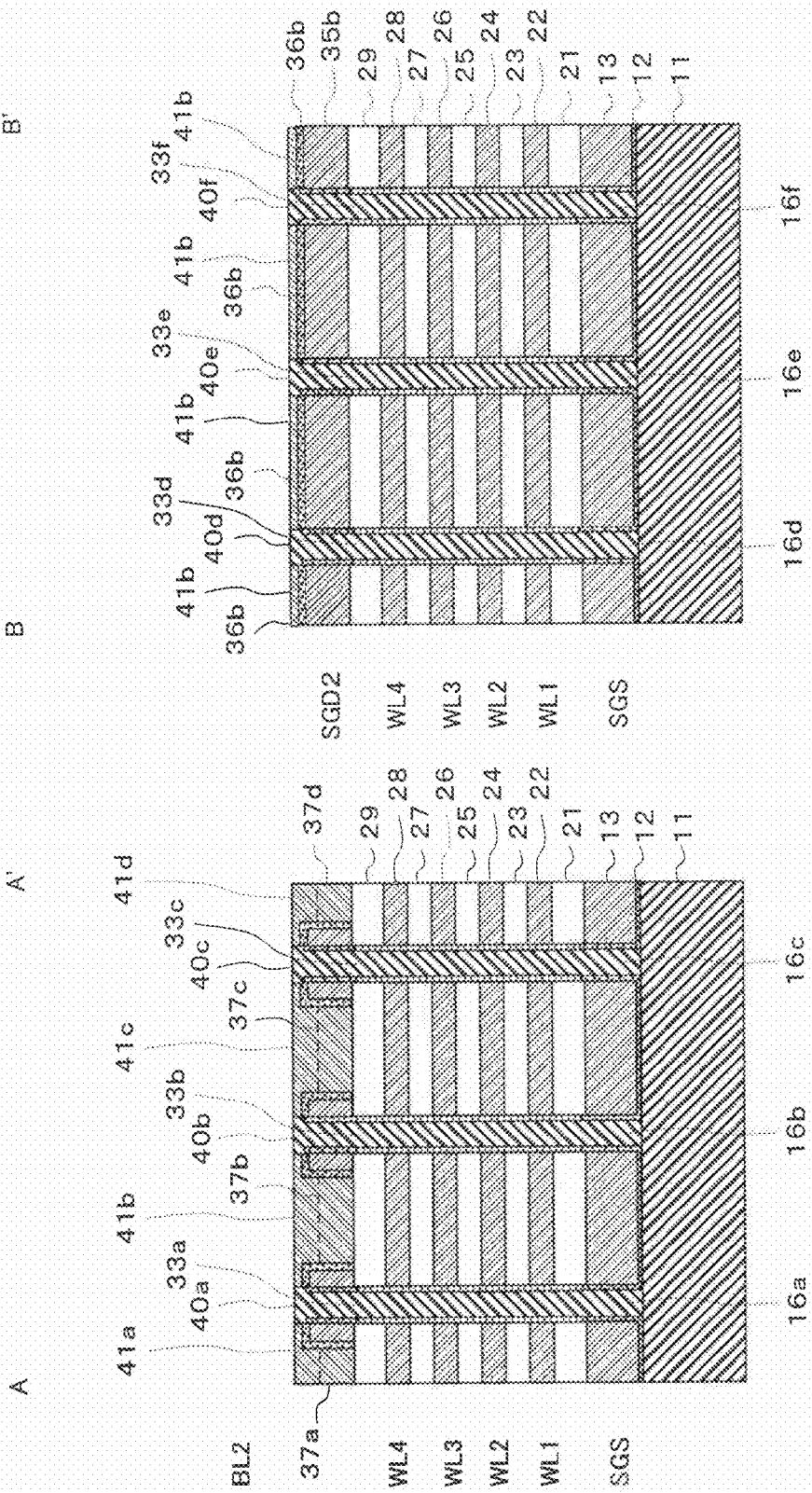

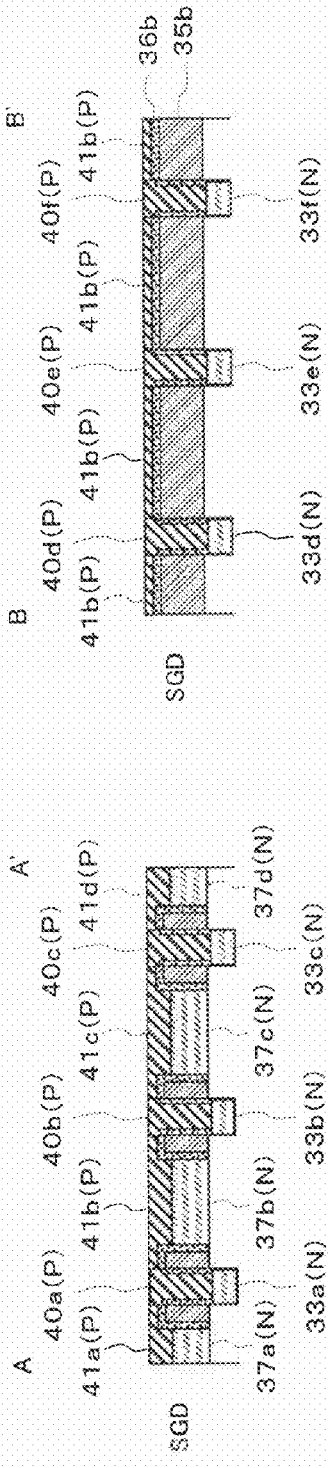
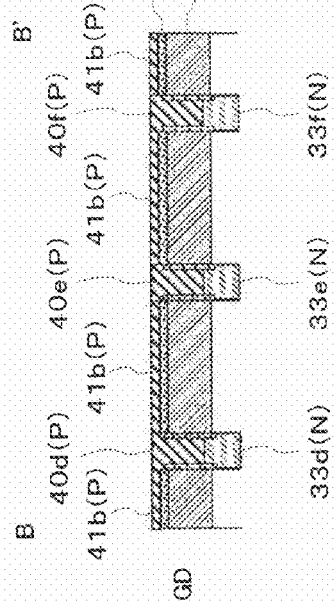
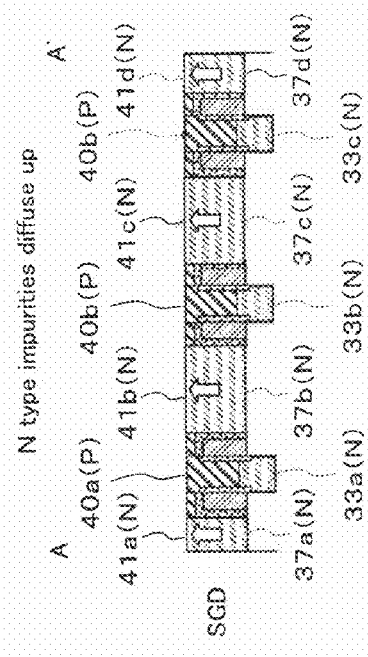
FIG. 19A
FIG. 19B
FIG. 20A
FIG. 20B

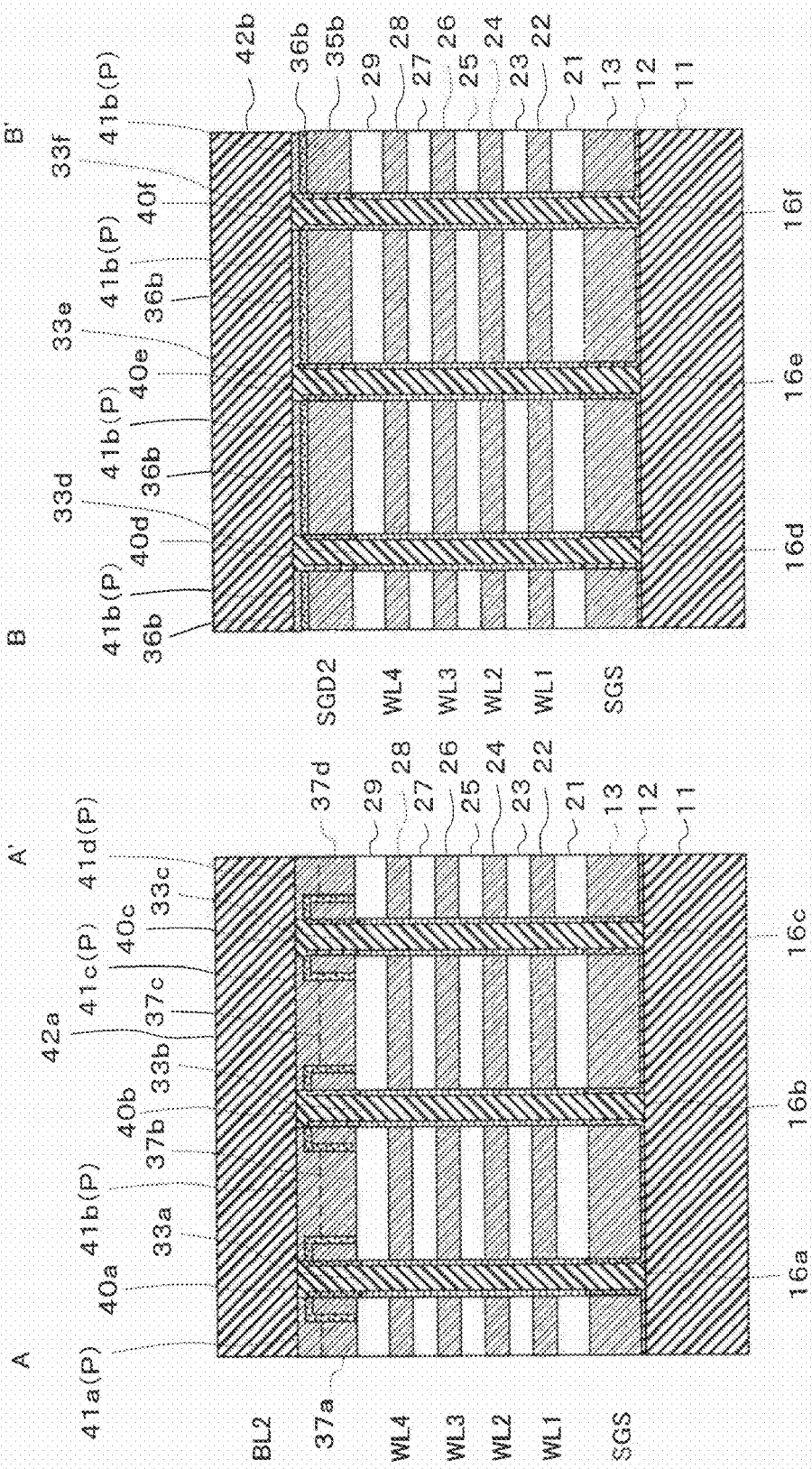

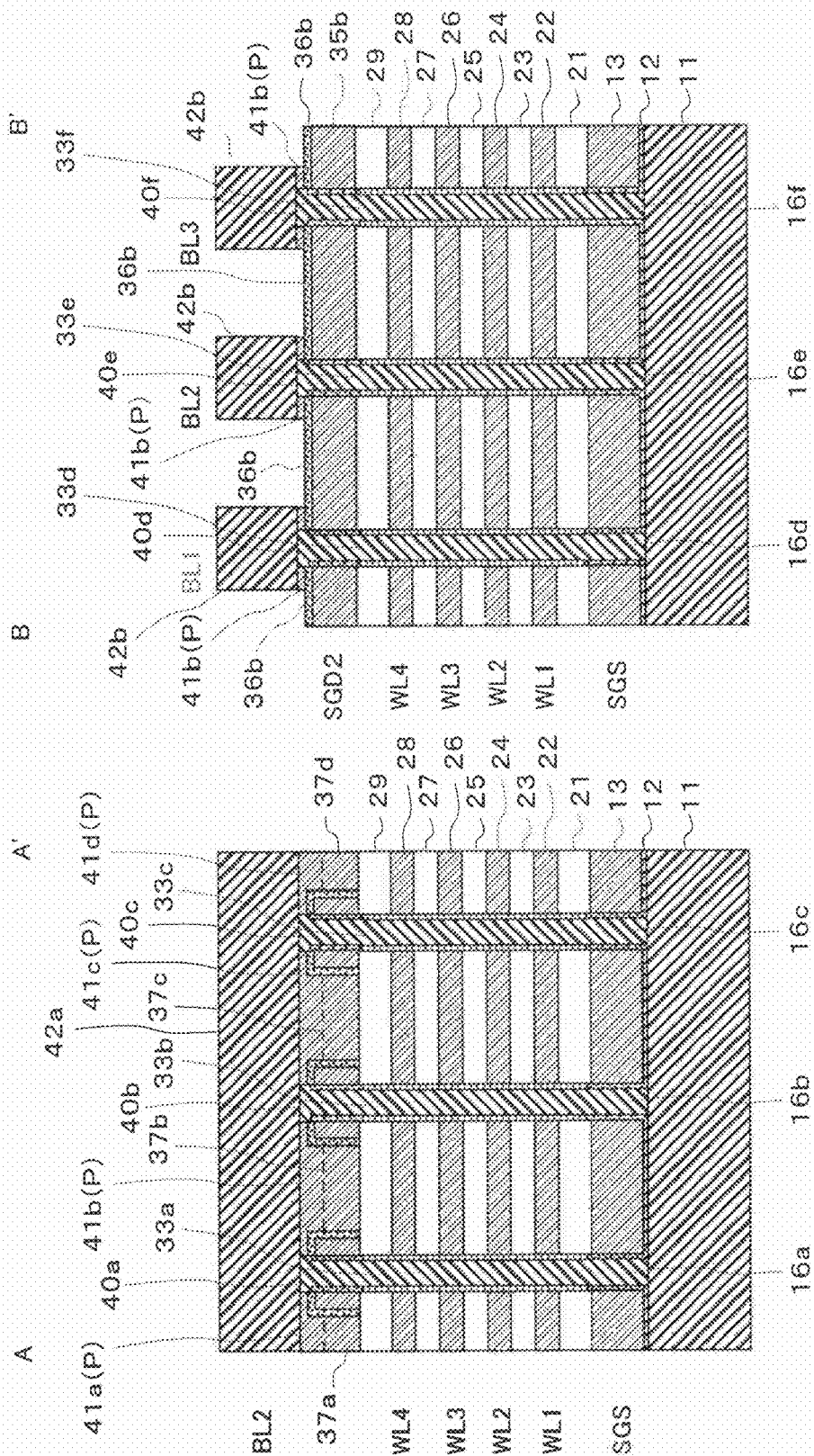

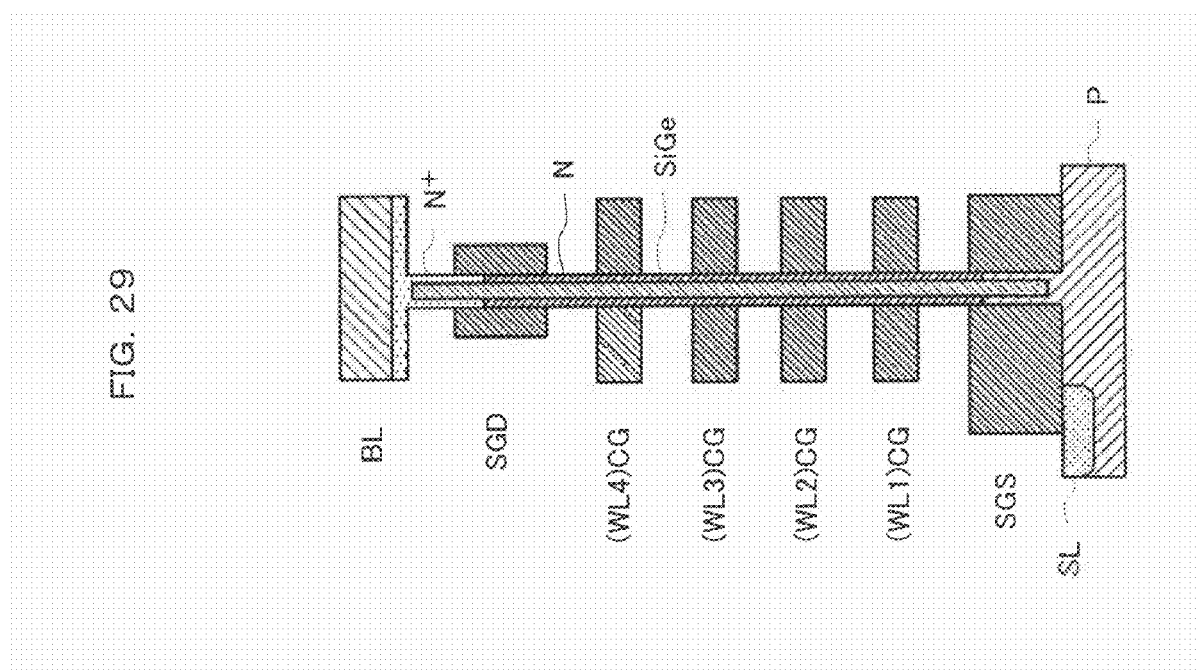

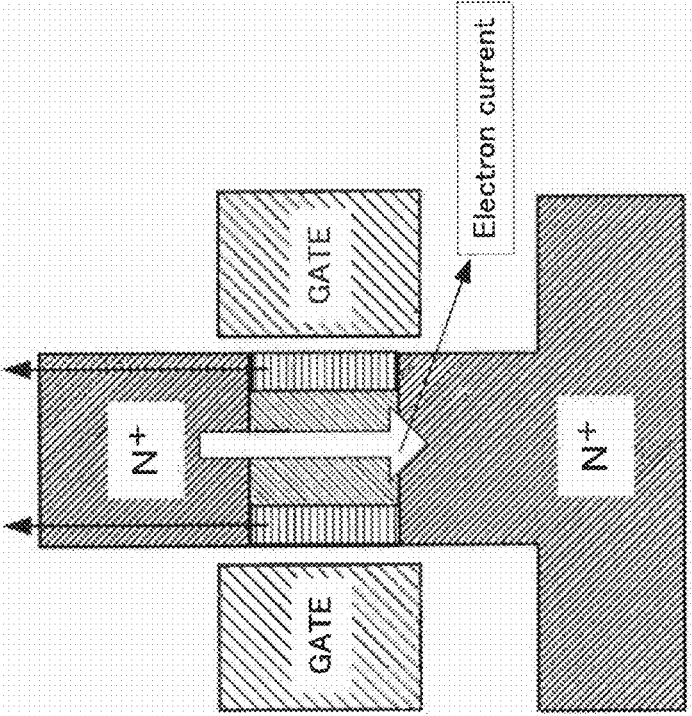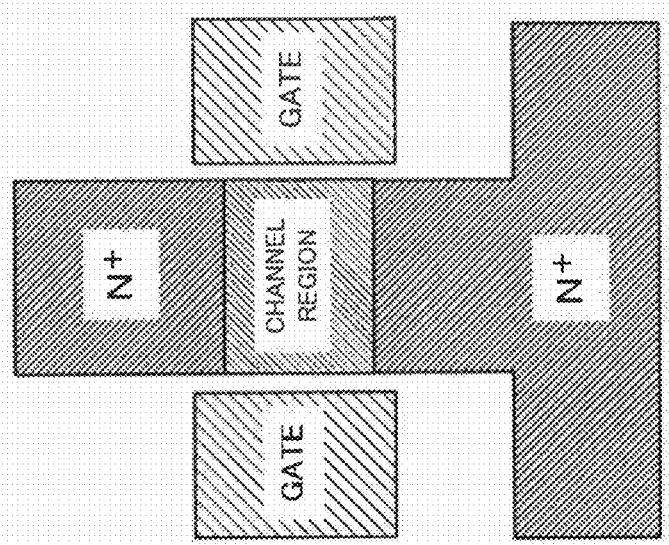

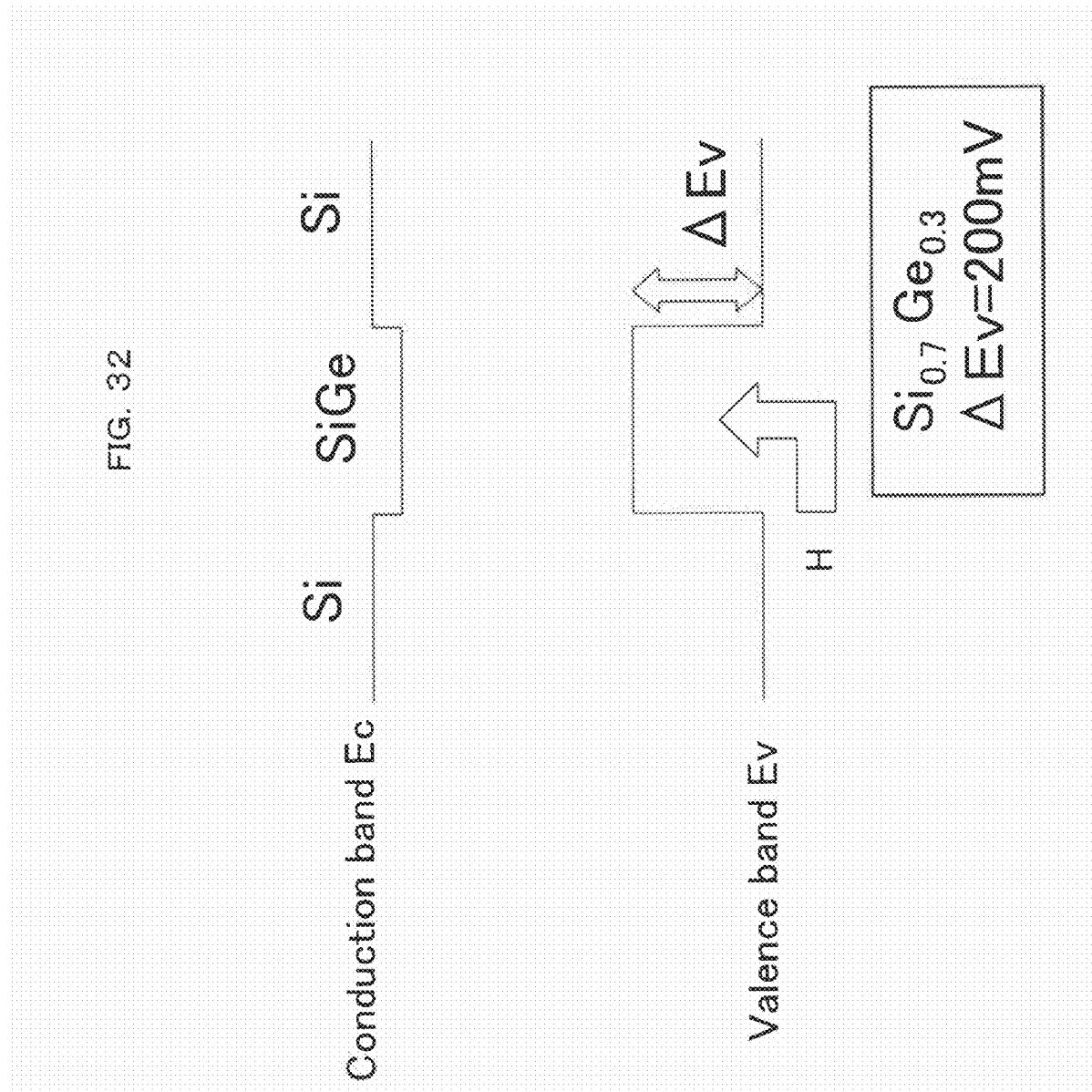

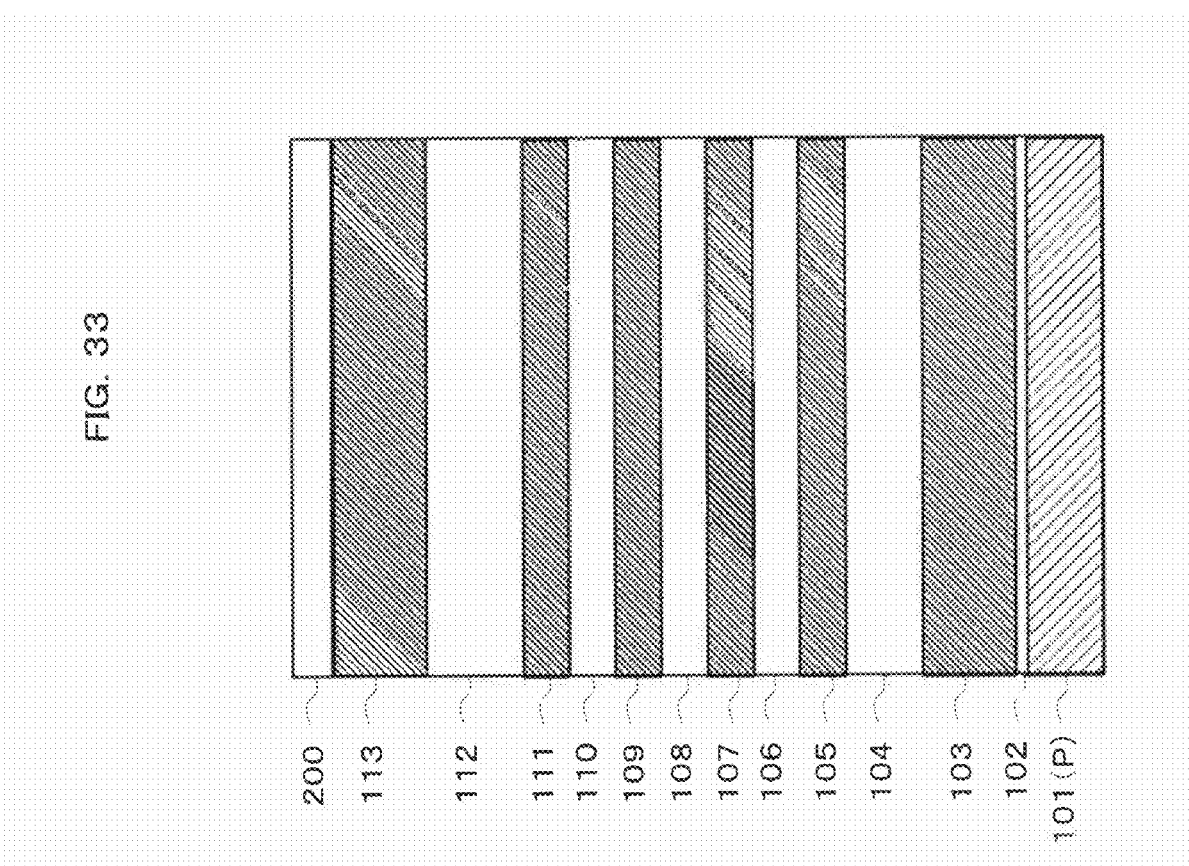

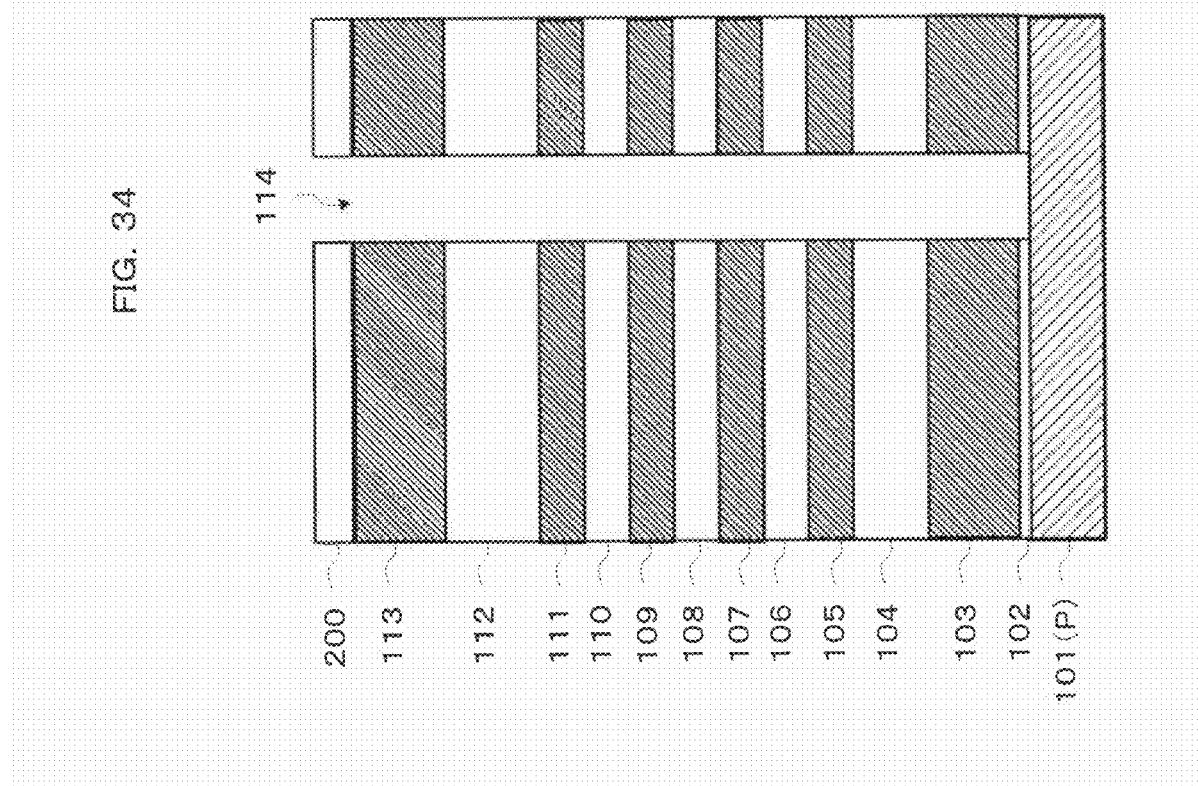

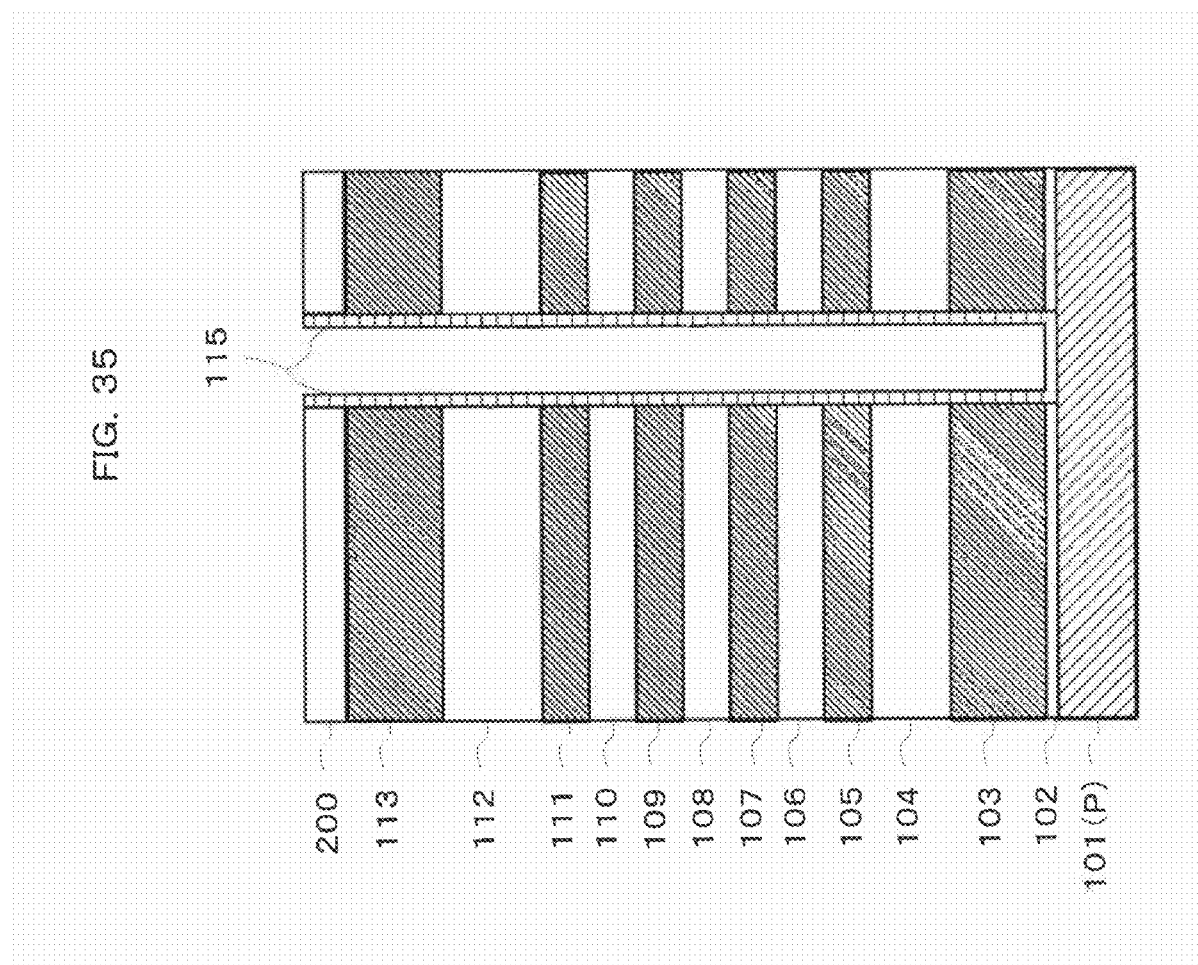

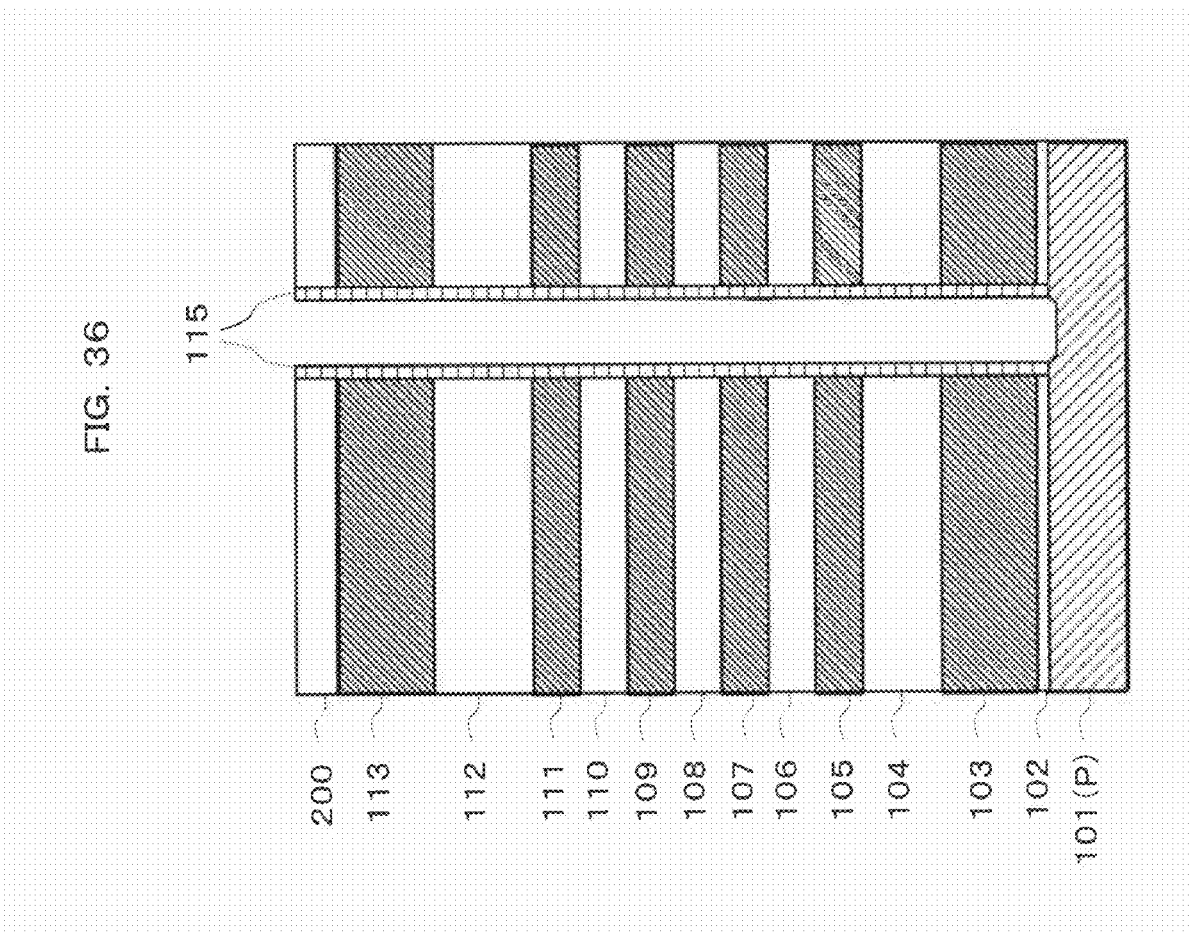

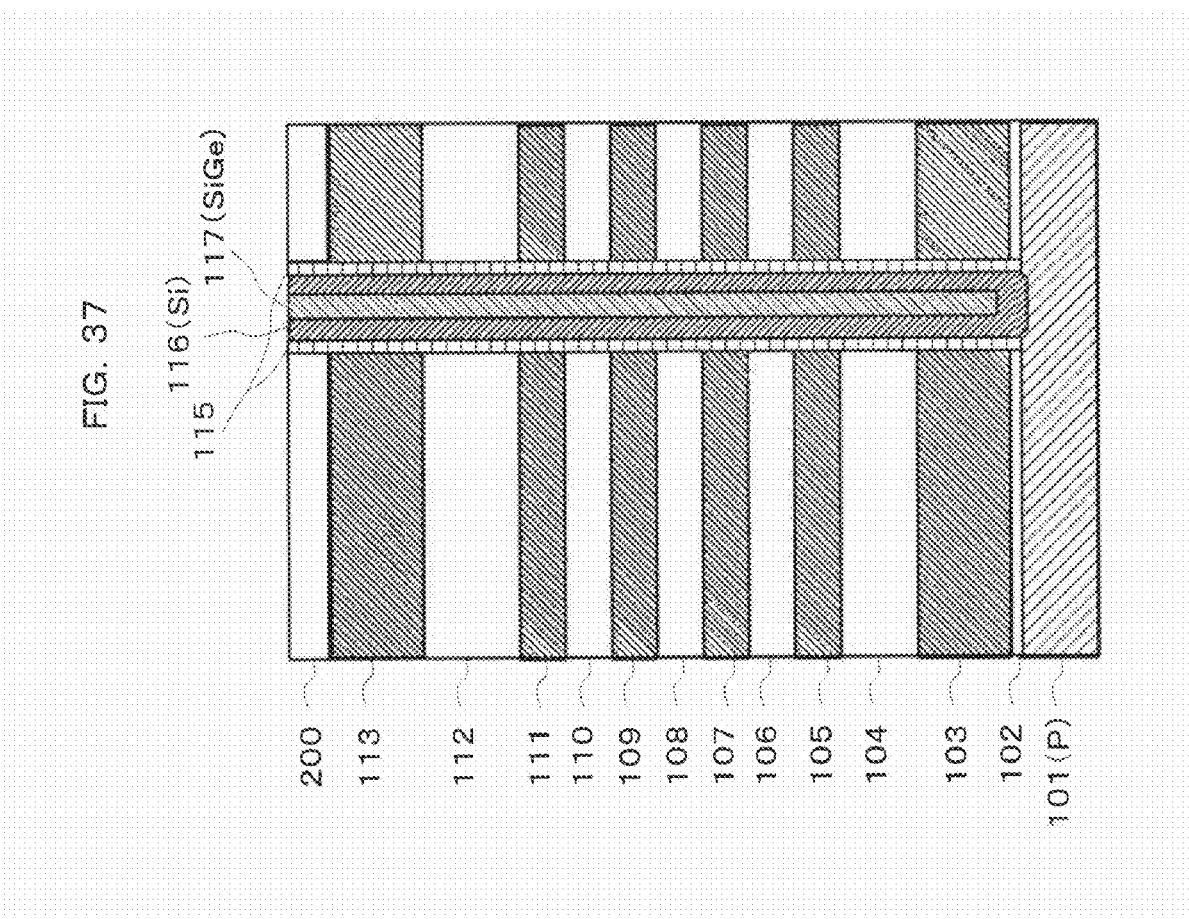

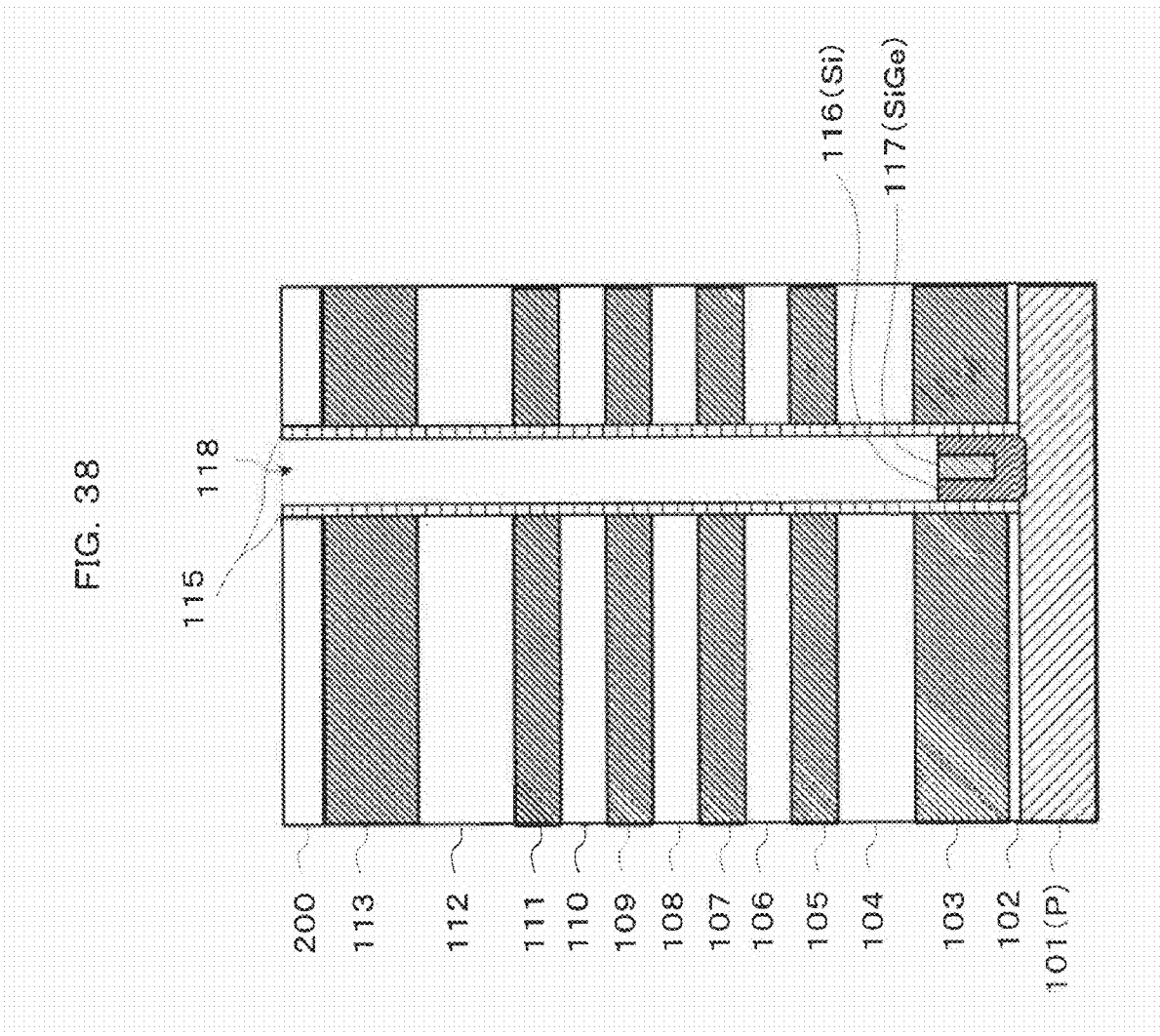

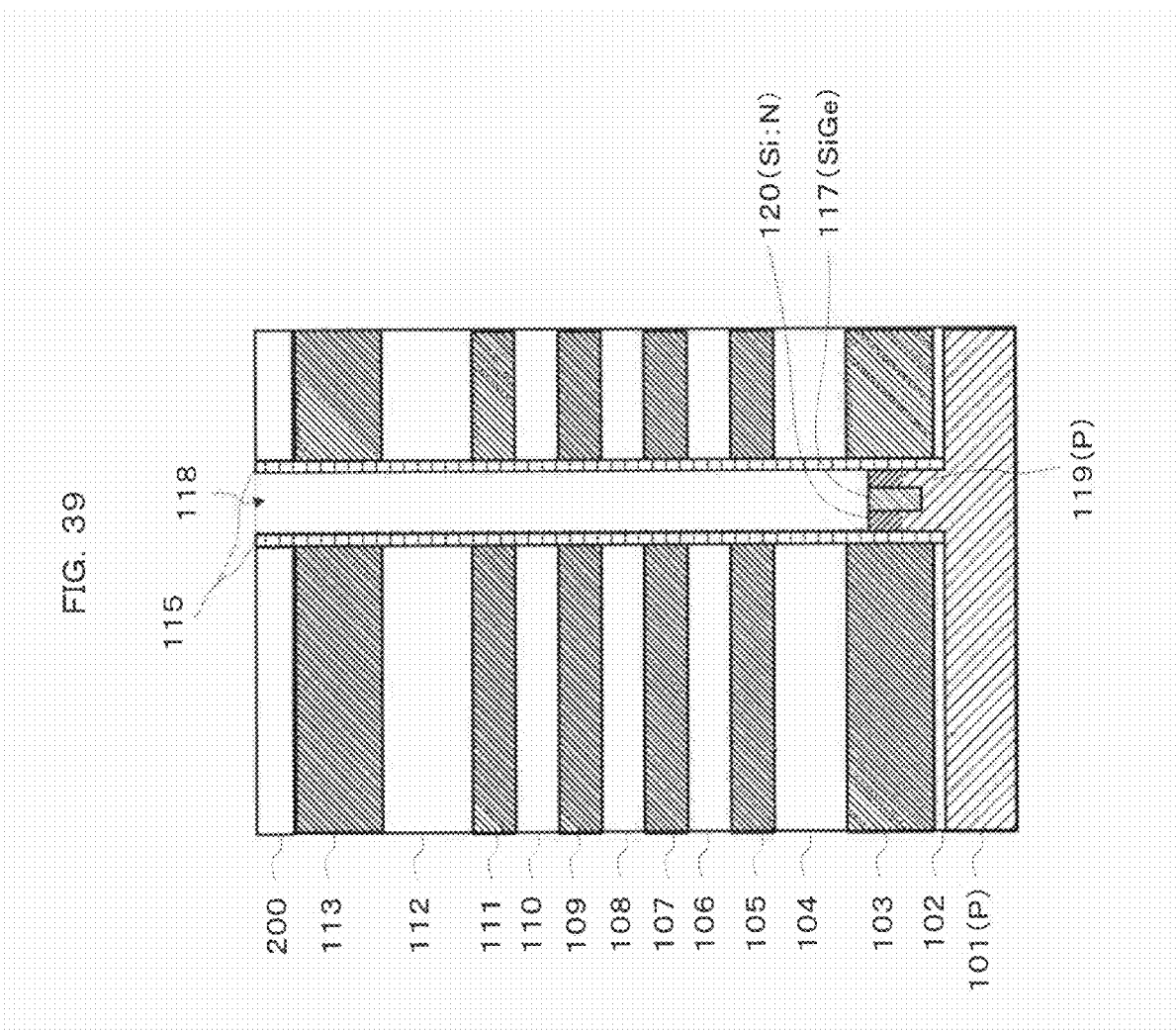

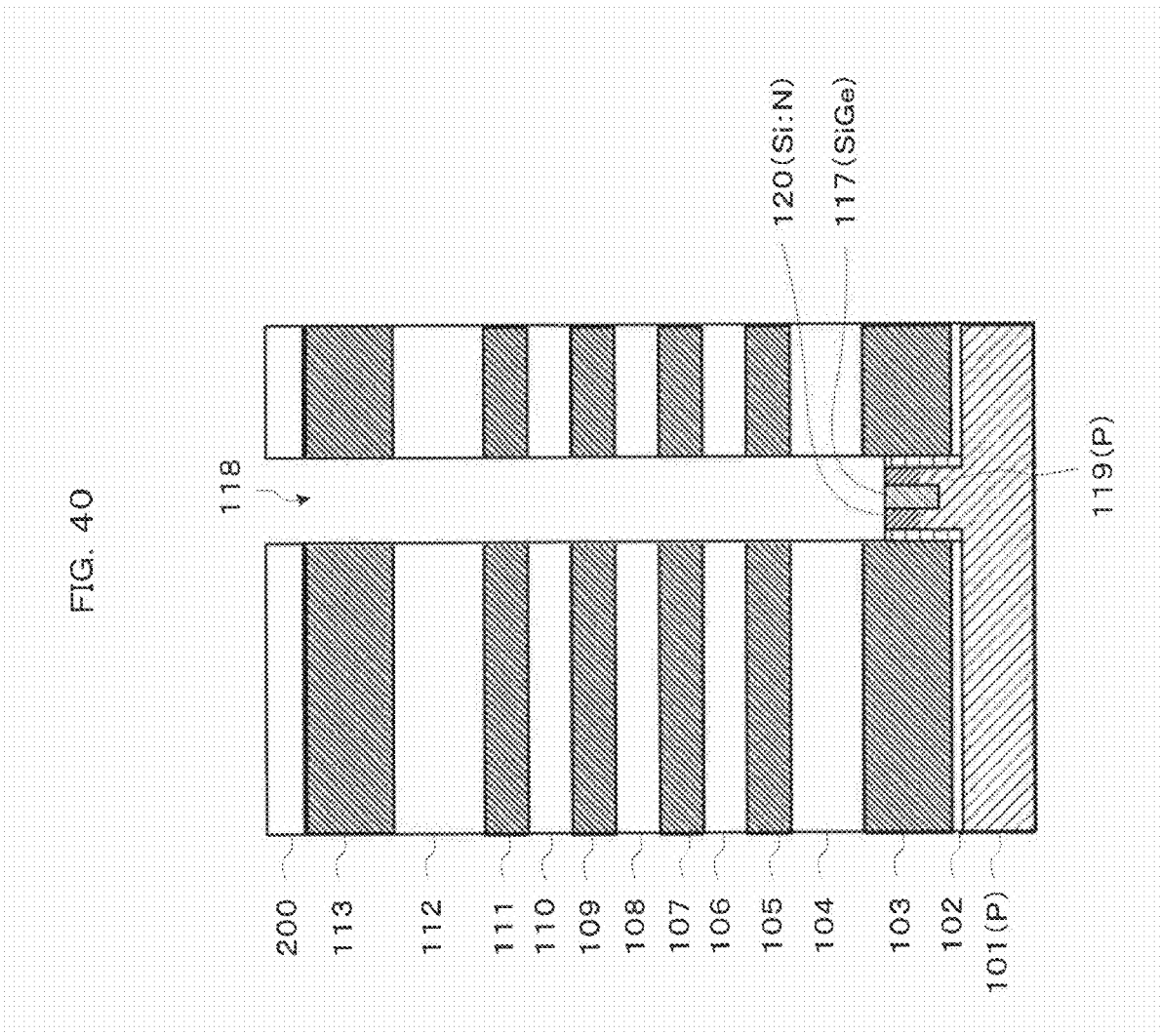

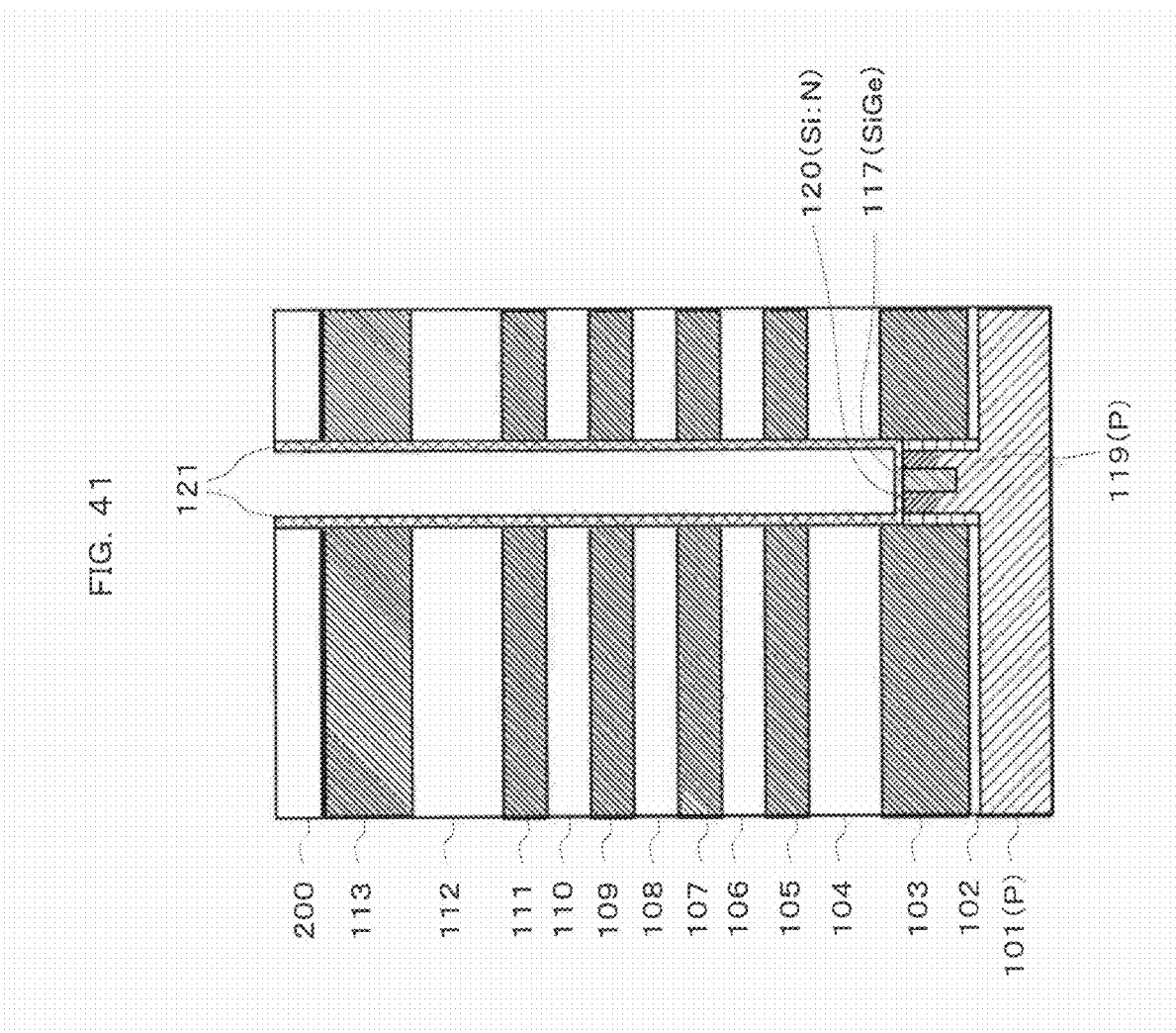

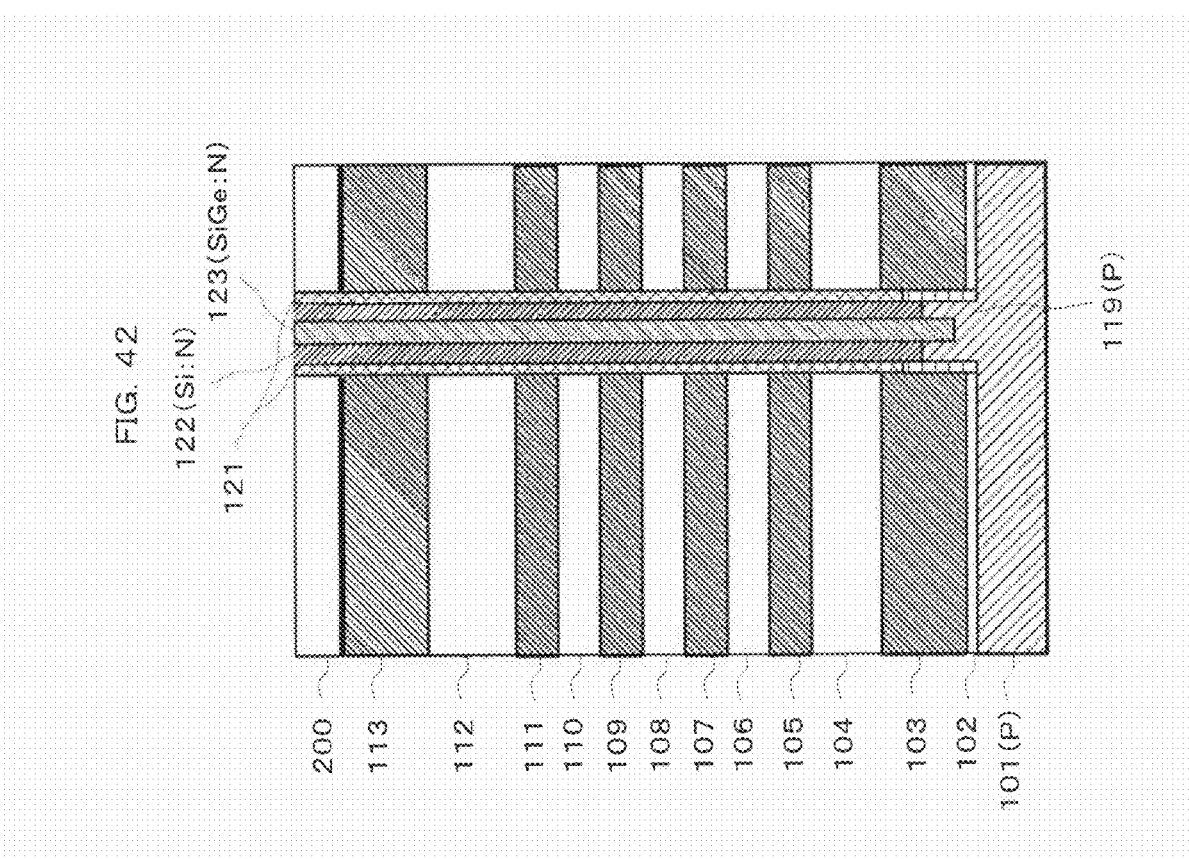

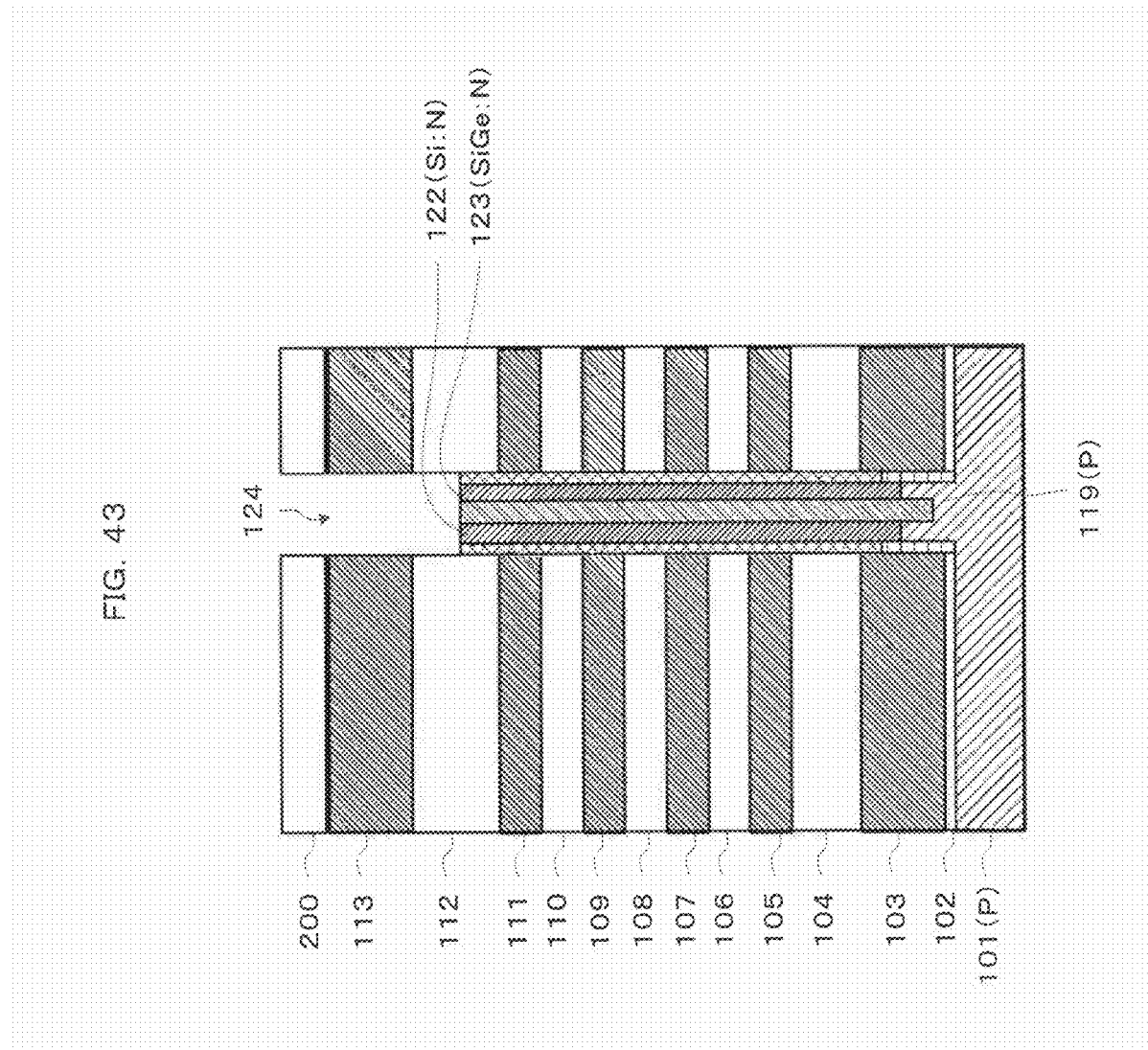

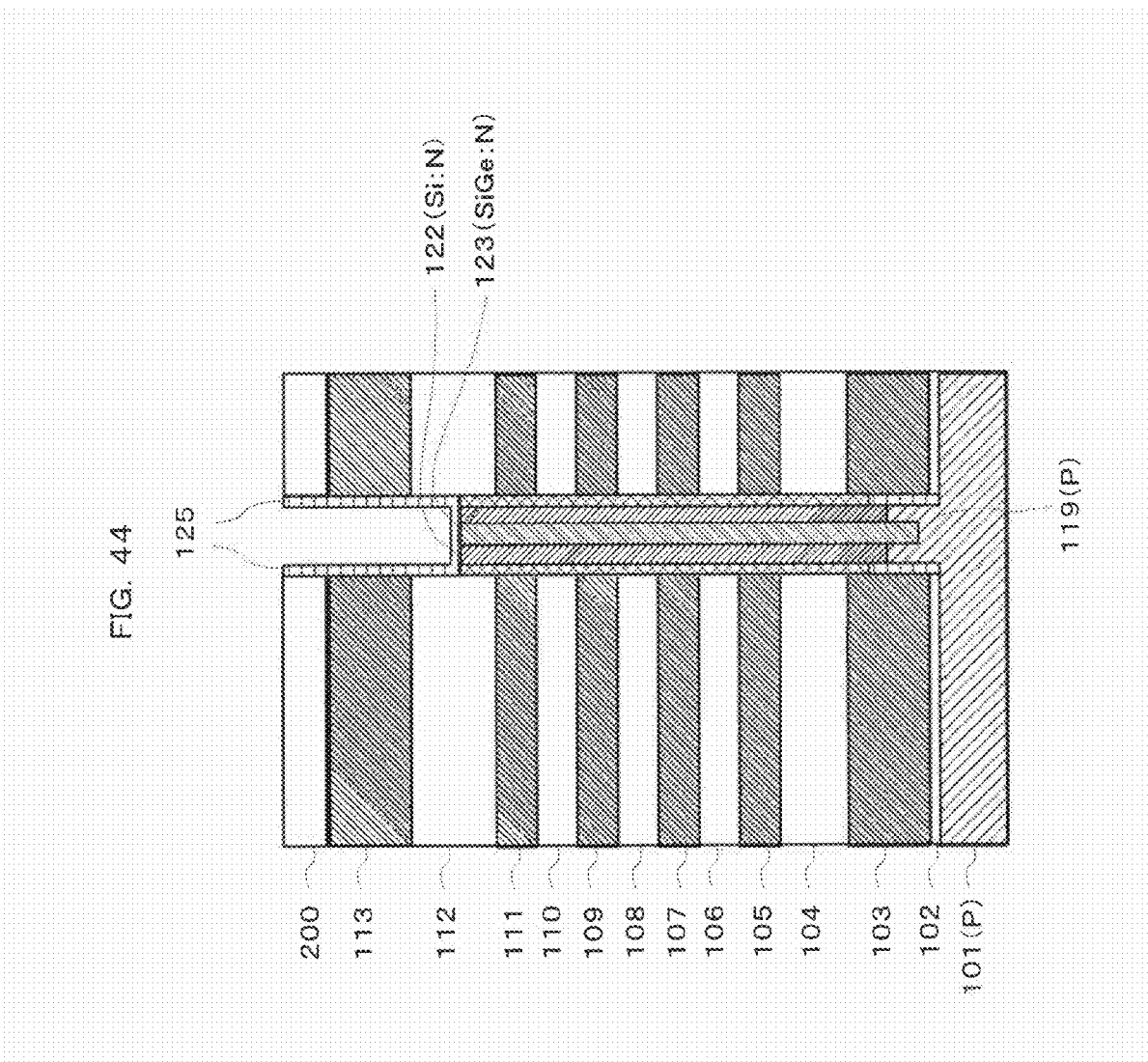

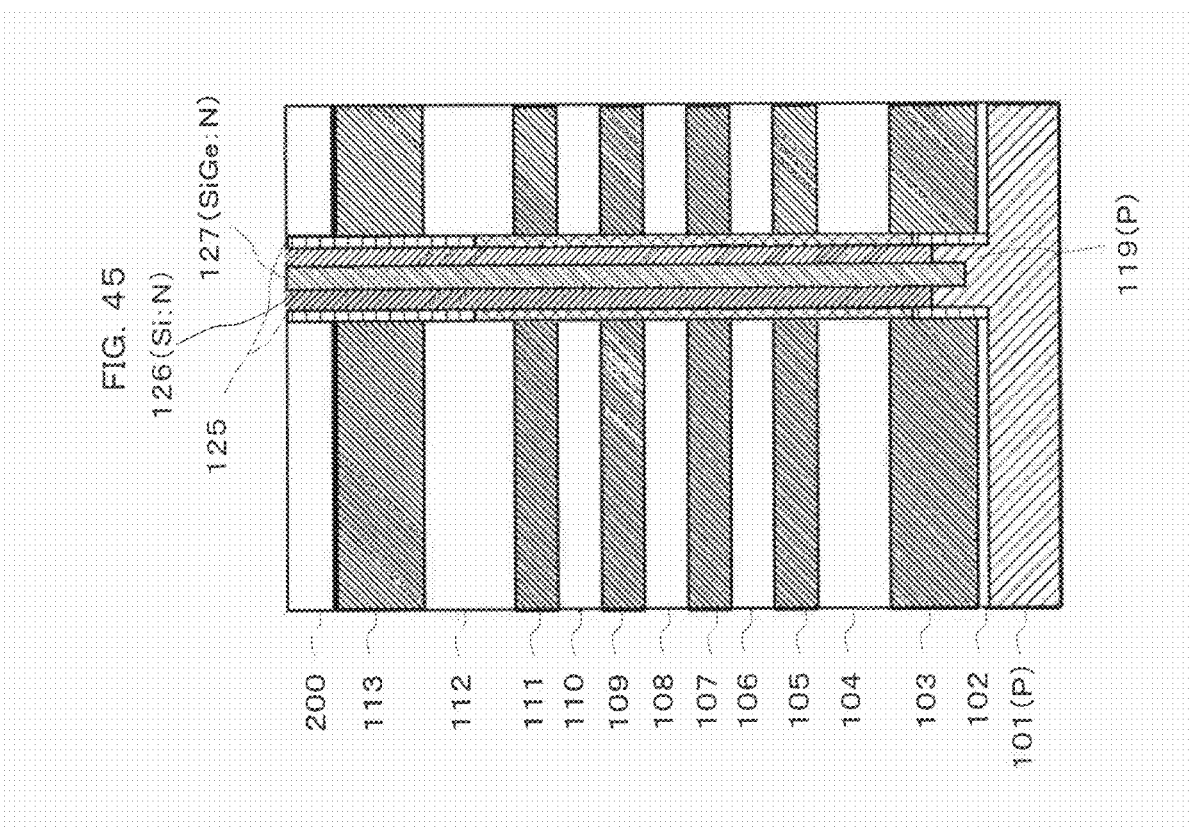

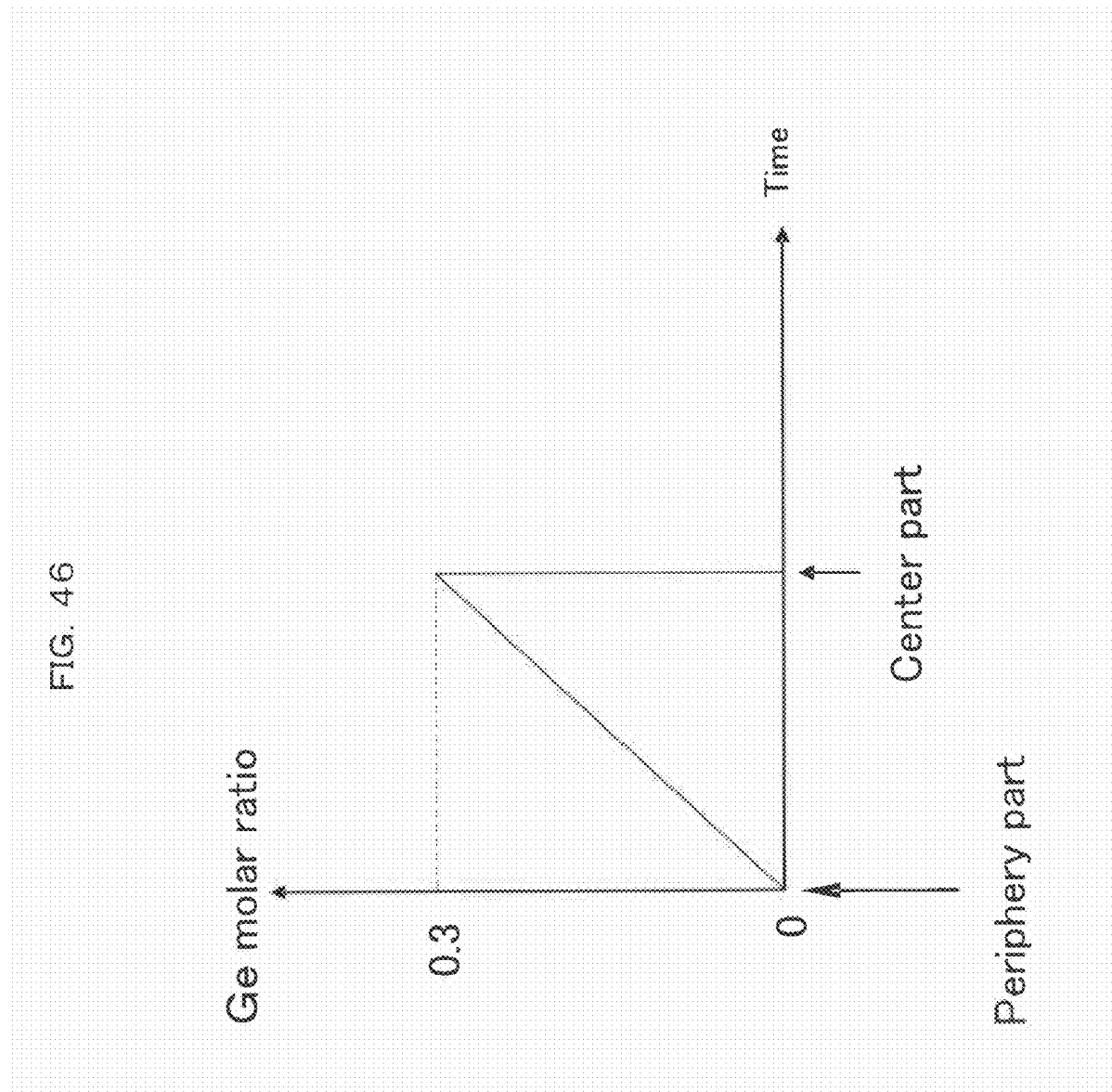

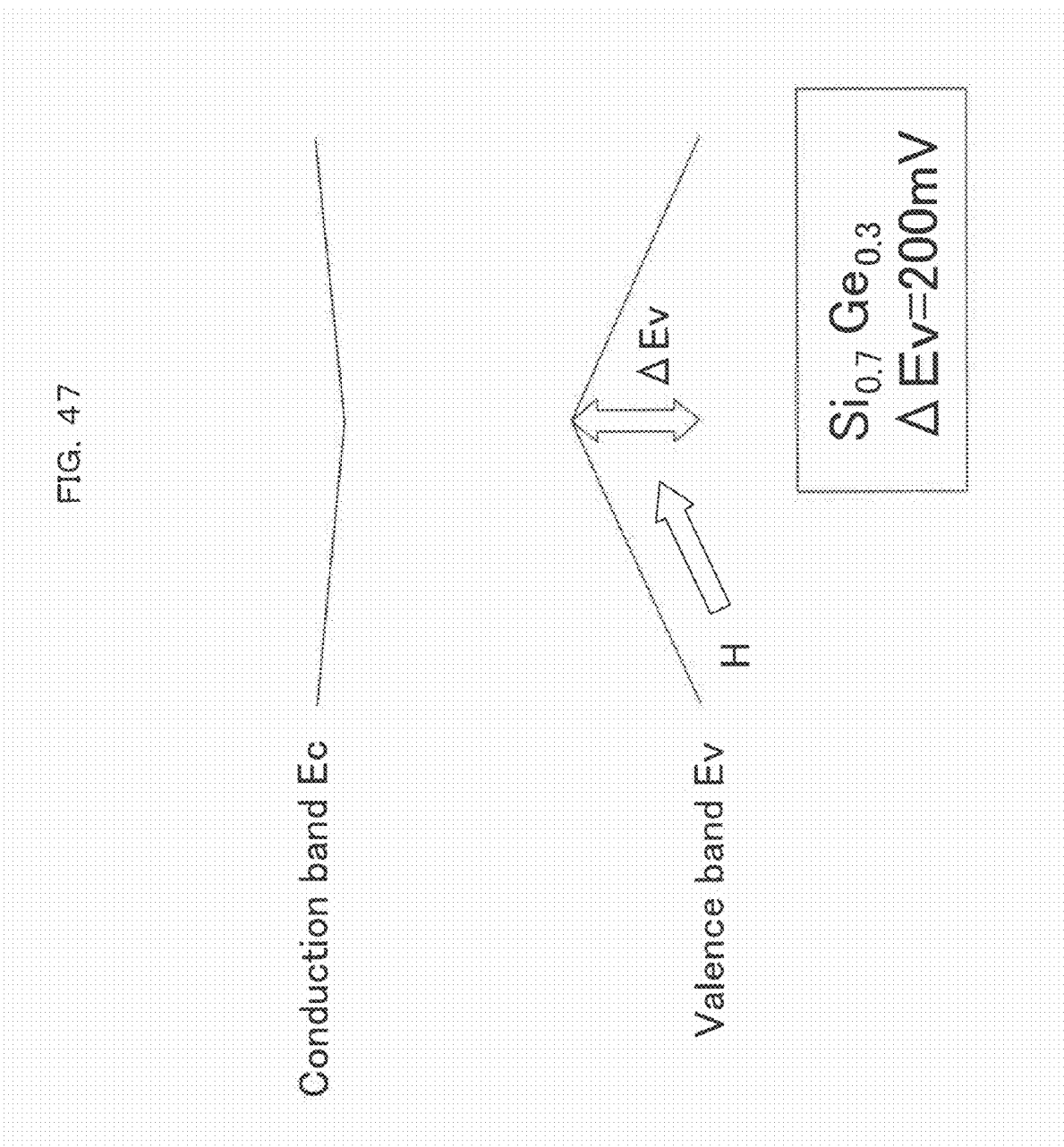

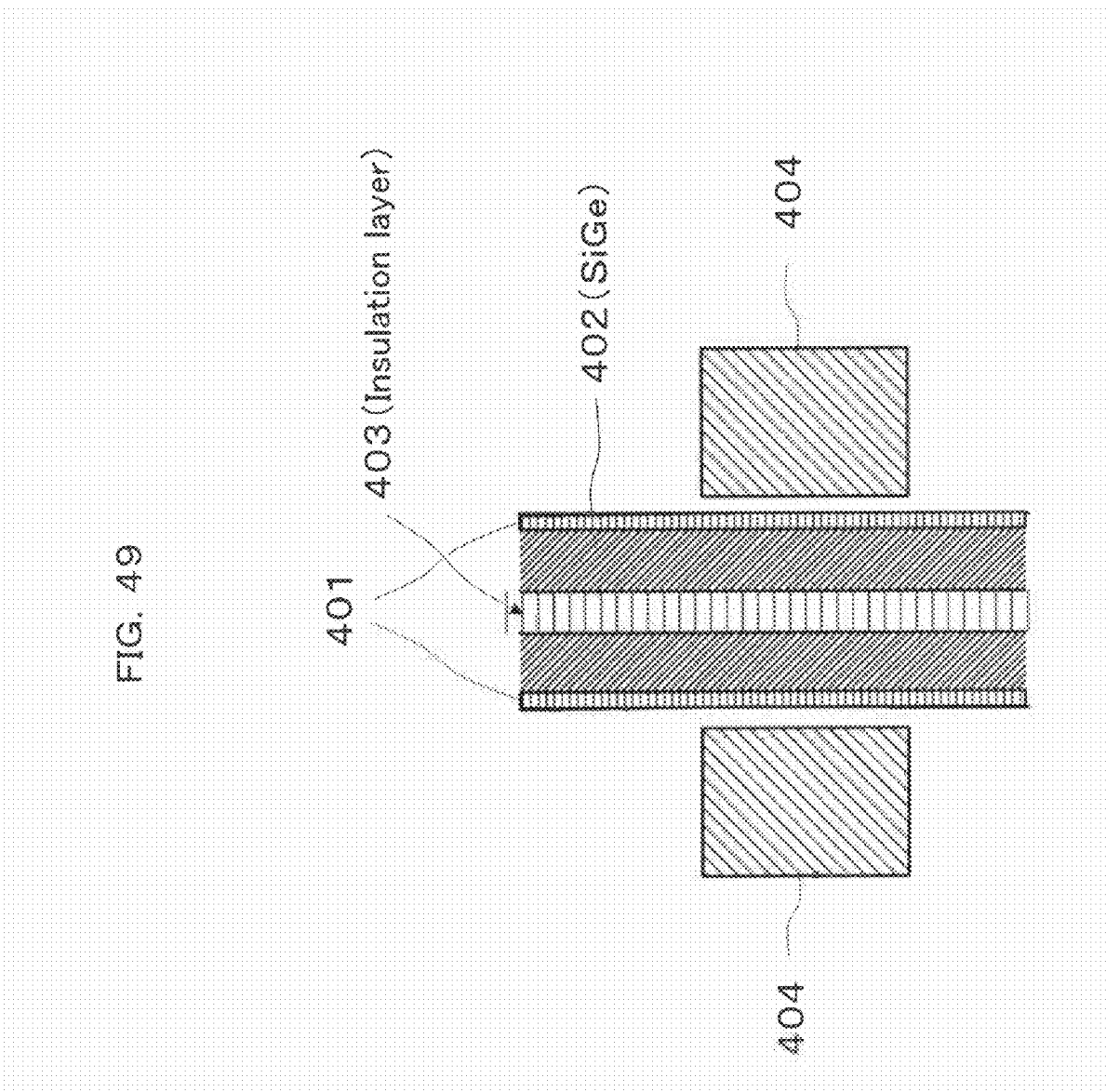

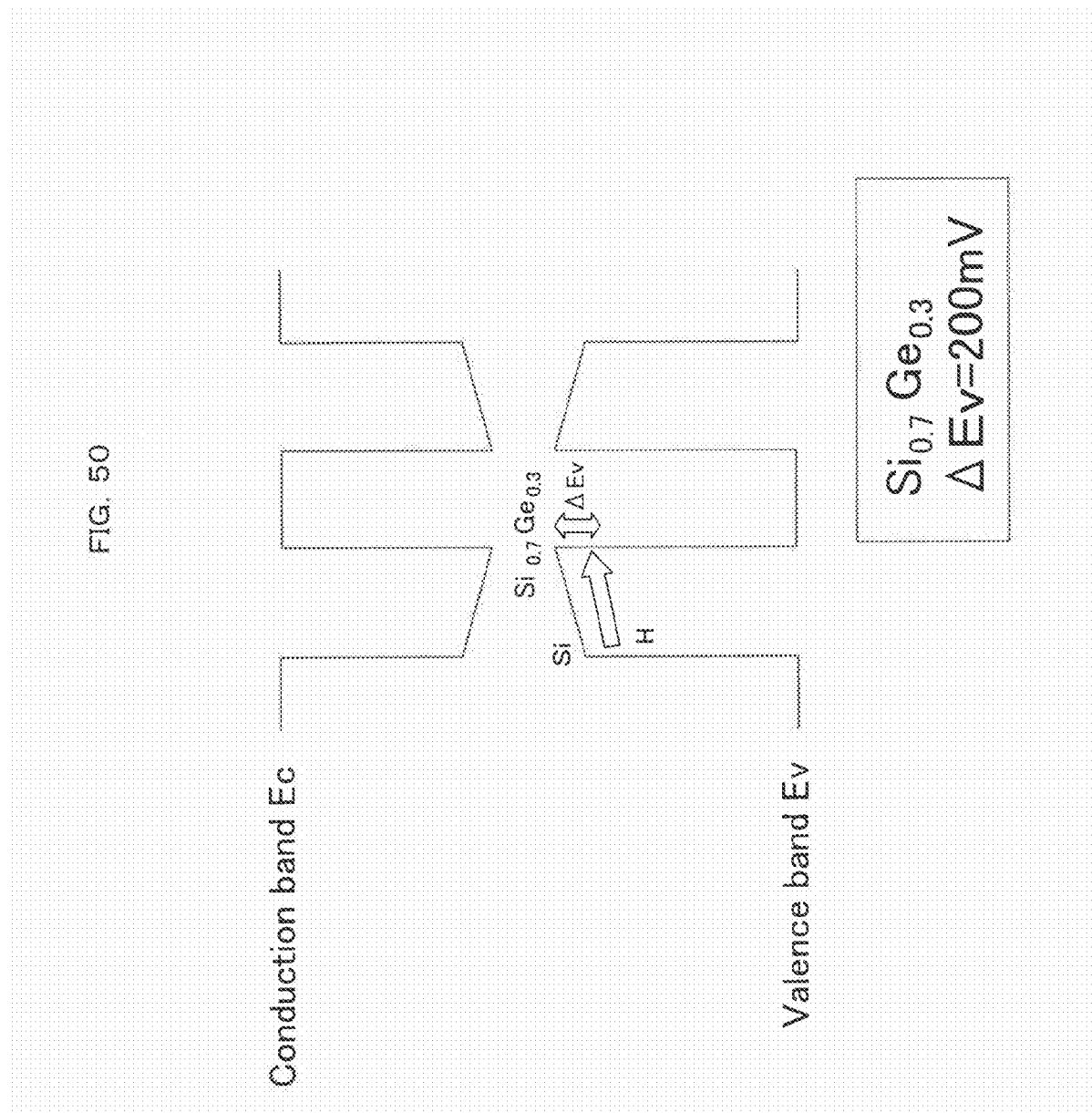

us 7,956,408 B2

NONVOLATILE SEMICONDUCTOR MEMORY DEVICE

CROSS REFERENCE TO RELATED APPLICATIONS

This application is based upon and claims the benefit of priority from the prior Japanese Patent Application No. 2007-017115, filed on Jan. 26, 2007, the entire contents of which are incorporated herein by reference.

BACKGROUND

The demand for small size, large capacity nonvolatile semiconductor memory devices is increasing at a significant rate and a NAND type flash memory which can realize high integration and large capacity is being focused on. However, in order to realize such small size devices there is a need to further increase miniaturization of wiring patterns for example, even though a reduction in design rules is becoming more and more difficult. In recent years, a large number of nonvolatile semiconductor memory devices in which memory cells are arranged three dimensionally in order to increase the integration of memory have been proposed.

However, the memory cells which are arranged three dimensionally in a conventional nonvolatile semiconductor memory device are electrically insulated from the semiconductor substrate. Also, both a channel and a drain of a select gate which is formed in/on both ends of a memory cell which is stacked in a conventional semiconductor memory device in which the memory cells are arranged three dimensionally are formed by the same conductive select gate transistor. A control electrode is not connected to the channel region of this select gate transistor.

Due the structure outlined above, carriers accumulate in the channel region of a memory cell or select gate transistor, the threshold level of the channel region shifts and problems such as unstable operations may occur.

SUMMARY

A nonvolatile semiconductor memory device related to one embodiment of the present invention includes a substrate, a plurality of memory strings formed on said substrate, said memory string having a first select gate transistor, a plurality of memory cells and a second select gate transistor, said first select gate transistor having a first pillar semiconductor, a first gate insulation layer formed around said first pillar semiconductor and a first gate electrode being formed around said first gate insulation layer, said memory cell having a second pillar semiconductor, a first insulation layer formed around said second pillar semiconductor, a storage layer formed around said first insulation layer, a second insulation layer formed around said storage layer and first to nth electrodes (n is a natural number 2 or more) formed around said second insulation layer, said first to nth electrodes being spread in two dimensions respectively, said second select gate transistor having a third pillar semiconductor, a second gate insulation layer formed around said third pillar semiconductor and a second gate electrode being formed around said second gate insulation layer, and a channel region of at least either said first select gate transistor or said second select gate transistor formed by an opposite conductive type semiconductor to a source region and a drain region and a contact connected to said channel region.

BRIEF DESCRIPTION OF THE DRAWINGS

FIGS. 2A, 25 and 26 are cross sectional views of the line A-A' in FIG. 1 which shows the structure of the nonvolatile semiconductor memory device related to a first embodiment.

FIGS. 2B, 23 and 24 are cross sectional views of B-B' in FIG. 1 which shows the structure of the nonvolatile semiconductor memory device related to a first embodiment.

FIGS. 3A, 4A, 5A, 6A, 7A, 8A, 9A, 10A, 11A, 12A, 13A, 14A, 15A, 16A, 17A, 18A, 19A, 20A, 21A and 22A are cross sectional views of the line A-A' in FIG. 1 which show each manufacturing process of the nonvolatile semiconductor memory device related to a first embodiment.

FIGS. 3B, 4B, 5B, 6B, 7B, 8B, 9B, 10B, 11B, 12B, 13B, 14B, 15B, 16B, 17B, 18B, 19B, 20B, 21B and 22B are cross sectional views of B-B' in FIG. 1 which show each manufacturing process of the nonvolatile semiconductor memory device related to a first embodiment of this invention.

FIG. 29 is a cross sectional view of B-B' in FIG. 1 which shows the structure of the nonvolatile semiconductor memory device related to a first embodiment.

FIG. 30A is a drawing which shows the device structure of a transistor for explaining a substrate floating effect.

FIG. 30B is a drawing which shows the state where holes are accumulated in a channel region for explaining a substrate floating effect.

FIG. 32 is a drawing of an energy band of a material which is used in a semiconductor region of the nonvolatile semiconductor memory device related to a second embodiment.

FIGS. 33, 34, 35, 36, 37, 38, 39, 40, 41, 42, 43, 44 and 45 are cross sectional views which show each manufacturing process of the nonvolatile semiconductor memory device related to a second embodiment.

FIG. 46 is a drawing which shows the change in the Ge molar ratio of SiGe gas at the time of forming a semiconductor region of the nonvolatile semiconductor memory device related to a second embodiment.

FIG. 47 is a drawing of an energy band of a material which is used in a semiconductor region of the nonvolatile semiconductor memory device related to a third embodiment.

FIG. 49 a drawing which shows the device structure of a transistor of the nonvolatile semiconductor memory device related to another embodiment.

FIG. 50 is a drawing of an energy band of a material which is used in a semiconductor region of the nonvolatile semiconductor memory device related to another embodiment.

DETAILED DESCRIPTION OF THE INVENTION

Figure 1:
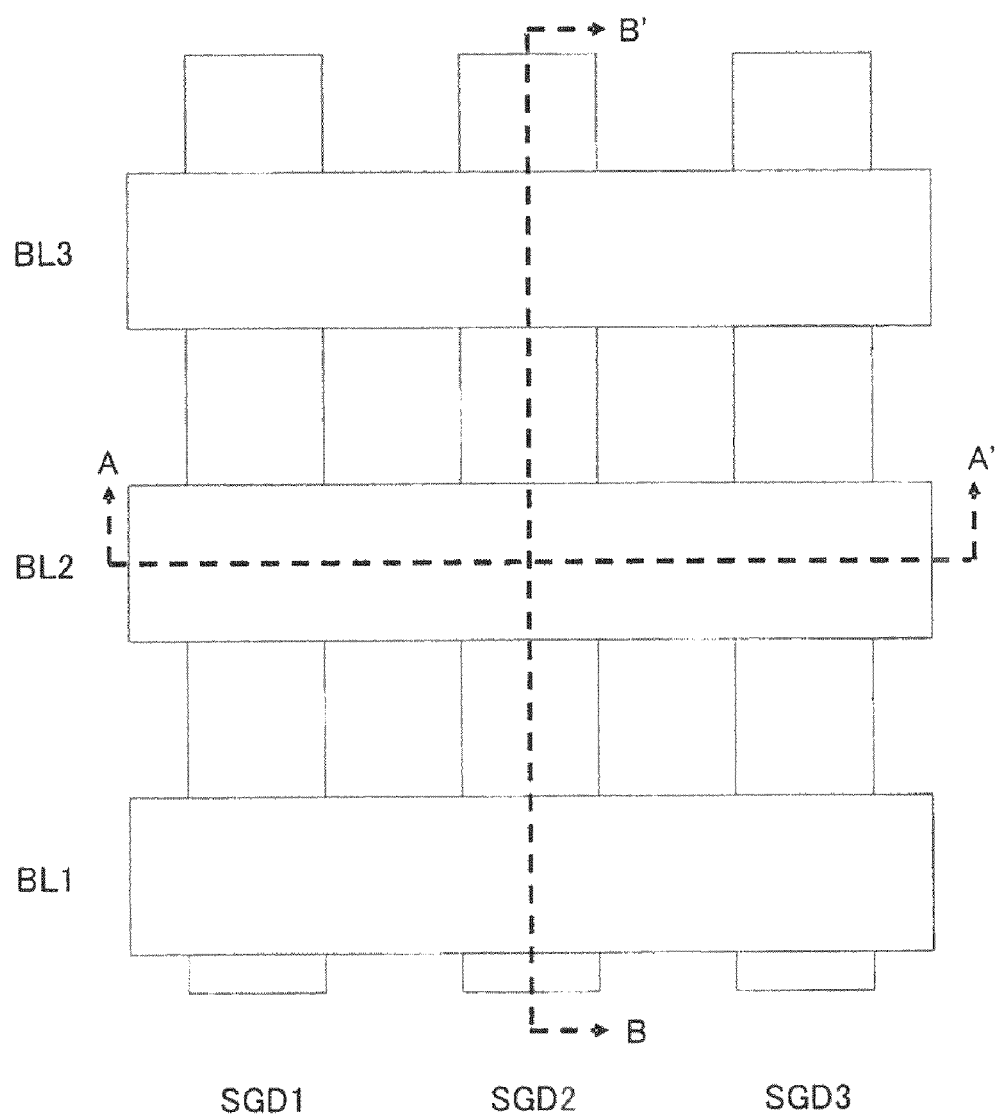
FIG. 1 is a top view of the nonvolatile semiconductor memory device related to a first embodiment.

Below, the embodiments of the present invention will be explained in detail while referring to the drawings. However, the present invention can be realized by many different embodiments and is not limited to the details outlined in the embodiments shown below.

(First Embodiment) FIG. 1 is a top view of the nonvolatile semiconductor memory device related to a first embodiment. In FIG. 1 the nonvolatile semiconductor memory device is arranged with a plurality of bit lines BL1-BL2 and a plurality of drain side select gate transistors SGD1-SGD3 arranged in the shape of an array. FIG. 2A is a cross section view of the line A-A' of the nonvolatile semiconductor memory device in FIG. 1 and FIG. 2B is a cross section view of the line B-B' of the nonvolatile semiconductor memory device in FIG. 1.

In both FIGS. 2A and 2B a memory transistor region of the nonvolatile semiconductor memory device related to the first embodiment is formed by stacking memory cells on a substrate by making the semiconductor layers a pillar shape. 4 memory cells are stacked in layers as shown in the memory transistor region shown in FIGS. 2A and 2B. Also, each of the word lines WL1-WL4 of each layer in FIGS. 2A and 2B has a planar tabular structure formed from the same layer. In addition, SGS is a source side select gate transistor and SGD2 is a drain side select gate transistor in FIGS. 2A and 2B.

Next, the manufacturing process of the nonvolatile semiconductor device related to the first embodiment will be explained while referring to FIG. 3 to FIG. 22. In FIG. 3 to FIG. 22 each manufacturing process of the cross section view parts A-A' and B-B' of the nonvolatile semiconductor memory device 1 shown in FIGS. 2A and 2B is shown in that process order.

Figure 3A:
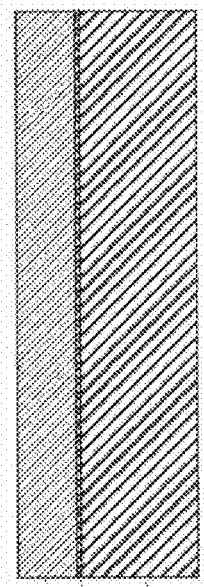
Figure 3B:
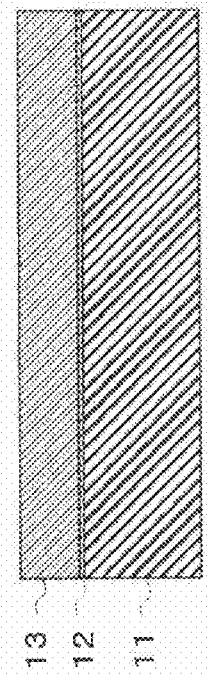

First, in FIGS. 3A and 3B, an insulation layer 12 is formed on the surface of the semiconductor substrate 11 and a gate layer 13 which becomes a gate of a source side select gate transistor SGS is formed on this insulation layer 12. The insulation layer 12 functions as a gate insulation layer of the source side select gate transistor SGS. Polysilicon or refractory metals be used for the gate layer 13.

Figure 4A:
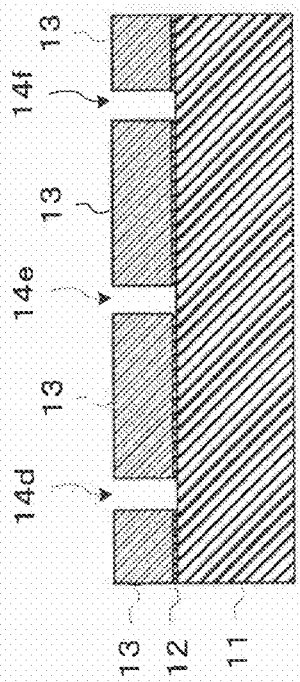
Figure 4B:
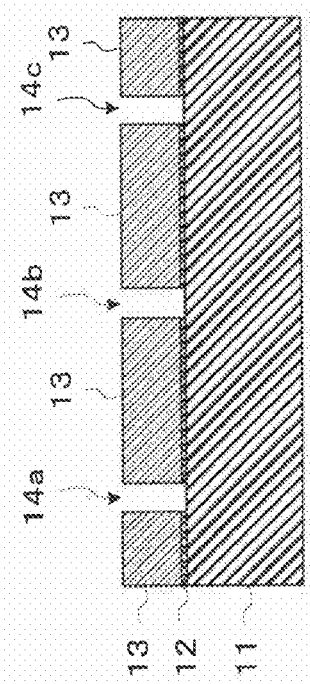

Next, in FIGS. 4A and 4B the insulation layer 12 and the gate layer 13 are patterned by etching for example, and the openings 14a-14f are formed. The openings 14a-14f are formed by aligning them in a position which becomes an intersection point of the bit lines BL1-BL3 and the drain side select gate transistors (lines) SGD1-SGD3 in FIG. 1.

Figure 5A:
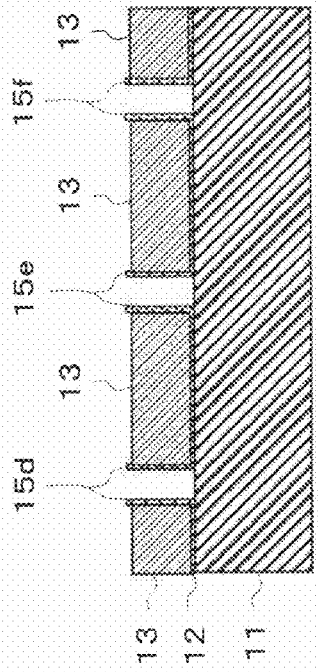
Figure 5B:
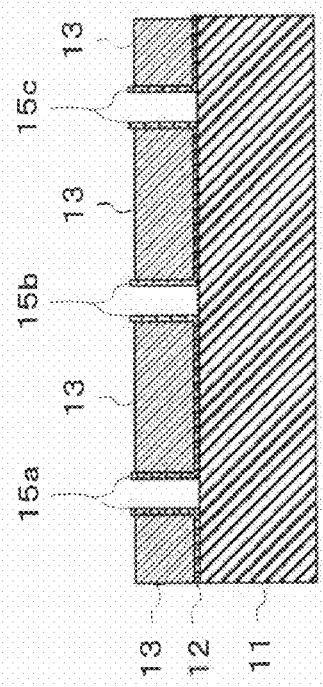

Next, in FIGS. 5A and 5B, the insulation layers 15a-15 are formed on each wall of the openings 14a-14f. The insulation layers 15a-15f is formed by a silicon dioxide layer in which a polysilicon side wall of the gate layer 13 is oxidized. The insulation layers 15a-15f may also be formed by depositing insulators on the polysilicon side wall.

Figure 6A:
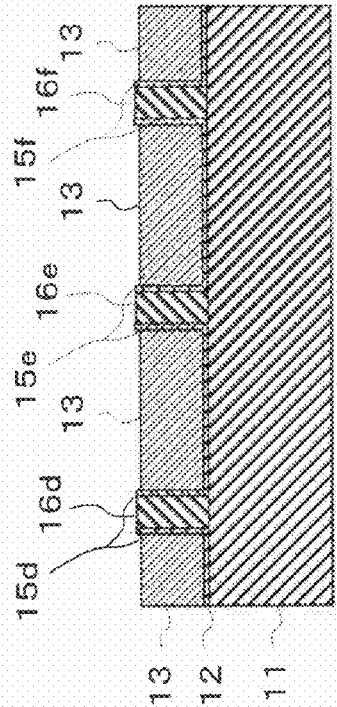
Figure 6B:
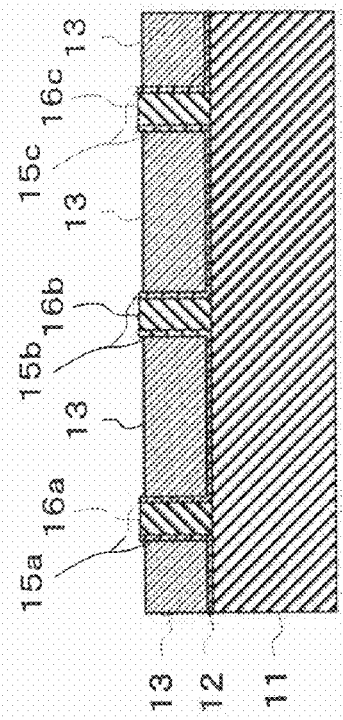

Next, in FIGS. 6a and 6B, the semiconductors 16a-16f are deposited on the openings 14a-14f after forming the insulation layers 15a-15f. The semiconductors 16a-16f are formed by depositing polysilicon or they may be crystalline semiconductors which are formed by epitaxial growth from the semiconductor substrate 11 of the bottom surface of the openings 14a-14f.

Figure 7A:
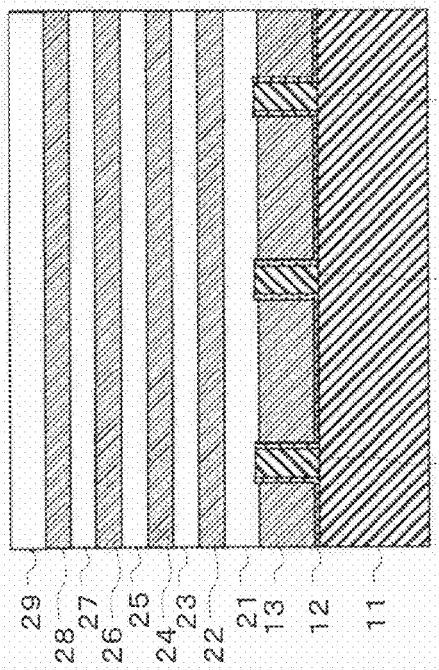
Figure 7B:
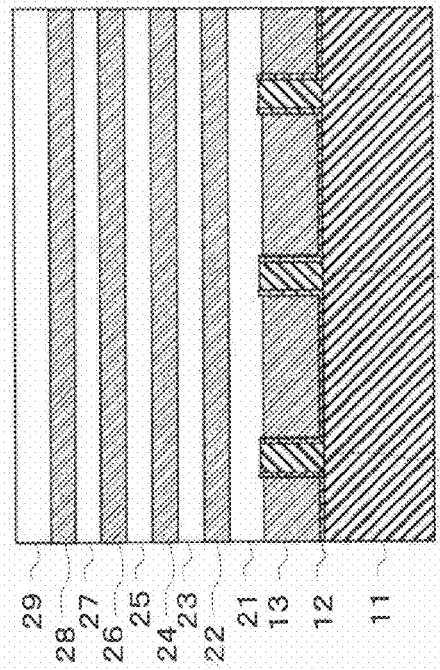

Next, in FIG. 7A and 7B, the insulation layers 21, 23, 25, 27, and 29, and the gate layers 22, 24, 26 and 28 which become the word lines WL1-WL4 of the memory transistor region shown in FIGS. 2A and 2B are alternately deposited. Silicon dioxide or an insulator with a low dielectric constant may be used for the insulation layers 21, 23, 25, 27, and 29. Polysilicon or refractory metals may be used for the gate layers 22, 24, 26, and 28. Further, in the first embodiment, a memory transistor region is shown with 4 layers as an example, however, it is not limited to this. For example, it is possible to increase the number of memory cells per area unit the larger the number of layers while manufacturing becomes easier the fewer the layers.

Next, in FIGS. 8A and 8B, the deposited insulation layers 21, 23, 25, 27, and 29, and the gate layers 22, 24, 26 and 28 are patterned by etching for example, and the openings 31a-31f are formed. The position in which these openings 31a-31f are formed is aligned with the position in which the openings 14a-14f are formed in FIGS. 4A and 4B.

Next, in FIGS. 9A and 9B, SONOS (Silicon, Oxide, Nitride, Oxide, Silicon) insulation layers (gate insulation layers) 32a-32f or MONOS (Metal, Oxide, Nitride, Oxide, Silicon) insulation layers are formed on each side wall of the openings 31a-31f. Further, the insulation layers are not limited to SONOS insulation layers (MONOS insulation layers) and may be formed, for example, from SANOS (Silicon, Alumina, Nitride, Oxide, Silicon) insulations layers. In other words, it is sufficient that they function as charge storage layers between the gate layers (S/M) and semiconductor pillars.

Next, in FIGS. 10A and 10B, the semiconductors 33a-33f are deposited in the openings after the SONOS layers 32a-32f are formed. The semiconductors 33a-33f are formed by depositing polysilicon or they may be crystalline semiconductors formed by epitaxial growth from the semiconductor substrates 16a-16f of the bottom surface of the openings 31a-31f. The SONOS insulation layers 32a-32f and the semiconductors 33a-33f form a pillar memory cell in the memory transistor region.

Further to the process shown in FIGS. 10A and 10B, in FIGS. 11A and 11B, the gate layers 34a and 34B of the drain side select gate transistor SGD are deposited on the memory transistor region. Polysilicon or refractory metals may be used for the gate layers 34a and 34b.

Figure 12A:
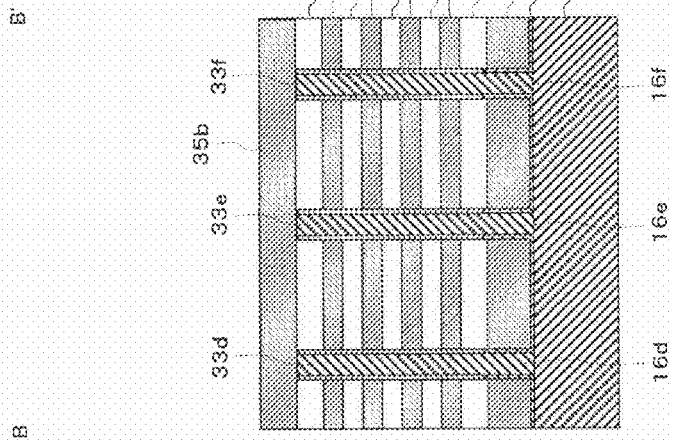
Figure 12B:
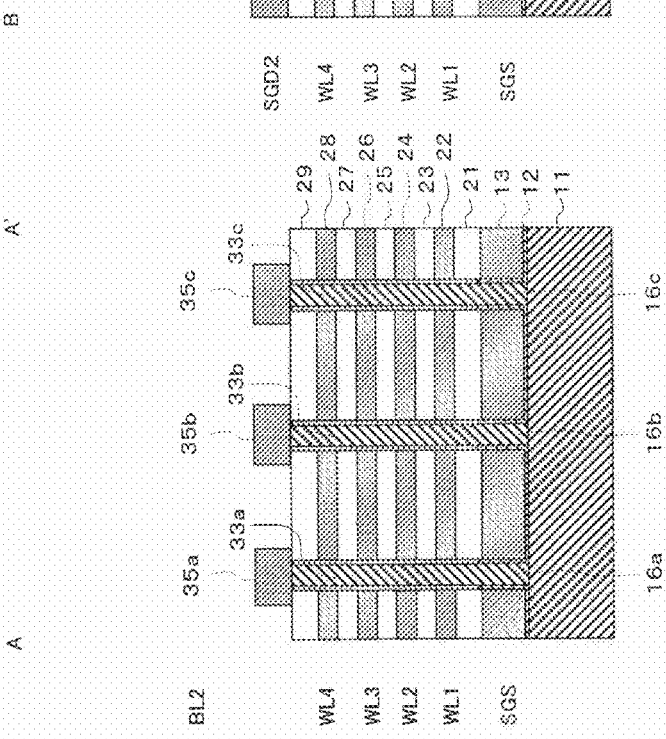

Next, in FIGS. 12A and 12B, the deposited gate layers 34a and 34b are patterned by etching, for example, and the gates 35a-35c of the drain side select gate transistor SGD are formed.

Next, in FIGS. 13A and 13B, the insulation layers 36a-36c are formed around the gates 35a-35c of the drain side select gate transistor SGD. The insulation layers 36a-36c function as gate insulation layers of the drain side select gate transistor SGD.

Figures 14A, 14B:
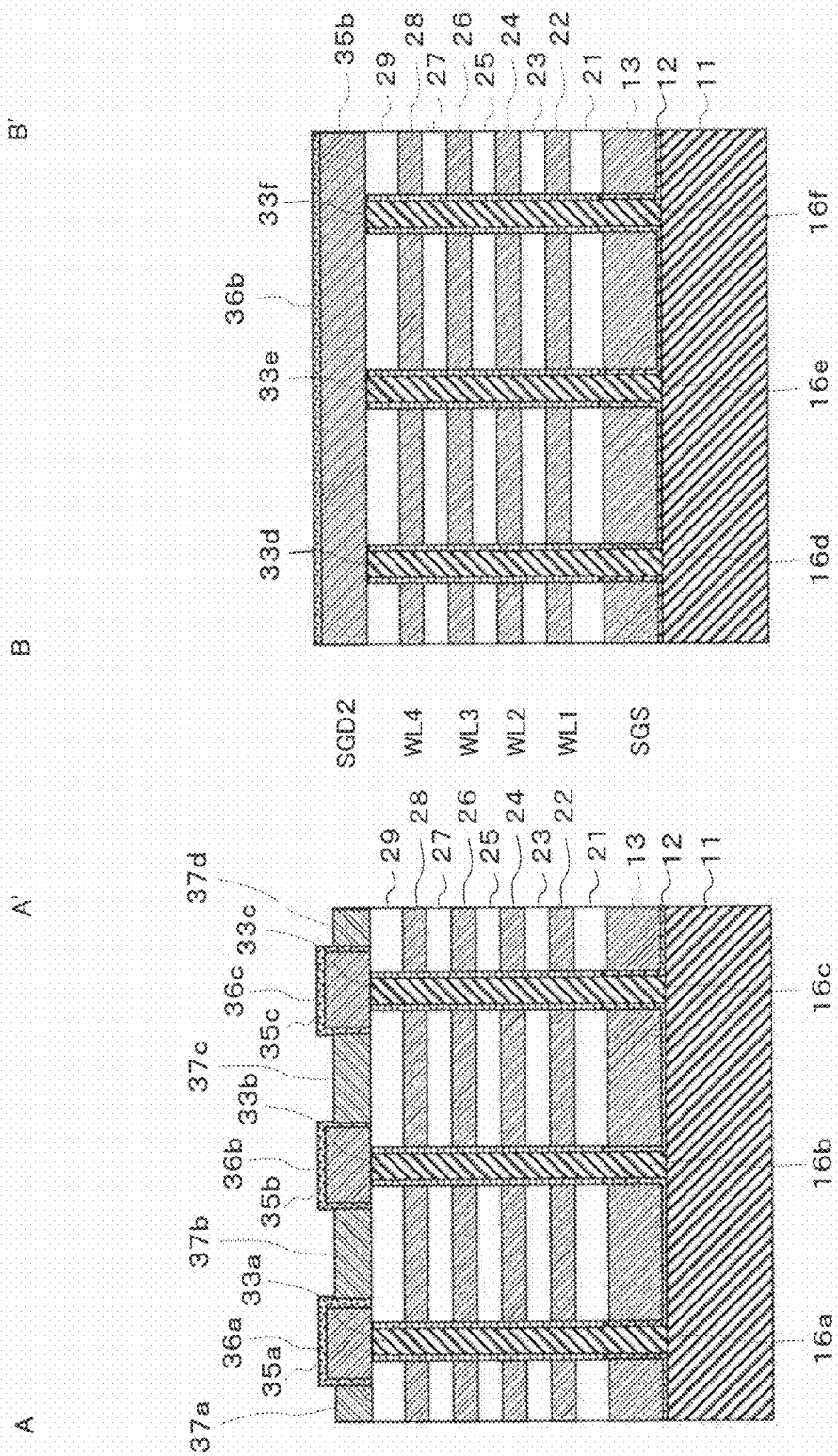

Next, in FIGS. 14A and 14B, the semiconductor layers 37a-37d of the drain side select gate transistor SGD are deposited. At the point where this process is completed, the upper surfaces of the deposited the semiconductor layers 37a-37d are in a position which is lower than the upper surface of the insulation layers 36a-36c on the gates 35a-35c of the drain side select gate transistor SGD. In the case where it is difficult to form the semiconductor layers 37a-37d by depositing one semiconductor layer, they may be formed by depositing a semiconductor layer up to a position which is higher than the upper surface of the insulation layers 36a-36c and etching the semiconductor layer.

Next, in FIGS. 15A and 15B, the openings 38a-38f are formed by etching, for example, in a position which is aligned with the position in which the openings 31a-31f are formed in the process in FIG. 8A and FIG. 8B.

Figure 16A:
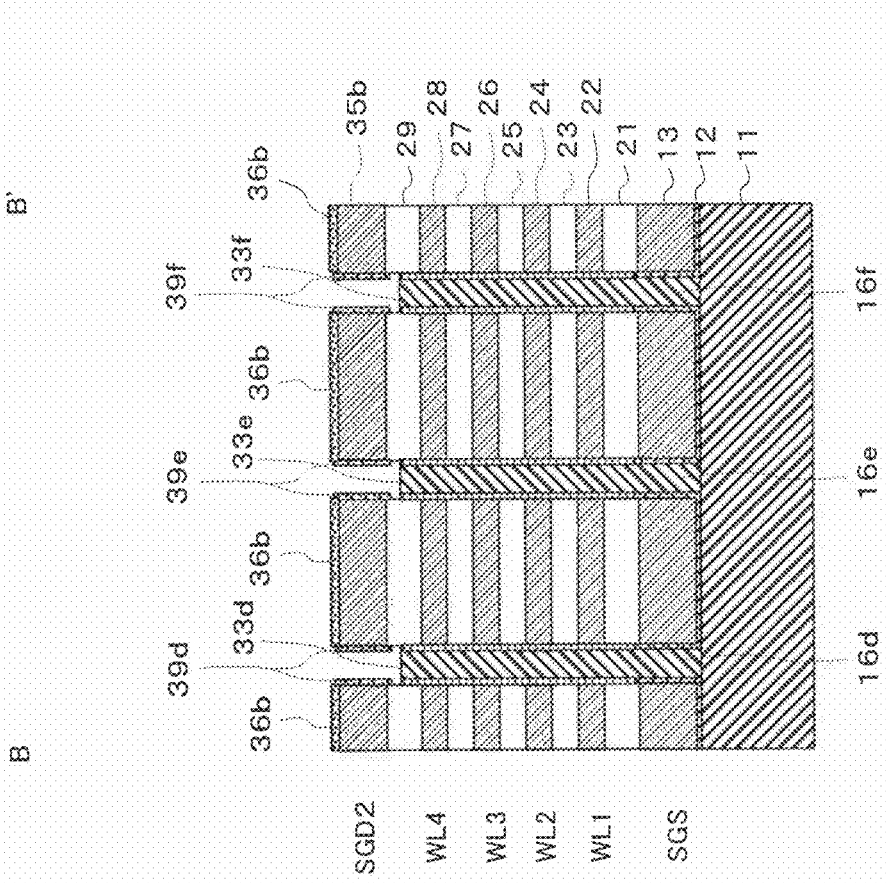
Figure 16B:
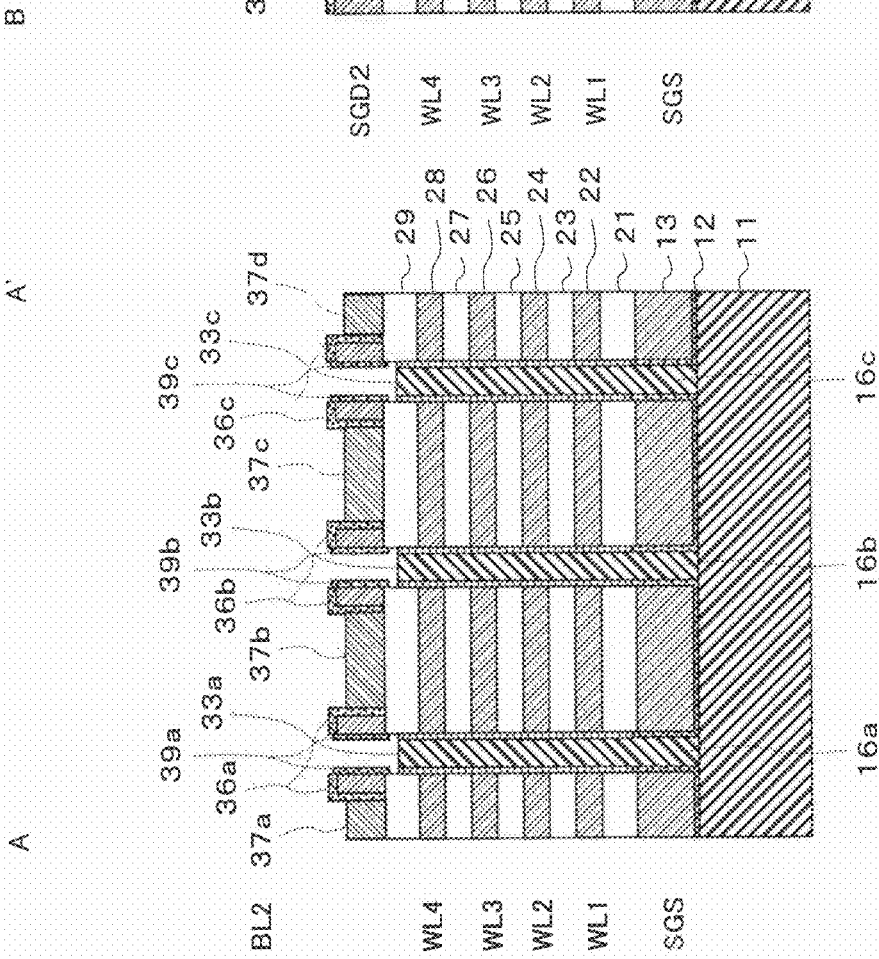

Next, in FIGS. 16A and 16B, the insulation layers 39a-39f are formed on the side walls of the gates 35a-35c of the drain side select gate transistor SGD which faces the openings 38a-38f. The insulation layers 39a-39f function as gate insulation layers of the drain side select gate transistor SGD.

Next, in FIGS. 17A and 17B, P type (conductive type) or N type (opposite conductive type) semiconductor layers 40a-40f are deposited in the openings 38a-38d. The semiconductors 40a-40f are formed by depositing polysilicon or may be crystalline semiconductors formed by epitaxial growth from the semiconductors 33a-33f (see FIGS. 10A and 10B) of the bottom surface of the openings 38a-38f.

Next, in FIGS. 18A and 18B, P type (conductive type) or N type (opposite conductive type) semiconductors 41a-41d are further deposited on the semiconductors 37a-37d (see FIGS. 14A and 14B). The semiconductors 41a-41B are deposited up to a position which is higher than the upper surface of the insulation layers 36a-36c on the gates 35a-35c of the drain side select gate transistor SGD. Furthermore, in the first embodiment the semiconductor layers around the drain side select gate transistor SGD are deposited twice in FIG. 14 and in FIG. 18. For example, they are N type (opposite conductive type) semiconductors at the time of the first depositing of the semiconductors 37a-37d shown in FIG. 14 and P type (conductive type) semiconductors at the time of the second depositing of the semiconductors 41a-41d shown in FIG. 18. According to the first embodiment, because the upper layers of the channel region of the drain side select gate transistor SGD are directly in contact with the bit line BL, and because P type (conductive type) semiconductors are stacked at the second time of depositing and a drain diffusion layer is formed on the periphery of the drain side select gate transistor (line) SGD, N type (opposite conductive type) transistors are deposited on the periphery of the drain side select gate transistor (line) SGD and an interface of between P type and N type is formed.

Next, FIG. 19 and FIG. 20 are drawings for explaining the case where P type (conductive type) semiconductor layers are deposited at the second time in FIG. 18A and FIG. 18B.

According to the first embodiment, when the semiconductors 33a-33f which are deposited in FIG. 10A and FIG. 10B are N type (opposite conductive type), the semiconductors 40a-40f which are deposited in FIG. 17A and FIG. 17B are P type (conductive type). Then, the semiconductors 37a-37d which are deposited as shown in FIG. 14a and FIG. 14B are N type (opposite conductive type) and the semiconductors 41a-41d which are deposited as shown in FIG. 18A and FIG. 18B are P type (conductive type). This structure is shown in FIG. 19A and FIG. 19B. After depositing the semiconductor layers on the periphery of the drain side select gate transistor SGD, impurities are diffused by a thermal diffusion process. Particularly, as shown in FIG. 20A, N type (opposite conductive type) impurities included in the semiconductors 37a-37d which are deposited as shown in FIG. 14A and FIG. 14B are diffused up to the surface of the upper layer of the semiconductors 37a-37d.

Next, in FIG. 21A and FIG. 21B, aluminum layers 42a and 42B are deposited on the semiconductor layers of the periphery and the drain side select gate transistor SGD.

Next, in FIG. 22A and FIG. 22B, the aluminum layers 42a and 42B are patterned by etching, for example, and the bit lines BL1-BL3 are formed. According to the first embodiment, in FIG. 18A and FIG. 18B, because a layer of the P type (conductive type) semiconductors 41a-41d are formed up to a position which is higher than the upper surface of the gate insulations layers of the drain side select gate transistor SGD it is possible to have a contact with the bit lines BL1-BL3.

The above is the manufacturing process of the nonvolatile semiconductor memory device of the first embodiment. Next, an example in which the semiconductor substrate of the nonvolatile semiconductor memory device of the first embodiment is P type (conductive type) will be explained referring FIG. 23 to FIG. 26.

Figure 23:
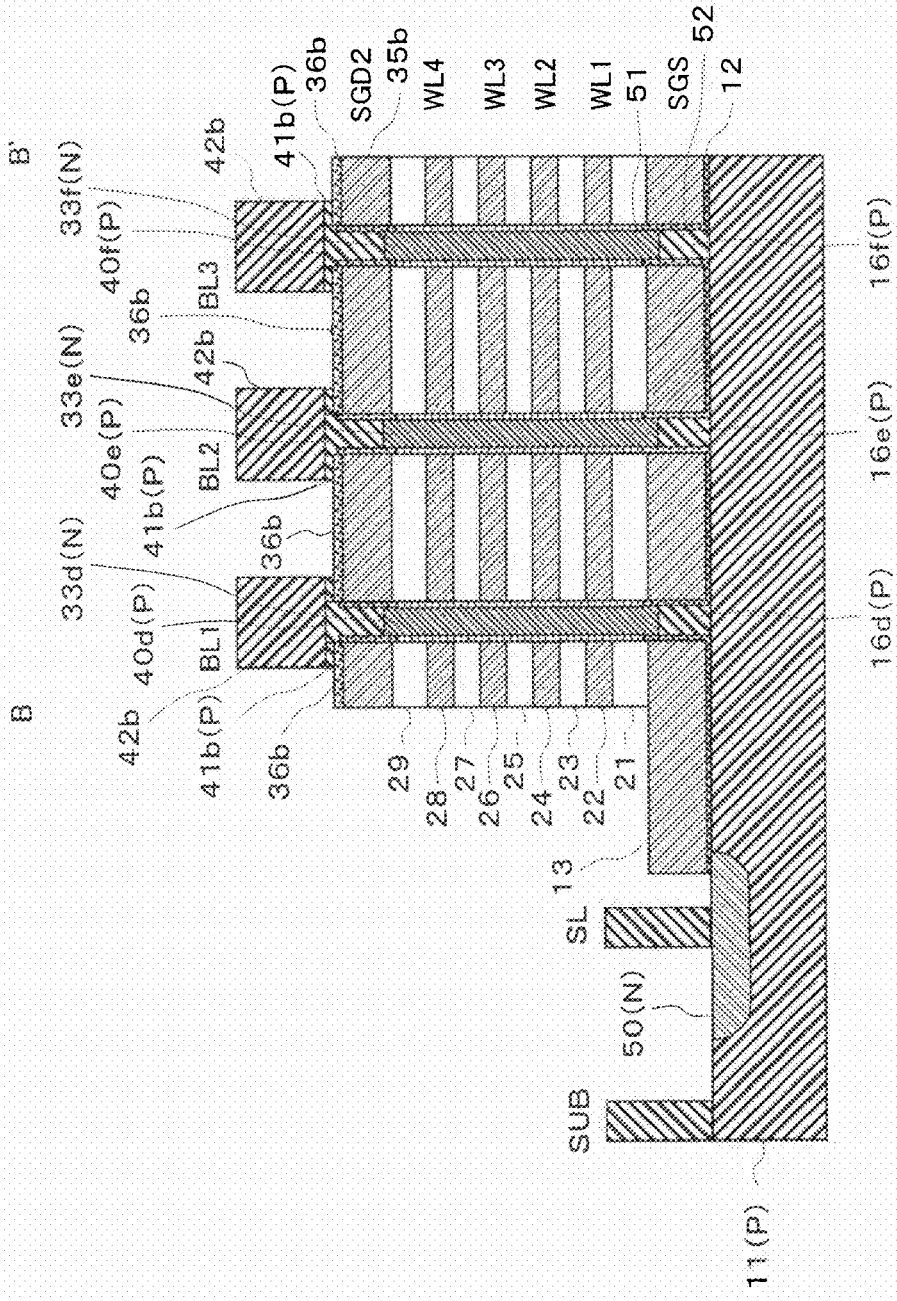

FIG. 23 is a cross section view of the line B-B' of the nonvolatile semiconductor memory device related to the first embodiment. In FIG. 23, the semiconductor substrate 11 is P type (conductive type) and a common source SL is formed on the semiconductor substrate 11 adjacent to the memory cell array. An N type semiconductor layer 50 is formed on a layer below the common source SL. The N type semiconductor layer 50 functions as a source region of the source side select gate transistor SGS.

In addition, in FIG. 23, the area up to the position which is lower than the top end of the gate layer of the source side select gate transistor on the layer below the bottom adjacent area 51 of the semiconductor pillars 33a-33f which comprise the memory cell array is a P type (conductive type) semiconductor 52. That is, the bottom adjacent area 51 of N type semiconductor layer of the semiconductor pillars 33a-33f which are deposited on the upper layer of the P type (conductive type) semiconductor 52 have a structure which overlaps the upper layer of the gate layer of source side select gate transistor SGS. The P type (conductive type) semiconductor of each source side select gate transistor SGS functions as a channel region.

In addition, in FIG. 23, a contact SUB is formed on the semiconductor substrate 11 and is comprised so that a voltage can be applied to the channel region of the source side select gate transistor SGS. The characteristic of the first embodiment is that by applying a voltage to the contact SUB, it is possible to control the threshold level of the channel region of the source side select gate transistor SGS so that it doesn't shift.

As described above, the upper layer of the P type (conductive type) region of the bottom adjacent area of the semiconductor pillars 33a-33f becomes an N type region and is an N type (opposite conductive type) region up to a position which is lower than the upper end of a gate layer of the source side select gate transistor SGS. The N type region functions as the drain region of the source side select gate transistor SGS.

When a voltage higher than the threshold level of the source side select gate transistor SGS is applied from the gate layer of the source side select gate transistor SGS, an inversion layer of electrons is formed in the interface between the insulation layer which is formed on the bottom surface and side surface of the gate layer of the source side select gate transistor SGS, the above described channel region, and the source region and drain region become conductive. In addition, when a voltage lower than the threshold level of the source side select gate transistor SGS is applied from the gate layer of the source side select gate transistor SGS, the source region and drain region are cut off. That is, the source side select gate transistor SGS functions well.

Figure 24:
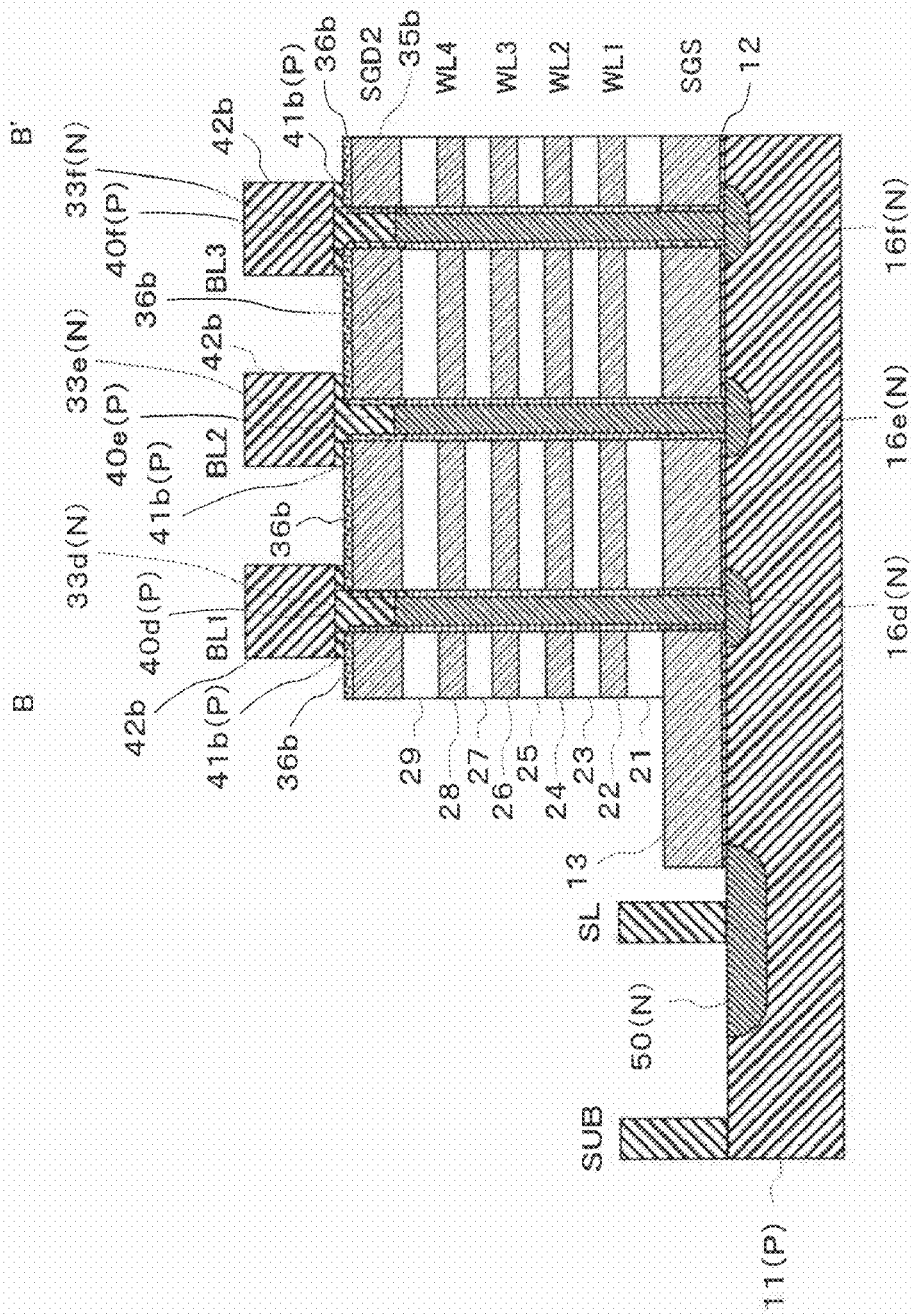

FIG. 24 is a drawing which shows an example structure which is different to the nonvolatile semiconductor memory device shown in FIG. 23. The different part in the nonvolatile semiconductor memory device shown in FIG. 24 is that the bottom end of the semiconductor pillar as far as the semiconductor substrate 11 of the bottom adjacent of the semiconductor pillar is made into an N type semiconductor. In this example, an inversion layer is formed only at the interface of the insulation layer 12 of the bottom surface of the gate layer of source side select gate transistor SGS and the semiconductor substrate 11. However, as by controlling a voltage which is applied to the contact SUB as described above, there is no change to the source side select gate transistor SGS functioning normally.

In the nonvolatile semiconductor memory device shown in FIG. 23, because the distance between adjacent drain regions of semiconductor pillar is longer than that of the nonvolatile semiconductor memory device shown in FIG. 24, there is an advantage in that at the time of applying a voltage, it is difficult for adjacent semiconductor pillars to mutually operate. In addition, in the nonvolatile semiconductor memory device shown in FIG. 24, a channel region is not formed on the side surface of the gate layer of the source side select gate transistor SGS. According to the nonvolatile semiconductor memory device shown in FIG. 24, it is difficult for the structure of the gate layer side surface to affect its electrical characteristics and the nonvolatile semiconductor memory device is easy to be manufactured.

Figure 25:
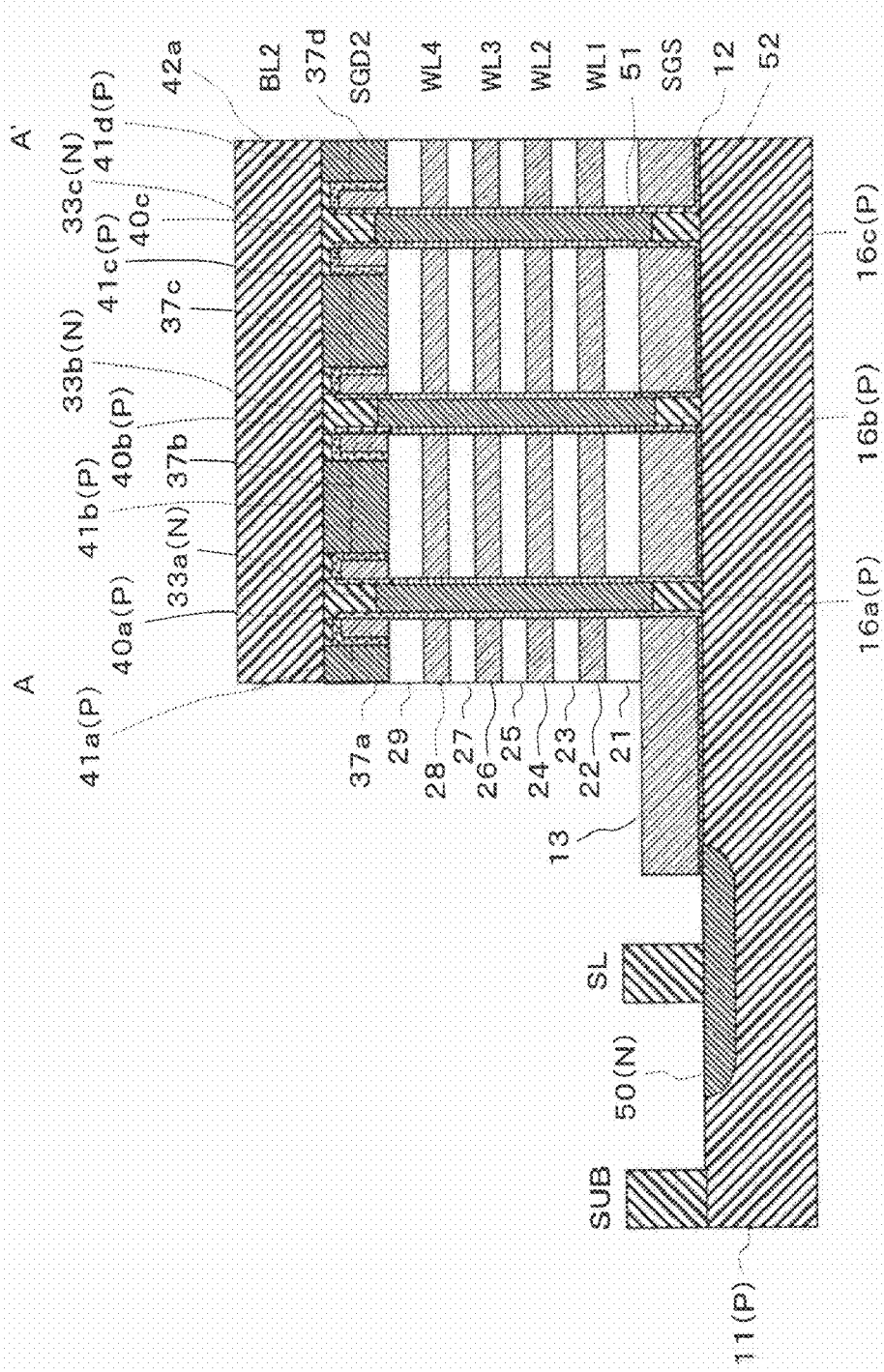

FIG. 25 is a drawing which shows an example construction which is similar to the nonvolatile semiconductor memory device shown in FIG. 23. In FIG. 25 the different point is that a common source SL is formed on the semiconductor substrate 11 near the side of the cross section view of the line A-A' of the nonvolatile semiconductor memory device. In this example too, by controlling a voltage which is applied to the contact SUB as described above, there is no change to the source side select gate transistor SGS functioning normally. Further, the common source SL may be formed on both the side of the cross section line B-B' shown in FIG. 23 and on the side of the cross section line A-A' shown in FIG. 25.

Figure 26:
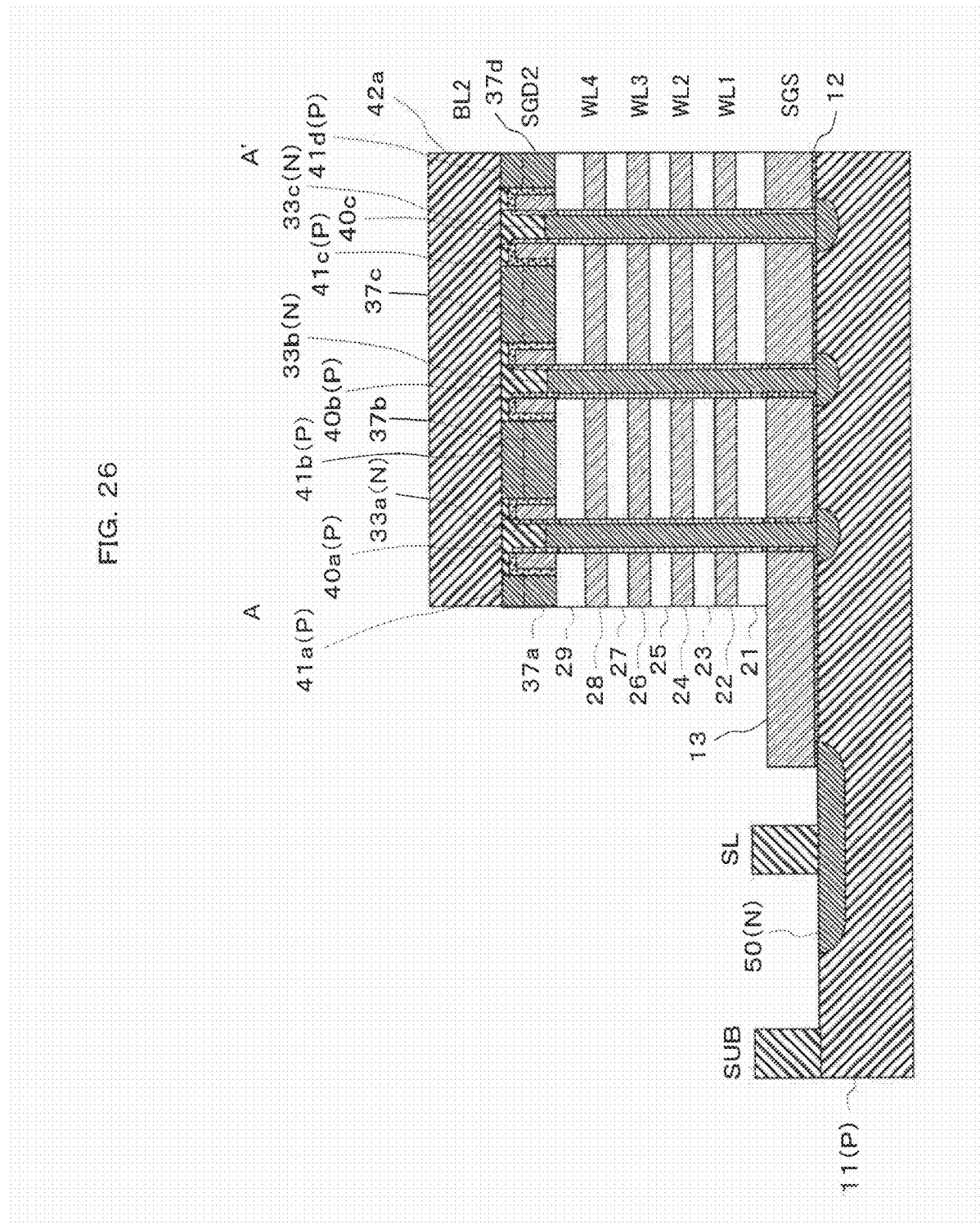

FIG. 26 is a drawing which shows an example construction which is similar to the nonvolatile semiconductor memory device shown in FIG. 24. In FIG. 26 the different point is that a common source SL is formed on the semiconductor substrate 11 near the side of the cross section view of the line A-A' of the nonvolatile semiconductor memory device. In this example too, by controlling a voltage which is applied to the contact SUB as described above, there is no change to the source side select gate transistor SGS functioning normally. Further, the common source SL may be formed on both the side of the cross section line B-B' shown in FIG. 24 and on the side of the cross section line A-A' shown in FIG. 26.

Figure 27:
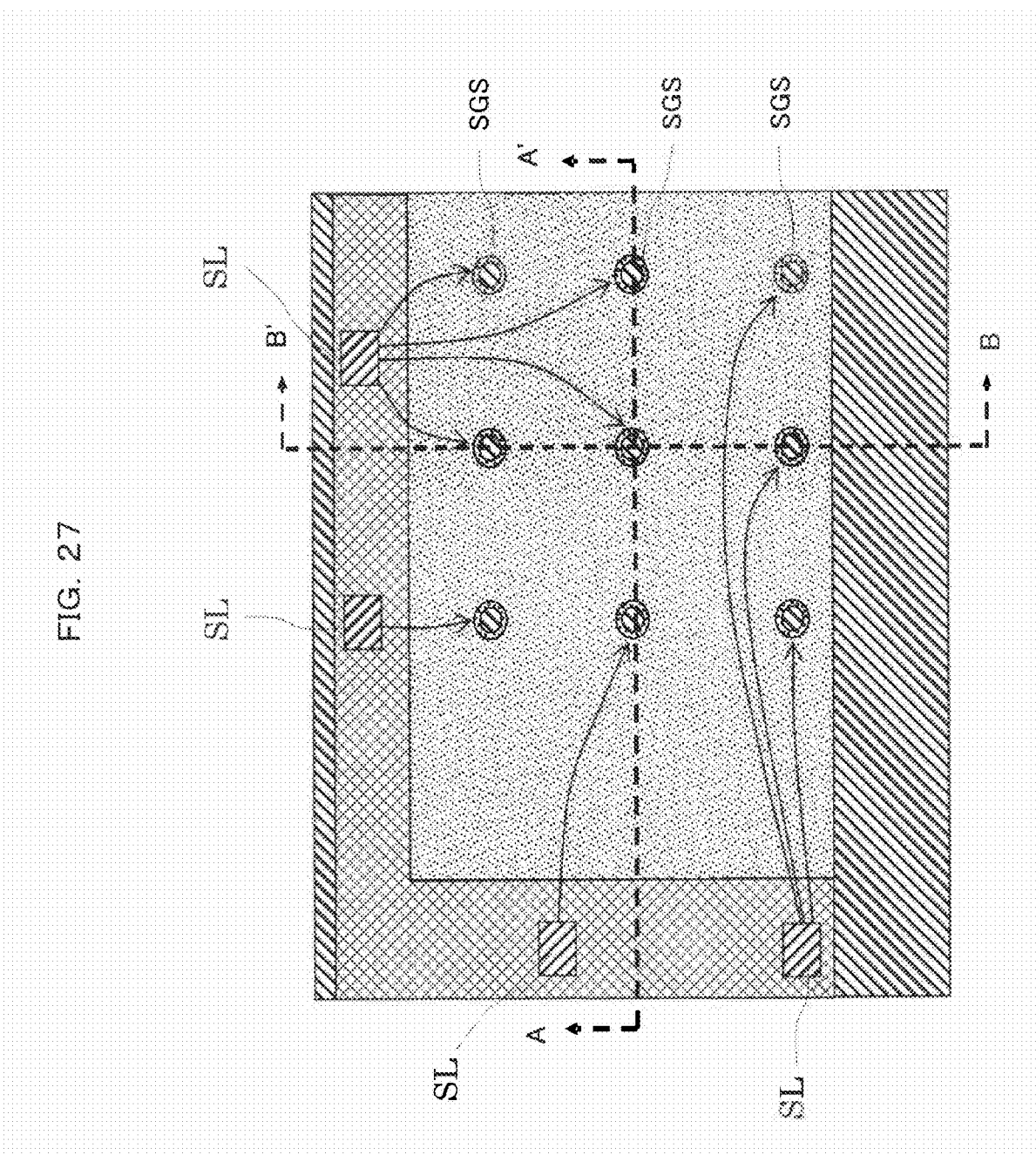
FIG. 27 is a top view which shows the structure seen from bottom side of a select gate transistor on the source side of the nonvolatile semiconductor memory device related to a first embodiment.

FIG. 27 is a drawing which shows the path of a current which flows in the inversion layer which is formed on the bottom surface of the source side select gate transistor SGS. In FIG. 27 shows an example of forming a common source SL on both the side of the cross section of the line A-A' and the side of the cross section of the line B-B'. This drawing not only shows a current flowing to the source side select gate transistor SGS which is positioned on the interface with the common source SL of the memory cell alley region, but also shows a current flowing from the common source SL to the source side select gate transistor SGS which is positioned within the memory cell alley region. That is, all the source side select gate transistors SGS within the memory cell array region are shown to function normally.

Alternatively, in the drain side select gate transistor SGD shown in FIG. 20A and FIG. 20B, the P type (conductive type) semiconductor region which is near the upper end of the semiconductor pillar becomes a channel region. The semiconductor pillar which comprises a memory cell array of the lower section of this P type (conductive type) semiconductor region becomes an N type (opposite conductive type) semiconductor region and functions as a source region of the drain side select gate transistor SGD. The upper end of this N type (opposite conductive type) semiconductor region extends upper side than the lower end of the gate layer of the drain side select gate transistor SGD. The N type (opposite conductive type) semiconductor region which is formed on the periphery which touches this P type (conductive type) semiconductor region functions as a drain region of the drain side select gate transistor SGD. Because the channel region and drain region of the drain side select gate transistor SGD are touching a bit line BL, a voltage is applied from the bit line BL. Therefore, a voltage which is to be applied to the bit line BL is applied to the channel region of the drain side select gate transistor SGD. As a result, it is possible to control the threshold level of the channel region of the drain side select gate transistor SGD so that it does not change by a voltage which is applied to a bit line BL. That is, it is possible to make the drain side select gate transistor SGD functions well.

Next, the circuit operations of the nonvolatile semiconductor memory device related to the first embodiment will be explained.

As shown in FIG. 23 to FIG. 27, in the nonvolatile semiconductor memory device related to the first embodiment the source potential of the source side select gate transistor SGS is controlled by a voltage which is applied to a common source SL. In addition, the threshold level of a P type channel region of the source side select gate transistor SGS is controlled by a voltage VSUB which is applied to the contact SUB. That is, according to a conventional nonvolatile semiconductor memory device, the channel region of the source side select gate transistor SGS is an N type and because a contact is not formed the potential of the channel region can not be directly controlled and the threshold level changes. In the nonvolatile semiconductor memory device related to the first embodiment, because the potential of the channel region of the source side select gate transistor SGS can be directly controlled by a voltage VSUB which is applied to the contact SUB, there is an advantage in that the threshold level does not change.

In addition, in the nonvolatile semiconductor memory device related to the first embodiment, the gate potential of the source side select gate transistor SGS is controlled by a gate voltage VGSGS which is applied to a gate layer of the source side select gate transistor SGS. Because a contact is not directly connected to an N type semiconductor region which is equivalent to a drain region of the source side select gate transistor SGS, a drain potential can not be controlled directly. Consequently, when a source side select gate transistor select gate transistor is switched ON, a gate voltage VSGS can be controlled so that it becomes a level higher than the sum of a threshold voltage VTHSGS of the source side select gate transistor SGS when the substrate voltage of the semiconductor substrate 11 is 0V and a voltage VSUB which is applied to the contact SUB (VTHSGS+VSUB). In addition, the gate voltage VSGS is controlled so that it becomes smaller than (VTHSGS+VSUB) in order to switch off the source side select gate transistor SGS.

In a drain side select gate transistor SGDN (N=1-3) either a P type semiconductor channel region and an N type semiconductor drain region are touching a bit line BLN (N=1-3). As a result, each potential of the channel region and the drain region are controlled by a voltage VBLN (N=1-3) which is applied to a bit line BLN.

In addition, in the nonvolatile semiconductor memory device related to the first embodiment, the gate potential of a drain side select gate transistor SGDN is controlled by a gate voltage VGSGD which is applied to a gate layer of the drain side select gate transistor SGDN. Because a contact is not directly connected to a source region of the drain side select gate transistor SGDN, a source potential can not be controlled directly. Consequently, when a drain side select gate transistor SGDN is switched ON, a gate voltage VSGD is controlled so that it becomes a level higher than the sum of a threshold voltage VTHSGD as a threshold voltage of the drain side select gate transistor SGDN when the voltage VBLN of the bit line BLN is 0V and a voltage VBLN (VTHSGS+VSUB). In addition, the gate voltage VSGD is controlled so that it becomes smaller than (VBLN+VTHSGD) in order to switch off the drain side select gate transistor SGDN.

Figure 28:
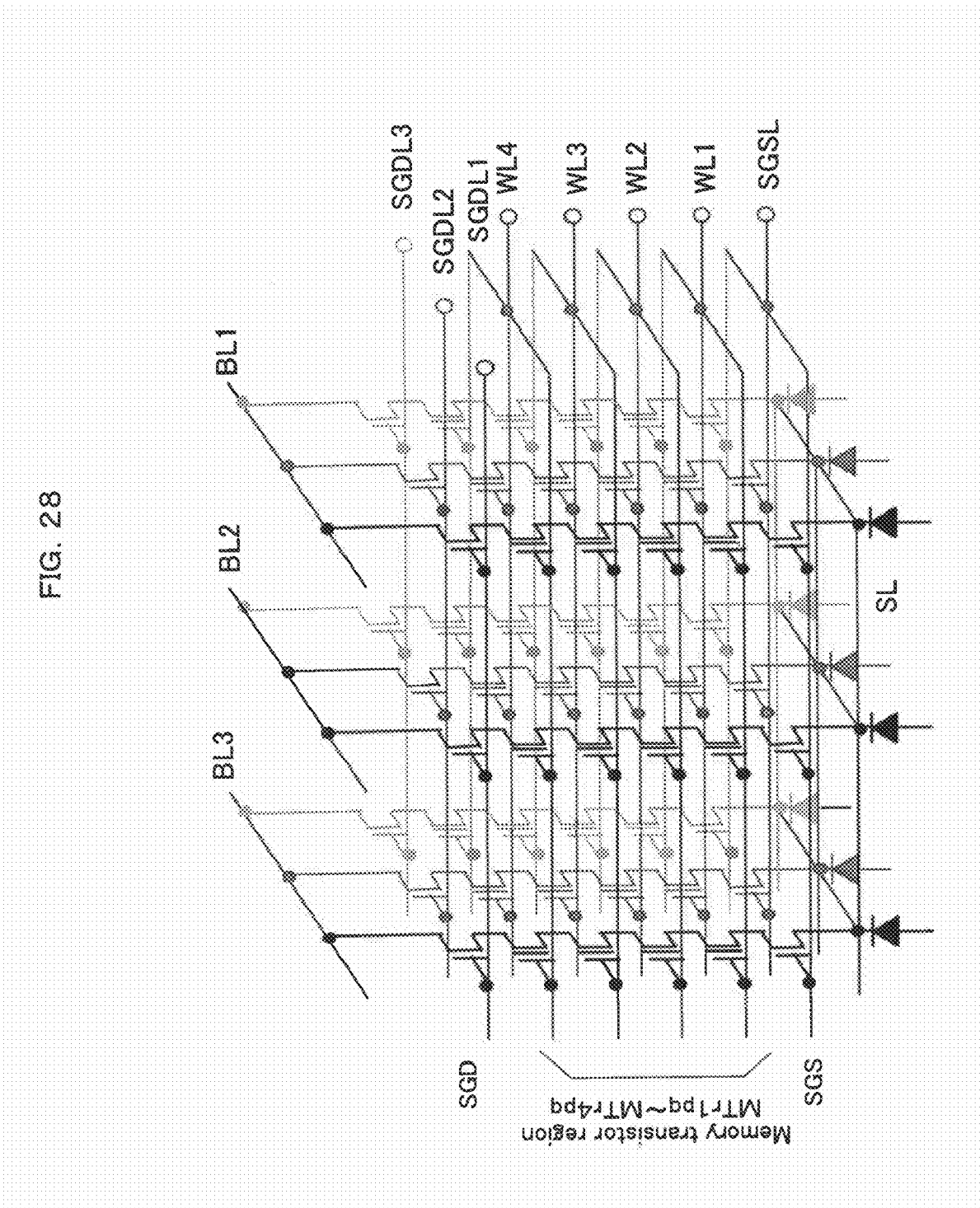
FIG. 28 is a drawing which shows a circuit structure of the nonvolatile semiconductor memory device related to a first embodiment.

Next, the circuit operations at the time of operating a desired memory transistor within a memory cell array in the nonvolatile semiconductor memory device related to the first embodiment will be explained while referring to the circuit construction of the nonvolatile semiconductor memory device shown in FIG. 28.

In the nonvolatile semiconductor memory device related to the first embodiment, the bit line BLN is shared by a semiconductor pillar which comprises a plurality of memory cell arrays arranged in a columnar direction shows in FIG. 2. In addition, in FIG. 28, the memory transistor region includes the memory transistors MTr1*mn*-MTr4*mn* and p×q (p and q are natural numbers) of the memory strings which are formed by the source side selection transistor SGS and the drain side select gate transistor SGDN. FIG. 28 shows an example where p=3 and q=3. In order to selectively operate the memory transistors inside the memory cell array, only the drain side select gate transistor SGD of a desired semiconductor pillar is switched on and the other drain side select gate transistors SGD are required to be switched off. Below, the case where only the semiconductor pillar which is positioned at the intersection of the bit line BL2 and the drain side select gate line SGDL2 is switched on and the other semiconductor pillars are switched off, will be explained while referring to the circuit construction of the nonvolatile semiconductor memory device shown in FIG. 28. Further, in FIG. 28, each bit line BL1-BL3 which are arranged in perspective direction in the depth of the drawing are shared by three semiconductor pillars and the drain side select gate lines SGDL1-SGDL3 are shared by three semiconductor pillars which are arranged in a direction which intersects each bit line BL1-BL3. The drain side select gate lines SGDL1-SGDL3 are lines for supplying a voltage VGSGDN (N=1-3) which is applied from an external drive circuit (not shown in the drawing) to the drain side select gate transistors SGD1-SGDL3 of each semiconductor pillar.

The voltage VGSGD2 which is applied to the drain side select gate transistor SGD2 when the drain side select gate transistor SGD2 which is connected to the drain side select gate line SGDL2 is switched on, is made a voltage higher than the sum of the voltage VBL2 which is applied to the bit line BL2 and the threshold voltage VTHSGD of the drain side select gate transistor SGD2 (VBL2+VTHSGD). That is, VGSGD2>VBL2+VTHSGD. Therefore, the drain side select gate transistor SGD2 of the semiconductor pillar which is positioned at the intersection of the bit line BL2 and the drain side select gate line SGDL2 is switched on. That is, it becomes possible to access a memory cell in which the drain side select gate transistor SGD2 is on.

Next, each voltage VGSGD1 and VGSGD3 which is applied to the drain side select gate lines SGDL1 and SGDL3 respectively except the drain side select gate transistors which are connected to the drain side select gate line SGDL2 are lower than (VBL2+VTHSGD). That is, VGSGD1, VGSGD3<VBL2+VTHSGD. Therefore, the drain side select gate transistors SGD1 and SGD3 of the semiconductor pillar which is positioned at each intersection of the bit lines BL2 and BL3 and the drain side select gate lines SGDL1 and SGDL3 are switched off. That is, it is not possible to access each memory cell array in which the drain side select gate transistors SGD1 and SGD3 have been switched off. Further, at this time, the relationship between each applied voltage becomes VGSGD1, VGSGD3<VGSGD2.

Next, with regards to the bit line BL2 other than, namely the bit line BL1 and BL3 in the case where the drain side select gate transistor SGD2 is switched off the voltages VBL1 and VBL3 which are applied to each bit line BL1 and BL3 are made a voltage which is higher than the difference between the voltage VGSGD2 and the voltage VTHSGD (VGSGD2−VTHSGD). That is, VBL1, VBL3>VSGD2−VTHSGD. Therefore, the drain side select gate transistor SGD2 of the semiconductor pillar which is positioned at the intersection of each bit line BL1 and BL3 and the drain side select gate line SGDL2 is switched off.

In addition, at this time, each voltage VGSGD1 and VGSGD3 which is applied to the drain side select gate transistors SGD1 and SGD3 respectively except the drain side select gate transistors which are connected to the drain side select gate line SGDL2 are lower than the sum (VTHSGD+VBL1, VTHSGD+VBL3) of the voltage VTHSGD and the voltages VBL1 and VBL3 which are applied to each bit line BL1 and BL3 respectively, and lower than the voltage VGSD2. That is, VGSGD1<VGSGD2<VTHSGD+VBL1, and VGSGD3<VGSGD2<VTHSGD+VBL3. Therefore, the drain side select gate transistors SGD1 and SGD3 of the semiconductor pillar which is positioned at each intersection of the bit lines BL1 and BL3 and the drain side select gate lines SGDL1 and SGDL3 are switched OFF.

As described above, in the nonvolatile semiconductor memory device, an operation is possible, for example, whereby only the semiconductor pillar which is positioned at the intersection of the bit line BL2 and the drain side select gate line SGDL2 is switched on while all the other semiconductor pillars are switched off. Therefore, in the nonvolatile semiconductor memory device related to the first embodiment, it is possible to switch on a desired semiconductor pillar by each voltage control as described above.

In the nonvolatile semiconductor memory device related to the first embodiment, the channel region of the select gate transistor (the source side select gate transistor SGS and the drain side select gate transistor SGD) is made into an opposite conductive type to the source and drain region, the contact (contact SUB and bit line BL) is connected to the channel region and it is possible to control a voltage which is applied to the channel region. As a result, a change in a threshold level of the select gate transistor can be controlled and it is possible to make the on/off operations of the select gate transistor operate normally.

Therefore, it is possible to reduce the accumulation of carriers in channel regions of three dimensionally arranged memory cells or select gate transistors and it is possible to reliably operate the memory cells and the select gate transistors.

(Second Embodiment) In the nonvolatile semiconductor memory device related to the second embodiment, the structure which is formed by stacking memory cells on a substrate making a semiconductor layer of a memory transistor region a column shape has common points with the first embodiment described above. Unlike in the first embodiment a pillar semiconductor region which is an active layer comprising a memory transistor is not a single semiconductor material but a periphery part (gate side part) and a center part in the cross section of a pillar are separately formed from different semiconductor materials. Furthermore, the semiconductor in the center part of the pillar is formed from a material whose valence band is closer to a vacuum level than the valence band of the semiconductor in the periphery part of the pillar.

FIG. 29 is a drawing which shows an outline structure of a memory transistor region in the nonvolatile semiconductor memory device related to the second embodiment. In FIG. 29, the basic element structure is a pillar semiconductor region (periphery part is N type Si and the center part is SiGe for example) which is made into an active region and SGT (Surrounding Gate Transistors) in which gate electrodes are arranged so that they surround the periphery of the semiconductor region. In FIG. 29 transistors are serially connected in four layers and these transistors become a memory cell.

Below this the source side select gate transistor SGS is formed and above this the drain side select gate transistor SGD is formed.

A gate insulation layer which surrounds the periphery of the pillar semiconductor region has a SONOS or MONOS structure and functions as a charge storage layer. The gate insulation layer may also be formed as a SANOS insulation layer. In other words, it is sufficient as long as it functions as a charge storage layer. The gate electrodes which surround the periphery of the semiconductor region which becomes a memory cell function as control gates CG (word lines WL1-WL4).

In FIG. 29, the N$^+$ region of the drain side diffusion layer of the drain side select gate transistor SGD is electrically connected to the bit line BL. In addition, the P type channel region of the source side select gate transistor SGS is electrically connected with the P type semiconductor substrate.

The structure shown in FIG. 29 is different to a typical three dimensional nonvolatile semiconductor memory device. A source side diffusion layer region of a source side select gate transistor SGS of the typical three dimensional nonvolatile semiconductor memory device is formed by an N$^+$ region as well as the drain side diffusion layer N$^+$ region of the drain side select gate transistor SGD of the typical three dimensional nonvolatile semiconductor memory device. In addition, the other diffusion layers and channel regions of the typical three dimensional nonvolatile semiconductor memory device are formed by N regions. In this type of three dimensional nonvolatile semiconductor memory device which is stacked by a conventional one time process, there is a possibility that the substrate floating effect may occur.

Figure 31:
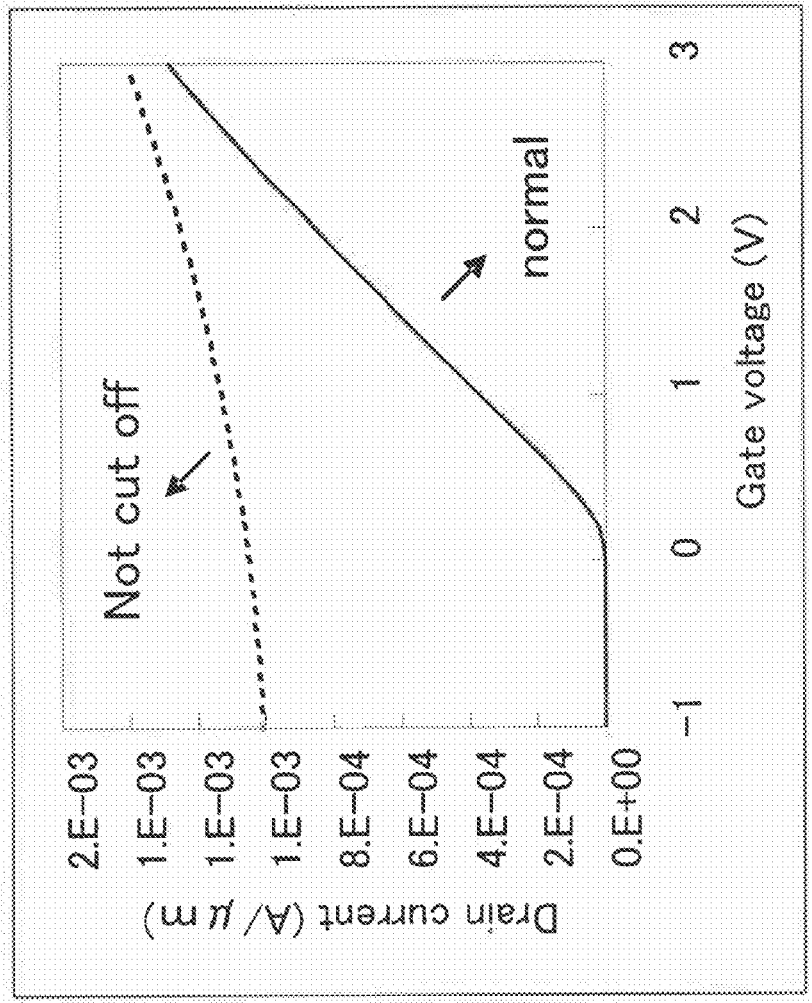
FIG. 31 is a drawing which shows the operation characteristics of the memory cell in FIG. 30.

The above stated substrate floating effect will be explained while referring to FIG. 30 and FIG. 31. FIG. 30A is a drawing which shows the elements structure of a transistor and FIG. 30B is a drawing which shows a hole storage state in a channel region. FIG. 31 is a drawing which shows the operation characteristics of a memory cell in FIG. 30.

In the case of a state in which holes are not stored in a channel region, the transistor in FIG. 30A operates normally. However, when electron-hole pairs are generated due to band-to-band tunneling and/or impact ionization etc, the transistor does not operate normally and it becomes no longer possible to cut off a current. This phenomenon occurs in the following process. As shown in FIG. 30B, when the holes which occur accumulate on the surface (the pillar surface of the active layer) of a channel region by a gate electrode, electric flux lines from the gate electrode are terminated on the surface of the channel region. When the electric flux line is terminated, the electrical control of the gate electrode does not reach deep (pillar center part) into the channel region, electric current flows deep into the channel region and the transistor is not longer cut off. That is, as is shown in FIG. 31, the substrate floating effect is the phenomenon where a drain current is not cut off in accordance with a change in a gate voltage.

Further, in the case of a transistor (a transistor with a two dimensional structure) which is formed on a usual bulk substrate, because the holes generated in the channel region flow to a substrate via a P well region, the above stated substrate floating effect does not occur.

In the nonvolatile semiconductor memory device having a three dimensional structure in the second embodiment, because the holes generated in the channel region flow to the substrate via the P well region, the pillar semiconductor region which is an active layer is not formed from one semiconductor material but from the pillar periphery part (gate side part) and center part which are formed from two different semiconductor materials. In addition, the semiconductor in the center of the pillar is formed from a material whose valence band is closer to a vacuum level than the valence band of the semiconductor in the periphery part of the pillar. Furthermore, the nonvolatile semiconductor memory device having a three dimensional structure in which memory cells stacked, combined with technology which forms a source side select gate transistor SGS from an enhancement type transistor made into a channel region forms a SONOS NAND type flash memory.

Next, the conduction and valence bands of the semiconductor materials used in the periphery part (gate side part) and center part of the columnar semiconductor pillar in this second embodiment will be explained while referring to FIG. 32.

In the second embodiment, the periphery part of the pillar semiconductor region is usual Si and the center part of the pillar semiconductor region is $Si_{0.7}Ge_{0.3}$. FIG. 32 is a drawing which shows the energy bands of Si and $Si_{0.7}Ge_{0.3}$. Because the valence bands of $Si_{0.7}Ge_{0.3}$ are closer to vacuum level than Si, the potential energy to a hole becomes lower in the column center part and the holes (H in the drawing) generated by band-to-band tunneling, for example, accumulate in the column center part. The holes which are accumulated in the column center part pass through the column center part and the P well and go through into the substrate.

As is shown in FIG. 32, because a region is arranged through which it is easy to pass for holes which accumulate on the surface of the channel region by forming the pillar semiconductor region, which is an active layer, not from one semiconductor material but from a pillar periphery part (gate side part) and a center part which are formed from two different semiconductor materials, it becomes possible to extract holes from the channel region with much more efficiency than conventionally. Furthermore, the conduction bands of SiGe are almost the same as Si, however, the band gaps are narrower than Si and the valence bands are closer to the vacuum level than Si. For example, when the Ge molar ratio is $Si_{0.7}Ge_{0.3}$ which is 0.3, the difference of valence band than Si is about 200 mV.

Next, the manufacturing process of the nonvolatile semiconductor memory device related to the second embodiment will be explained while referring to FIG. 33 to FIG. 45. Further, only one semiconductor pillar is shown and explained, however, the point where it is possible to one time process a plurality of semiconductor pillars on a substrate is the same as in the first embodiment.

First, in FIG. 33, an insulation layer 102 is formed on the surface of a P type semiconductor substrate 101 and a gate layer 103 which becomes the gate of the source side select gate transistor SGS is formed on this insulator 102. Then, insulation layers 104, 106, 108, 110, 112, and 200 of the memory transistor region and gate layers 105, 107, 109, and 111 which become word lines WL1-WL4 are alternately deposited. Silicon dioxide or an insulator with a low dielectric constant may be used for the insulation layers 104, 106, 108, 110, 112, and 200. Polysilicon or refractory metals may be used for the gate layers 105, 107, 109, and 111. Furthermore, in the second embodiment, an example of a memory transistor region using four layers was shown, however, it is not limited to this. For example, it is possible to increase the number of memory cells per area unit the larger the number of layers while manufacturing becomes easier the fewer the layers. Then, the gate layer 113 which becomes a gate of the drain side select gate transistor SGD is deposited. Polysilicon or refractory metals may be used for the gate layer 113.

Next, in FIG. 34, an opening 114 with a diameter of 100 nm is formed, for example, is patterning by etching etc in the stacked layers in FIG. 33 in order to form an active layer.

Next, in FIG. 35, an oxide layer 115 which becomes a gate insulation layer of the source side select gate transistor SGS is formed on the side wall and bottom surface of the opening 114. Next, in FIG. 36, the oxide layer 115 of the bottom surface part of the opening 114 is removed by RIE (Reactive Ion Etching).

Next, in FIG. 37, after Si 116 of about 40 nm is deposited inside the opening 114 by CVD (Chemical Vapor Deposition), $Si_{0.7}Ge_{0.3}$ 117 of about 200 nm is continuously deposited and the opening 114 is filled up.

Next, in FIG. 38, a region which becomes the channel region of the source side select gate transistor SGS is left by etching and the opening 118 is formed. Next, in FIG. 39, boron (B:P type impurities) and arsenic (As:N type impurities) are ion implanted from the opening 118 and a P type channel region 119 and N type drain region 120 of the source side select gate transistor SGS are formed.

Next, in FIG. 40, the oxide layer 115 which was formed at the time of forming the gate insulation layer of the source side select gate transistor SGS in FIG. 35, is removed. Next, in FIG. 41, a SONOS insulation layer 121 which functions as a charge storage layer is formed on the side walls and bottom surface of the opening 118. Furthermore, this is not limited to a SONOS insulation layer and may be formed by, for example, a SANOS insulation layer. In other words, it is sufficient as long as it functions as a charge storage layer.

Next, in FIG. 42, after removing the bottom surface part of the SONOS insulation layer 121 in the opening 118, N type Si 122 of about 40 nm is deposited within the opening 118. Further, N type $Si_{0.7}Ge_{0.3}$ 123 of about 200 nm is continuously deposited by CVD, for example, the same as in FIG. 37, and again the opening 118 is filled up. At this time, the column periphery part of the semiconductor region which becomes an active layer becomes N type Si 122 and the pillar center part becomes N type $Si_{0.7}Ge_{0.3}$ 123.

Next, in FIG. 43, the region which becomes a channel region of the drain side select gate transistor SGD is etched and the opening 124 is formed. Next, in FIG. 44, an oxide layer 125 which functions as a gate insulation layer of the drain side select gate transistor SGD is formed on the side walls and bottom surface of the opening 124.

Next, in FIG. 45, after removing the bottom surface part of the oxide layer 125 in the opening 124, Si 126 of about 40 nm is deposited within the opening 124. Furthermore, $Si_{0.7}Ge_{0.3}$ 127 of about 200 nm is continuously deposited by CVD, for example, the same as in FIG. 37, and again the opening 124 is filled up.

An aluminum layer is patterning by etching, for example, and by forming bit lines BL1-BL3 it is possible to manufacture the SONOS NAND flash memory shown in FIG. 29.

In the nonvolatile semiconductor memory device related to the second embodiment, the pillar semiconductor region which is an active layer is not formed from a single semiconductor but from a column periphery part (gate side part) and a center part which are formed using two different semiconductors Si and $Si_{0.7}Ge_{0.3}$. Thus a region in which the holes are generated and can easily accumulate is arranged in the pillar center part. The holes which usually tend to accumulate on the surface of the channel by a gate electrode are released from the gate electrode and the pillar center part becomes a path for the holes. It becomes possible to extract the holes in the channel region much more efficiently than conventionally. As a result, it is possible to control holes which are accumulated in a channel region of a memory cell or a drain side select gate transistor SGD and while controlling a substrate floating effect it is possible to realize a SONOS NAND flash memory with a stacked structure which performs normal memory operations.

(Third Embodiment) In the second embodiment described above, a pillar semiconductor region which is an active layer was formed by dividing a periphery part Si layer and a center part SiGe layer into two layers. In the third embodiment, the case where a Ge molar ratio is made to change in steps at the time of forming an active layer so that a valence band is modulated in steps from the periphery part to the center part, will be explained while referring to FIG. 46 and FIG. 47.

FIG. 46 is a drawing which typically shows a state where the Ge molar ratio of SiGe gas is gradually changed as time elapses from the periphery part to the center part at the time of forming a pillar semiconductor region which is an active layer. In this drawing, an example of the Ge molar ratio of SiGe gas at the time of forming a center part within a cylinder is gradually changed as time elapses and finally $Si_{0.7}Ge_{0.3}$ is shown, however, for example, the ratio may be changed to $Si_{0.9}Ge_{0.1}$—$Si_{0.7}Ge_{0.3}$. In the third embodiment, because the mixture ratio of Ge gas gradually gets denser, crystal defects or warps become difficult to occur between Si layers which have been deposited first and are more preferable than flowing holes.

FIG. 47 is a drawing of an energy band when the Ge molar ratio of SiGe gas is gradually changed as time elapses. The valence band of $Si_{0.7}Ge_{0.3}$ which gradually changes the mixture ratio as time elapses becomes gradually lower in accordance with the potential energy towards a hole heading towards the pillar center part and in the holes (H in the drawing) generated due to band-to-band tunneling, for example, a power which attracts them to the pillar center part occurs and it becomes possible to extract the holes more efficiently from the pillar center part to a substrate via a P well.

In the nonvolatile semiconductor memory device related to the third embodiment, the Ge molar ratio of SiGe gas is gradually changed as time elapses from the periphery part to the center part at the time of forming a pillar semiconductor region which is an active layer. As a result, the holes generated due to band-to-band tunneling, for example, could more efficiently accumulate in the center part of pillar active layer, the efficiency of holes passing through a substrate improved and it becomes possible to substantially control a substrate floating effect.

Furthermore, in the second and third embodiment described above, the case where the Ge molar ration was 0.3 in the periphery part of a pillar active layer were explained, however, it is not limited to this. The Ge molar ration may be optionally changed. In addition, in the second embodiment described above, the case where the Si substrate of the bottom surface part of the pillar semiconductor region is slightly overetched is in the manufacturing process shown in FIG. 36-FIG. 38, however this structure is not essential and in the case where the etching selected ratio with an Si oxide layer is sufficiently high, the Si substrate can not be overetched. However, in the case where the Si substrate of the bottom surface part of the pillar semiconductor region may be preferably slightly overetched because the contact interface with the deposited Si 116 increases and electrical resistance of the contact part is reduced.

Figures 48A, 48B:
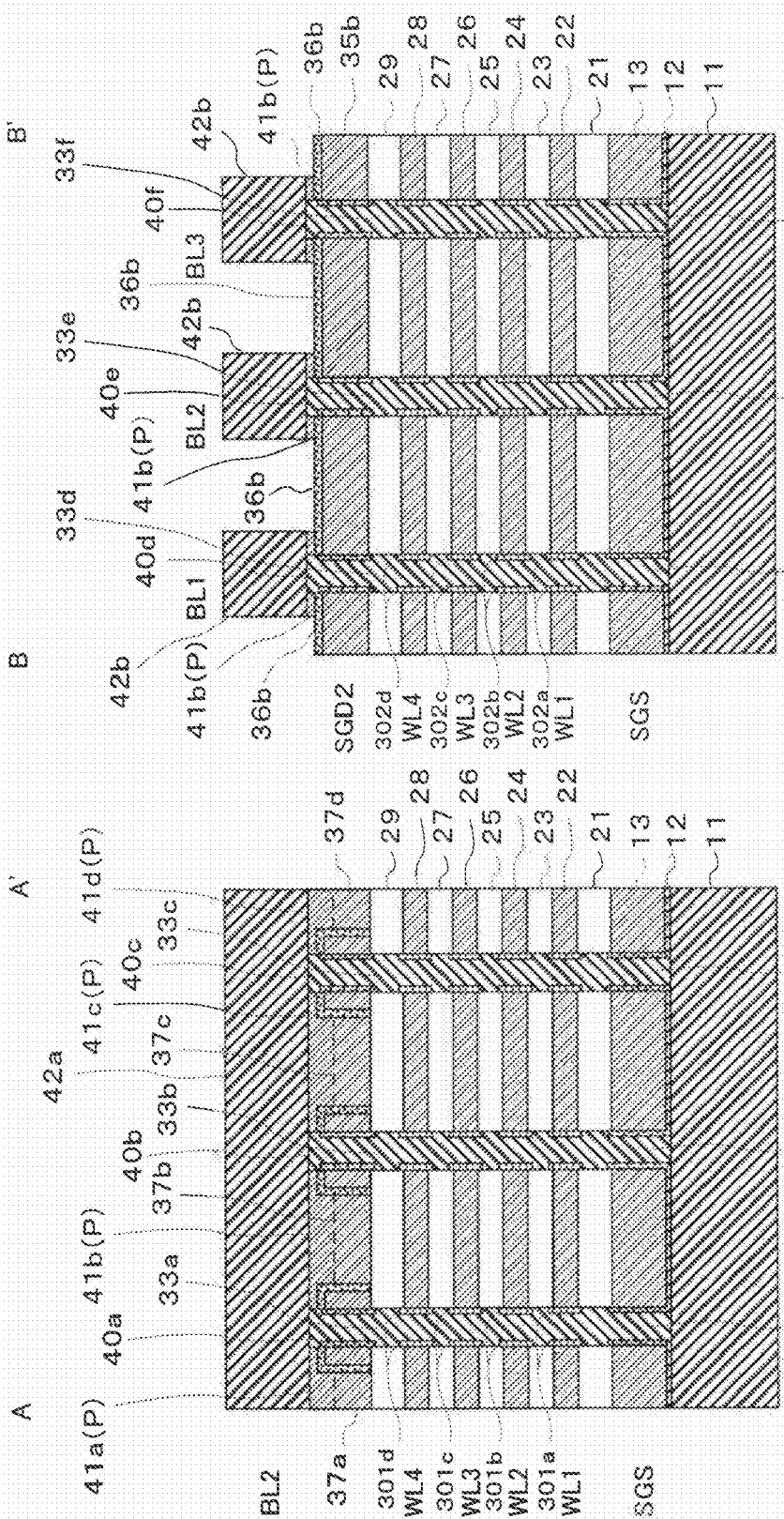
FIG. 48A is a cross sectional view of the line A-A' in FIG. 1 which shows the structure of the nonvolatile semiconductor memory device related to another embodiment.
FIG. 48B is a cross sectional view of the line B-B' in FIG. 1 which shows the structure of the nonvolatile semiconductor memory device related to another embodiment.

In addition, in the nonvolatile semiconductor memory device shown in the first embodiment, the case where the SONOS insulation layer (gate insulation layer) 32a-32f or the MONOS insulation layer was formed over the entire side wall of each pillar semiconductor region in FIGS. 9A and 9B was explained, however, it is not limited to this. For example, as shown in FIGS. 48A and 48B, the SONOS insulation layers (gate insulation layers) 301a-301d, 302a-302d or the MONOS insulation layers may be separated and formed by aligning them with the formation position of the gate layers 22, 24, 26, and 28.

In addition, in the nonvolatile semiconductor memory device shown in the second embodiment, the case where the SONOS insulation layer (gate insulation layer) 121 or the SANOS insulation layer was formed over the entire side wall of each pillar semiconductor region in FIG. 41 was explained, however, it is not limited to this. For example, as shown in FIGS. 48A and 48B, the SONOS insulation layers (gate insulation layers) 301a-301d, and 302a-302d or the MONOS insulation layers may be separated and formed by aligning them with the formation position of the gate layers 22, 24, 26, and 28. In this way, by forming the gate insulation layers by separation, it is possible to further improve the operational characteristics of each memory cell within memory strings which have a stacked structure.

In addition, in the nonvolatile semiconductor memory device shown in the second and third embodiment, the case where the pillar semiconductor region which is an active layer is formed using a periphery part (gate side part) and a center part which are formed using two different semiconductors Si and $Si_{0.7}Ge_{0.3}$, and the case where the pillar semiconductor region was is formed by gradually changing the Ge molar ratio of SiGe gas from the periphery part to the center part as time elapses was also shown, however, it is not limited to this. For example, the periphery part (gate side part) 402 of the pillar semiconductor region which is an active layer may be formed by gradually changing the Ge molar ratio of SiGe gas from the periphery part to the center part as time elapses and the center part 403 may be formed as an insulation layer (SiO2) as shown in the element structure of the transistor in FIG. 49. In FIG. 49, 401 is a gate insulation layer formed from the SONOS insulation layer or the MONOS insulation layer and 404 is a gate electrode. In addition, the center part 403 may be hollow.

FIG. 50 is a drawing of an energy band in the case where a semiconductor region is formed as shown in FIG. 49. In this case, the mixture ratio of SiGe gas which forms the periphery part 402 is gradually changed heading from the gate side part to the center part 403 as time elapses. The valence band of $Si_{0.7}Ge_{0.3}$ that is used in center part of 403 is closer to vacuum level than the valence band of Si that is used in periphery part of 402. Then the potential energy for holes (H in the drawing) generated by band-to-band tunneling etc. is lower in the center part of 403 than periphery part of 402 and a force attracting holes to the center part toward 403 occurs. Then, it becomes possible to efficiently recombine and reduce the holes at the interface of the periphery part of 402 and the center part of 403 which is an insulation layer.

In addition, in the nonvolatile semiconductor memory device shown in the first to the third embodiments, the case was shown where memory strings were formed by stacking in a substantially perpendicular direction to a substrate, however, it is not limited to this. For example, it is possible to apply the present invention to a nonvolatile semiconductor memory device in which a transistor part which is to become a memory cell is formed by stacking in a substantially perpendicular direction to a substrate which is then electrically connected to the lower end part (one end part), wherein memory strings having a U shape are formed and a source side select gate transistor SGS and a drain side select gate transistor SGD are formed in the upper end side (other end part) of these memory strings. In addition, the present invention can also be applied to a nonvolatile semiconductor memory device which has a structure in which, for example, the memory strings which are formed by stacking are rotated 90 degrees and arranged in a substantially horizontal direction to the substrate.

What is claimed is:

1. A nonvolatile semiconductor memory device comprising:
   a substrate;
   a plurality of memory strings formed on said substrate, said memory string having a first select gate transistor, a plurality of memory cells and a second select gate transistor;
   said first select gate transistor having a first pillar semiconductor, a first gate insulation layer formed around said first pillar semiconductor and a first gate electrode being formed around said first gate insulation layer;
   each said memory cell having a second pillar semiconductor, a first insulation layer formed around said second pillar semiconductor, a storage layer formed around said first insulation layer, a second insulation layer formed around said storage layer and first to nth electrodes (n is a natural number 2 or more) being formed around said second insulation layer, said first to nth electrodes being spread in two dimensions respectively;
   said second select gate transistor having a third pillar semiconductor, a second gate insulation layer formed around said third pillar semiconductor and a second gate electrode being formed around said second gate insulation layer; and
   a channel region of at least either said first select gate transistor or said second select gate transistor formed by an opposite conductive type semiconductor to a source region and a drain region.

2. The nonvolatile semiconductor memory device according to claim 1, wherein said memory string is formed by stacking said first select gate transistor, said plurality of memory cells and said second select gate transistor in the order.

3. The nonvolatile semiconductor memory device according to claim 1, wherein said memory string is formed by stacking said first select gate transistor substantially perpendicularly on said substrate, stacking said plurality of memory cells on said first select gate transistor and stacking said second select gate transistor on said plurality of memory cells.

4. The nonvolatile semiconductor memory device according to claim 1, wherein said second select gate transistor having a first semiconductor layer and a second semiconductor layer, said first semiconductor layer is formed by a conductive type semiconductor layer or an opposite conductive type to said conductive type semiconductor layer, said first semiconductor layer being formed up to a position lower than an upper surface of said third pillar semiconductor around said second gate electrode, and said second semiconductor layer is formed by an opposite conductive type semiconductor layer to said conductive type semiconductor layer of said first semiconductor layer, said second semiconductor layer being formed up to a position higher than an upper surface of said second gate insulation layer on said first semiconductor layer.

5. The nonvolatile semiconductor memory device according to claim 4, wherein said channel region of said second select gate transistor is electrically connected with a bit line.

6. The nonvolatile semiconductor memory device according to claim 1, wherein said first pillar semiconductor of said first select gate transistor is formed up to a position lower than an upper end part of said first gate insulation layer, and said second pillar semiconductor of said plurality of memory cells is formed up to a position lower than a lower end part of said first insulation layer and lower than an upper end part of said first gate insulation layer.

7. The nonvolatile semiconductor memory device according to claim 6, wherein said first pillar semiconductor is formed by a conductive type or opposite conductive type semiconductor, and said second pillar semiconductor is formed by an opposite conductive type semiconductor to said first pillar semiconductor.

8. The nonvolatile semiconductor memory device according to claim 6, wherein said first pillar semiconductor is formed by a conductive type or opposite conductive type semiconductor, and said second pillar semiconductor is formed by the same conductive type or opposite conductive type semiconductor as said first pillar semiconductor.

9. The nonvolatile semiconductor memory device according to claim 1, wherein a contact which applies a voltage to a channel region of said first select gate transistor is formed on said substrate outside a region in which said plurality of memory strings are formed.

10. The nonvolatile semiconductor memory device according to claim 9, wherein one or a plurality of common sources are formed on said substrate outside a region in which said plurality of memory strings are formed.

11. The nonvolatile semiconductor memory device according to claim 1, wherein said plurality of memory strings are formed by connecting one end part of adjacent memory strings, and said first select gate transistor and said second select gate transistor are formed at the other end part sides which are not connected to said plurality of memory strings.

12. The nonvolatile semiconductor memory device according to claim 1, wherein said plurality of memory strings is formed substantially perpendicular to said substrate.

13. The nonvolatile semiconductor memory device according to claim 1, wherein each said memory cell is formed by separating said first insulation layer, said storage layer and said second insulation layer.

14. The nonvolatile semiconductor memory device according to claim 1, wherein a central part and a periphery part in a cross-section of an active region of said second pillar semiconductor are formed from different semiconductor materials each other, and a valence band of said central part is closer to a vacuum level than a valence band of said periphery part.

15. The nonvolatile semiconductor memory device according to claim 14, wherein an active region of said second pillar semiconductor is formed from a semiconductor material in which a valence band changes from said periphery part to said central part gradually.

16. The nonvolatile semiconductor memory device according to claim 14, wherein said central part of an active region of said second pillar semiconductor is formed from an insulator material and said periphery part of an active region of said second pillar semiconductor is formed is from a semiconductor material.

17. The nonvolatile semiconductor memory device according to claim 14, wherein said central part of an active region of said second pillar semiconductor is formed from SiGe and said periphery part of said second pillar semiconductor is formed from Si.

18. The nonvolatile semiconductor memory device according to claim 15, wherein an active region of said second pillar semiconductor is formed by changing Ge ratio of SiGe from said periphery part to said central part gradually.

19. The nonvolatile semiconductor memory device according to claim 16, wherein said central part of an active region of said second pillar semiconductor is hollow.

20. The nonvolatile semiconductor memory device according to claim 19, wherein said periphery part is formed by changing Ge ratio of SiGe gradually.

* * * * *